United States Patent
Katayama et al.

(10) Patent No.: US 11,016,387 B2
(45) Date of Patent: May 25, 2021

(54) CHEMICALLY AMPLIFIED POSITIVE-TYPE PHOTOSENSITIVE RESIN COMPOSITION, METHOD OF MANUFACTURING SUBSTRATE WITH TEMPLATE, AND METHOD OF MANUFACTURING PLATED ARTICLE

(71) Applicant: TOKYO OHKA KOGYO CO., LTD., Kawasaki (JP)

(72) Inventors: Shota Katayama, Kawasaki (JP); Kazuaki Ebisawa, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 102 days.

(21) Appl. No.: 16/516,956

(22) Filed: Jul. 19, 2019

(65) Prior Publication Data
US 2020/0033729 A1  Jan. 30, 2020

(30) Foreign Application Priority Data

Jul. 26, 2018  (JP) .............. JP2018-140721

(51) Int. Cl.
*G03F 7/039*  (2006.01)
*G03F 7/004*  (2006.01)
*G03F 7/16*  (2006.01)

(52) U.S. Cl.
CPC .......... *G03F 7/0392* (2013.01); *G03F 7/0045* (2013.01); *G03F 7/0048* (2013.01); *G03F 7/162* (2013.01); *G03F 7/168* (2013.01)

(58) Field of Classification Search
CPC ...... G03F 7/0392; G03F 7/0048; G03F 7/162; G03F 7/0045; G03F 7/168; G03F 7/0397; G03F 7/40
USPC ..................................................... 430/270.1
See application file for complete search history.

(56) References Cited

U.S. PATENT DOCUMENTS

| | | |
|---|---|---|
| 2015/0268557 A1 | 9/2015 | Irie et al. |
| 2016/0231651 A1 | 8/2016 | Yamamoto et al. |
| 2016/0291469 A1 | 10/2016 | Katayama et al. |
| 2017/0315444 A1 | 11/2017 | Irie et al. |

FOREIGN PATENT DOCUMENTS

| | | |
|---|---|---|
| JP | H09-176112 | 7/1997 |
| JP | H11-052562 | 2/1999 |
| JP | H11-271976 | 10/1999 |
| JP | 2004-361819 | 9/2004 |
| JP | 2014-106306 | 6/2014 |
| JP | 2015-194715 | 11/2015 |
| JP | 2016-148741 | 8/2016 |
| JP | 2016-194559 | 11/2016 |
| JP | 2017-198919 | 11/2017 |

OTHER PUBLICATIONS

Takahashi, Resist Film and Its Forming Method, JP2004361819 English Machine Translation, Dec. 24, 2004 (Year: 2004).*
Notice of Reasons for Rejection issued in Japanese Patent Application No. 2018-140721, dated Sep. 18, 2018.
Notice of Reasons for Rejection issued in Japanese Patent Application No. 2018-140721, dated Mar. 12, 2019.

* cited by examiner

*Primary Examiner* — Caleen O Sullivan
(74) *Attorney, Agent, or Firm* — Knobbe Martens Olson & Bear LLP

(57) ABSTRACT

A chemically amplified positive-type photosensitive resin composition containing a predetermined amount of organic solvent (S1) having a boiling point of 120 to 180° C., and satisfying the following requirements:
a solvent residual rate measured by the following steps (1) and (2) is 3.5% by mass or less:
(1) forming a coated film of 40 μm by applying the photosensitive resin composition to a substrate; and
(2) baking the coated film at a temperature that is higher by 10° C. than the boiling point of the organic solvent (S1) for 30 seconds, and calculating the rate of the organic solvent (S1) in a total mass of the coated film after baking by gas chromatography.

8 Claims, No Drawings

CHEMICALLY AMPLIFIED POSITIVE-TYPE PHOTOSENSITIVE RESIN COMPOSITION, METHOD OF MANUFACTURING SUBSTRATE WITH TEMPLATE, AND METHOD OF MANUFACTURING PLATED ARTICLE

RELATED APPLICATION

This application claims priority to Japanese Patent Application No. 2018-140721, filed Jul. 26, 2018, the entire content of which is incorporated herein by reference.

BACKGROUND OF THE INVENTION

Field of the Invention

The present invention relates to a chemically amplified positive-type photosensitive resin composition, a method of manufacturing a substrate with a template using the above-mentioned chemically amplified positive-type photosensitive resin composition, and a method of manufacturing a plated article using the substrate with a template.

Related Art

Photofabrication is now the mainstream of a microfabrication technique. Photofabrication is a generic term describing the technology used for manufacturing a wide variety of precision components such as semiconductor packages. The manufacturing is carried out by applying a photoresist composition to the surface of a processing target to form a photoresist layer, patterning this photoresist layer using photolithographic techniques, and then conducting chemical etching, electrolytic etching, or electroforming based mainly on electroplating, using the patterned photoresist layer (photoresist pattern) as a mask.

In recent years, high density packaging technologies have progressed in semiconductor packages along with downsizing electronics devices, and the increase in package density has been developed on the basis of mounting multi-pin thin film in packages, miniaturizing of package size, two-dimensional packaging technologies in flip-tip systems or three-dimensional packaging technologies. In these types of high density packaging techniques, connection terminals, for example, protruding electrodes (mounting terminals) known as bumps that protrude above the package or metal posts that extend from peripheral terminals on the wafer and connect rewiring with the mounting terminals, are disposed on the surface of the substrate with high precision.

In the photofabrication as described above, a photoresist composition is used, and chemically amplified photoresist compositions containing an acid generator have been known as such a photoresist composition (see Patent Documents 1, 2 and the like). According to the chemically amplified photoresist composition, an acid is generated from the acid generator upon irradiation with radiation (exposure) and diffusion of the acid is promoted through heat treatment, to cause an acid catalytic reaction with a base resin and the like in the composition resulting in a change to the alkali-solubility of the same.

Such chemically amplified positive-type photoresist compositions are used, for example, in formation of plated articles such as bumps, metal posts, and Cu-rewiring by a plating step, in addition to patterned insulating film or formation of etching mask. Specifically, a photoresist layer having a desired film thickness is formed on a support such as a metal substrate using a chemically amplified photoresist composition, and the photoresist layer is exposed through a predetermined mask pattern and is developed. Thereby, a photoresist pattern used as a template in which portions for forming plated articles have been selectively removed (stripped) is formed. Then, bumps or metal posts, and Cu rewiring can be formed by embedding a conductor such as copper into the removed portions (nonresist portions) using plating, and then removing the surrounding photoresist pattern.

Patent Document 1: Japanese Unexamined Patent Application, Publication No. H09-176112

Patent Document 2: Japanese Unexamined Patent Application, Publication No. H11-52562

SUMMARY OF THE INVENTION

However, in a case where a plated article is produced by the above-mentioned method using chemically amplified positive-type photoresist compositions, there is a problem that when photoresist pattern used as a template for plating is removed, residues on the template are easily attached to the plated article.

The present invention has been made in view of the above-mentioned problem. An object of the present invention is to provide a chemically amplified positive-type photosensitive resin composition for forming a pattern serving as a template for a process of producing a plated article on a metal substrate, capable of suppressing attaching of residues of the template to the plated article when the pattern serving as a template is removed after the plated particle is produced; a method of manufacturing substrate having a template pattern for plating, which are formed using the chemically amplified positive-type photosensitive resin composition; and a method of manufacturing a plated article using the chemically amplified positive-type photosensitive resin composition.

After conducting extensive studies in order to achieve the above-mentioned objects, the present inventors have found that the above-mentioned problem can be solved by using a chemically amplified positive-type photosensitive resin composition including an acid generator (A) which generates acid upon exposure to an irradiated active ray or radiation, a resin (B) whose solubility in alkali increases under an action of acid, and an organic solvent (S) that contains an organic solvent (S1) having a boiling point of 120 to 180° C. in a predetermined ratio and satisfying the following [Requirement 1], and the present inventors have completed the present invention.

[Requirement 1]
A solvent residual rate measured by the following steps (1) and (2) is 3.5% by mass or less:
(1) A 40-μm coated film is formed by applying a chemically amplified positive-type photosensitive resin composition to a substrate.
(2) The coated film is baked at a temperature that is higher by 10° C. than the boiling point of the organic solvent (S1) for 30 seconds, and the rate of the organic solvent (S1) in a total mass of the coated film after baking is calculated by GC (gas chromatography).

Specifically, the present invention provides the followings.

A first aspect of the present invention is a chemically amplified positive-type photosensitive resin composition including an acid generator (A) which generates acid upon exposure to an irradiated active ray or radiation, a resin (B) whose solubility in alkali increases under an action of acid, and an organic solvent (S), wherein the organic solvent (S)

includes 70% by mass or more of an organic solvent (S1) having a boiling point of 120 to 180° C. with respect to a total mass of the organic solvent (S), and satisfies the following [Requirement 1]:

[Requirement 1]

a solvent residual rate measured by the following steps (1) and (2) is 3.5% by mass or less:

(1) forming a 40-µm coated film by applying the chemically amplified positive-type photosensitive resin composition to the substrate; and (2) baking the coated film at a temperature that is higher by 10° C. than the boiling point of the organic solvent (S1) for 30 seconds, and calculating the rate of the organic solvent (S1) in a total mass of the coated film after baking by GC (gas chromatography).

A second aspect of the present invention is a method of manufacturing a substrate with a template. The method includes: laminating a photosensitive resin layer on a substrate having a metal surface, the layer comprising the chemically amplified positive-type photosensitive resin composition of the first aspect, exposing the photosensitive resin layer through irradiation with an active ray or radiation in a position-selective manner, and developing the exposed photosensitive resin layer to prepare a template for plated article.

A third aspect of the present invention is a method of manufacturing a plated article, and the method comprising plating the substrate with a template manufactured by the method of the second aspect to form the plated article in the template, and stripping a template from a substrate with a template after a plated article is formed.

Furthermore, a fourth aspect of the present invention provides a method of providing a chemically amplified positive-type photosensitive resin composition, which provides a process line for executing the above-mentioned method of manufacturing substrate with a template or the above-mentioned method of manufacturing a plated article with the chemically amplified positive-type photosensitive resin composition.

The present invention can provide a chemically amplified positive-type photosensitive resin composition for forming a pattern serving as a template for a process of producing a plated article on a metal substrate, capable of suppressing attaching of residues of the template to a plated article when a pattern serving as a template is removed after the plated particle is produced; a method of manufacturing substrate having a template pattern for plating, which are formed using the chemically amplified positive-type photosensitive resin composition; and a method of manufacturing a plated article using the chemically amplified positive-type photosensitive resin composition.

DETAILED DESCRIPTION OF THE INVENTION

<<Chemically Amplified Positive-Type Photosensitive Resin Composition>>

The chemically amplified positive-type photosensitive resin composition (hereinafter also referred to as the "photosensitive resin composition") includes an acid generator (A) which generates acid upon exposure to an irradiated active ray or radiation (hereinafter also referred to as the acid generator (A)), a resin (B) whose solubility in alkali increases under the action of acid (hereinafter also referred to as the resin (B)), and a predetermined organic solvent (S). The photosensitive resin composition may include components such as a Lewis acidic compound (C), an alkali soluble resin (D), sulfur-containing compound (E), and an acid diffusion control agent (F). Furthermore, the chemically amplified positive-type photosensitive resin composition satisfies the following [Requirement 1].

[Requirement 1]

The solvent residual rate measured by the following steps 1) and 2) is 3.5% by mass or less.

1) A chemically amplified positive-type photosensitive resin composition is applied on a substrate to form a 40 µm-coated film.

2) The coated film was baked for 30 seconds at a temperature that is higher by 10° C. than the boiling point of an organic solvent (S1), and the rate of the organic solvent (S1) in the total mass of the coated film after baking is calculated by GC (gas chromatography).

Note here that the solvent residual rate is, for example, 4.0% by mass or more, in a plurality of measurements using the same photosensitive resin composition, measurement results may have some variation. However, when the solvent residual rate is less than 4.0% by mass, and preferably 3.5% by mass or less, the solvent residual rate can be measured with high reproducibility.

The present inventors have extensively studied the tendency of attached amount of residues of the template to a plated article when the pattern serving as the template for process for forming a plated article using various chemically amplified positive-type photosensitive resin compositions, and the pattern serving as the template is removed after the plated article is formed, and found that when the chemically amplified positive-type photosensitive resin composition satisfies the above-mentioned [Requirement 1], attaching of the residues of the template to the plated article is suppressed. The present inventors have found that in the above study, when residue of the template to the plated article occurs, swelling of patterns serving as a template during plating occurs in many cases. When such a swelling of pattern occurs, on a surface opposite side to a surface that is in contact with the substrate of the plated article, pattern in which the edge portion of the surface is covered with the swollen pattern. Covering by the pattern swollen on the edge portion of the surface in the surface opposite side to a surface that is in contact with the substrate of the plated article template seem to cause attaching of residues of the template on the plated article when patterns are removed. However, when the chemically amplified positive-type photosensitive resin composition satisfies the above-mentioned [Requirement 1], at the time of plating, when swelling of the pattern serving as a template is suppressed, and adhesiveness on the plated article as a template is reduced to some extent, when a pattern serving as a template is removed, attaching of residues on the template to the plated article seems to be suppressed.

The solvent residual rate in the above [Requirement 1] is preferably 3.3% by mass or less, more preferably 3.0% by mass or less, further preferably 2.8% by mass or less, and particularly preferably 2.5% by mass or less.

Note here that the boiling point in the above-mentioned step (1) in [Requirement 1] is a boiling point under atmospheric pressure. Furthermore, when the photosensitive resin composition includes a plurality of types of organic solvents as an organic solvent (S1), the highest boiling point among boiling points of the plurality of types of organic solvents is made to be a boiling point as a base of temperature condition at the time of baking in the above-mentioned step (2).

A value of the above-mentioned solvent residual rate is, for example, a value satisfying the boiling point of the organic solvent (S1), and can be adjusted by employing the organic solvent having a lower boiling point or reducing the amount of organic solvent (S1) in the photosensitive resin composition.

When the organic solvent (S1) included in a photosensitive resin composition includes a hydroxyl group in the chemical structure, in particular, it is important that the photosensitive resin composition satisfies the above-mentioned [Requirement 1]. This is because when the organic solvent (S1) included in a photosensitive resin composition includes a hydroxyl group in the chemical structure, swelling of pattern serving as a template during plating easily occurs, and attaching of residues of the template to the plated article easily occurs.

The film thickness of the resist pattern formed using the photosensitive resin composition is not particularly limited. The photosensitive resin composition is preferably used for the formation of a thick resist pattern. Specifically, the film thickness of a resist pattern formed using the photosensitive resin composition is preferably 0.5 μm or more, more preferably 0.5 μm or more and 300 μm or less, further preferably 0.5 μm or more and 200 μm or less, and particularly preferably 0.5 μm or more and 150 μm or less. The upper limit value of the film thickness may be, for example, 100 μm or less. The lower limit value of the film thickness may be, for example, 1 μm or more, and may 3 μm or more.

Hereinafter, described are essential or optional components in the photosensitive resin composition, and a method for manufacturing the photosensitive resin composition.

<Acid Generator (A)>

The acid generator (A) is a compound capable of producing an acid when irradiated with an active ray or radiation, and is not particularly limited as long as it is a compound which directly or indirectly produces an acid under the action of light. The acid generator (A) is preferably any one of the acid generators of the first to fifth aspects that will be described below. Hereinafter, suitable aspects of the acid generator (A) that are suitably used in photosensitive resin compositions will be described as the first to fifth aspects.

The first aspect of the acid generator (A) may be a compound represented by the following formula (a1).

[Chem. 1]

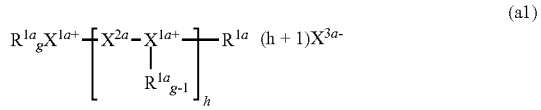

(a1)

In the formula (a1), $X^{1a}$ represents a sulfur atom or iodine atom respectively having a valence of g; g represents 1 or 2. h represents the number of repeating units in the structure within parentheses. $R^{1a}$ represents an organic group that is bonded to $X^{1a}$, and represents an aryl group having 6 or more and 30 or less carbon atoms, a heterocyclic group having 4 or more and 30 or less carbon atoms, an alkyl group having 1 or more and 30 or less carbon atoms, an alkenyl group having 2 or more and 30 or less carbon atoms, or an alkynyl group having 2 or more and 30 or less carbon atoms, and $R^{1a}$ may be substituted with at least one selected from the group consisting of an alkyl group, a hydroxyl group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, an alkyleneoxy group, an amino group, a cyano group, a nitro group, and halogen atoms. The number of $R^{1a}$s is g+h(g−1)+1, and the $R^{1a}$s may be respectively identical to or different from each other. Furthermore, two or more $R^{1a}$s may be bonded to each other directly or via —O—, —S—, —SO—, —SO$_2$—, —NH—, —NR$^{2a}$—, —CO—, —COO—, —CONH—, an alkylene group having 1 or more and 3 or less carbon atoms, or a phenylene group, and may form a ring structure including $X^{1a}$. $R^{2a}$ represents an alkyl group having 1 or more and 5 or less carbon atoms, or an aryl group having 6 or more and 10 or less carbon atoms.

$X^2a$ represents a structure represented by the following formula (a2).

[Chem. 2]

(a2)

In the above formula (a2), $X^{4a}$ represents an alkylene group having 1 or more and 8 or less carbon atoms, an arylene group having 6 or more and 20 or less carbon atoms, or a divalent group of a heterocyclic compound having 8 or more and 20 or less carbon atoms, and $X^{4a}$ may be substituted with at least one selected from the group consisting of an alkyl group having 1 or more and 8 or less carbon atoms, an alkoxy group having 1 or more and 8 or less carbon atoms, an aryl group having 6 or more and 10 or less carbon atoms, a hydroxyl group, a cyano group, a nitro group, and halogen atoms. $X^{5a}$ represents —O—, —S—, —SO—, —SO$_2$—, —NH—, —NR$^{2a}$—, —CO—, —COO—, —CONH—, an alkylene group having 1 or more and 3 or less carbon atoms, or a phenylene group. h represents the number of repeating units of the structure in parentheses. $X^{4a}$s in the number of h+1 and $X^{5a}$s in the number of h may be identical to or different from each other. $R^{2a}$ has the same definition as described above.

$X^{3a-}$ represents a counterion of an onium, and examples thereof include a fluorinated alkylfluorophosphoric acid anion represented by the following formula (a17) or a borate anion represented by the following formula (a18).

[Chem. 3]

(a17)

In the formula (a17), $R^{3a}$ represents an alkyl group having 80% or more of the hydrogen atoms substituted with fluorine atoms. j represents the number of $R^{3a}$s and is an integer of 1 or more and 5 or less. $R^{3a}$s in the number of j may be respectively identical to or different from each other.

[Chem. 4]

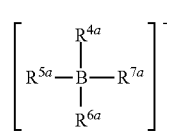

(a18)

In the formula (a18) $R^{4a}$ to $R^{7a}$ each independently represents a fluorine atom or a phenyl group, and a part or all of the hydrogen atoms of the phenyl group may be substituted with at least one selected from the group consisting of a fluorine atom and a trifluoromethyl group.

Examples of the onium ion in the compound represented by the above formula (a1) include triphenylsulfonium, tri-p-tolylsulfonium, 4-(phenylthio)phenyldiphenylsulfonium, bis[4-(diphenylsulfonio)phenyl] sulfide, bis[4-{bis[4-(2-hydroxyethoxy)phenyl]sulfonio}phenyl] sulfide, bis{4-[bis(4-fluorophenyl)sulfonio]phenyl} sulfide, 4-(4-benzoyl-2-chlorophenylthio)phenylbis(4-fluorophenyl)sulfonium, 7-isopropyl-9-oxo-10-thia-9,10-dihydroanthracen-2-yldi-p-tolylsulfonium, 7-isopropyl-9-oxo-10-thia-9,10-dihydroanthracen-2-yldiphenylsulfonium, 2-[(diphenyl)sulfonio]thioxanthone, 4-[4-(4-tert-butylbenzoyl)phenylthio]phenyldi-p-tolylsulfonium, 4-(4-benzoylphenylthio)phenyldiphenylsulfonium, diphenylphenacylsulfonium, 4-hydroxyphenylmethylbenzylsulfonium, 2-naphthylmethyl(1-ethoxycarbonyl)ethylsulfonium, 4-hydroxyphenylmethylphenacylsulfonium, phenyl[4-(4-biphenylthio)phenyl]-4-biphenylsulfonium, phenyl[4-(4-biphenylthio)phenyl]-3-biphenylsulfonium, [4-(4-acetophenylthio)phenyl]diphenylsulfonium, octadecylmethylphenacylsulfonium, diphenyliodonium, di-p-tolyliodonium, bis(4-dodecylphenyl)iodonium, bis(4-methoxyphenyl)iodonium, (4-octyloxyphenyl)phenyliodonium, bis(4-decyloxy)phenyliodonium, 4-(2-hydroxytetradecyloxy)phenylphenyliodonium, 4-isopropylphenyl(p-tolyl)iodonium, 4-isobutylphenyl(p-tolyl)iodonium, or the like.

Among the onium ions in the compound represented by the above formula (a1), a preferred onium ion may be a sulfonium ion represented by the following formula (a19).

[Chem. 5]

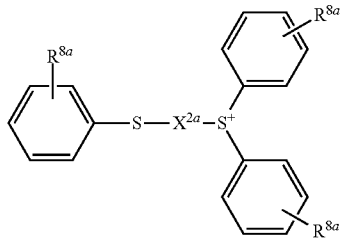

(a19)

In the above formula (a19), $R^{8a}$s each independently represents a hydrogen atom or a group selected from the group consisting of alkyl, hydroxyl, alkoxy, alkylcarbonyl, alkylcarbonyloxy, alkyloxycarbonyl, a halogen atom, an aryl, which may be substituted, and arylcarbonyl. $X^{2a}$ has the same definition as $X^{2a}$ in the above formula (a1)

Specific examples of the sulfonium ion represented by the above formula (a19) include 4-(phenylthio)phenyldiphenylsulfonium, 4-(4-benzoyl-2-chlorophenylthio)phenylbis(4-fluorophenyl)sulfonium, 4-(4-benzoylphenylthio)phenyldiphenylsulfonium, phenyl[4-(4-biphenylthio)phenyl]-4-biphenylsulfonium, phenyl[4-(4-biphenylthio)phenyl]-3-biphenylsulfonium, [4-(4-acetophenylthio)phenyl]diphenylsulfonium, and diphenyl[4-(p-terphenylthio)phenyl]diphenylsulfonium.

In regard to the fluorinated alkylfluorophosphoric acid anion represented by the above formula (a17), $R^{3a}$ represents an alkyl group substituted with a fluorine atom, and a preferred number of carbon atoms is 1 or more and 8 or less, while a more preferred number of carbon atoms is 1 or more and 4 or less. Specific examples of the alkyl group include linear alkyl groups such as methyl, ethyl, propyl, butyl, pentyl and octyl; branched alkyl groups such as isopropyl, isobutyl, sec-butyl and tert-butyl; and cycloalkyl groups such as cyclopropyl, cyclobutyl, cyclopentyl, and cyclohexyl. The proportion of hydrogen atoms substituted with fluorine atoms in the alkyl groups is usually 80% or more, preferably 90% or more, and even more preferably 100%. If the substitution ratio of fluorine atoms is less than 80%, the acid strength of the onium fluorinated alkylfluorophosphate represented by the above formula (a1) decreases.

A particularly preferred example of $R^{3a}$ is a linear or branched perfluoroalkyl group having 1 or more and 4 or less carbon atoms and a substitution ratio of fluorine atoms of 100%. Specific examples thereof include $CF_3$, $CF_3CF_2$, $(CF_3)_2CF$, $CF_3CF_2CF_2$, $CF_3CF_2CF_2CF_2$, $(CF_3)_2CFCF_2$, $CF_3CF_2(CF_3)CF$, and $(CF_3)_3C$. j which is the number of $R^{3a}$s represents an integer of 1 or more and 5 or less, and is preferably 2 or more and 4 or less, and particularly preferably 2 or 3.

Preferred specific examples of the fluorinated alkylfluorophosphoric acid anion include $[(CF_3CF_2)_2PF_4]^-$, $[(CF_3CF_2)_3PF_3]^-$, $[((CF_3)_2CF)_2PF_4]^-$, $[((CF_3)_2CF)_3PF_3]^-$, $[(CF_3CF_2CF_2)_2PF_4]^-$, $[(CF_3CF_2CF_2)_3PF_3]^-$, $[((CF_3)_2CFCF_2)_2PF_4]^-$, $[((CF_3)_2CFCF_2)_3PF_3]^-$, $[(CF_3CF_2CF_2CF_2)_2PF_4]^-$, or $[(CF_3CF_2CF_2)_3PF_3]^-$. Among these, $[(CF_3CF_2)_2PF_3]^-$, $[(CF_3CF_2CF_2)_3PF_3]^-$, $[((CF_3)_2CF)_3PF_3]^-$, $[((CF_3)_2CF)_2PF_4]^-$, $[((CF_3)_2CFCF_2)_3PF_3]^-$, or $[((CF_3)_2CFCF_2)_2PF_4]^-$ are particularly preferred.

Preferred specific examples of the borate anion represented by the above formula (a18) include tetrakis(pentafluorophenyl)borate ($[B(C_6F_5)_4]^-$), tetrakis[(trifluoromethyl)phenyl]borate ($[B(C_6H_4CF_3)_4]^-$) difluorobis(pentafluorophenyl)borate ($[(C_6F_5)_2BF_2]^-$, trifluoro(pentafluorophenyl)borate ($[(C_6F_5)BF_3]^-$), and tetrakis(difluorophenyl)borate ($[B(C_6H_3F_2)_4]^-$). Among these, tetrakis(pentafluorophenyl)borate ($[B(C_6F_5)_4]^-$) is particularly preferred.

The second aspect of the acid generator (A) include halogen-containing triazine compounds such as 2,4-bis(trichloromethyl)-6-piperonyl-1,3,5-triazine, 2,4-bis(trichloromethyl)-6-[2-(2-furyl)ethenyl]-s-triazine, 2,4-bis(trichloromethyl)-6-[2-(5-methyl-2-furyl)ethenyl]-s-triazine, 2,4-bis(trichloromethyl)-6-[2-(5-ethyl-2-furyl)ethenyl]-s-triazine, 2,4-bis(trichloromethyl)-6-[2-(5-propyl-2-furyl)ethenyl]-s-triazine, 2,4-bis(trichloromethyl)-6-[2-(3,5-dimethoxyphenyl)ethenyl]-s-triazine, 2,4-bis(trichloromethyl)-6-[2-(3,5-diethoxyphenyl)ethenyl]-s-triazine, 2,4-bis(trichloromethyl)-6-[2-(3,5-dipropoxyphenyl)ethenyl]-s-triazine, 2,4-bis(trichloromethyl)-6-[2-(3-methoxy-5-ethoxyphenyl)ethenyl]-s-triazine, 2,4-bis(trichloromethyl)-6-[2-(3-methoxy-5-propoxyphenyl)ethenyl]-s-triazine, 2,4-bis(trichloromethyl)-6-[2-(3,4-methylenedioxyphenyl)ethenyl]-s-triazine, 2,4-bis(trichloromethyl)-6-(3,4-methylenedioxyphenyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(2-bromo-4-methoxy) styrylphenyl-s-triazine, 2,4-bis-trichloromethyl-6-(3-bromo-4-methoxy)styrylphenyl-s-triazine, 2-(4-methoxyphenyl)-4,6-bis(trichloromethyl)-1,3,5-triazine, 2-(4-methoxynaphthyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis (trichloromethyl)-1,3,5-triazine, tris(1,3-dibromopropyl)-1,3,5-triazine and tris(2,3-dibromopropyl)-1,3,5-triazine, and halogen-containing triazine compounds represented by the following formula (a3) such as tris(2,3-dibromopropyl)isocyanurate.

[Chem. 6]

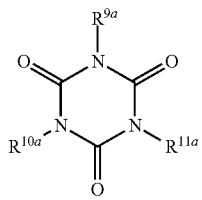

(a3)

In the above formula (a3), $R^{9a}$, $R^{10a}$ and $R^{11a}$ each independently represent a halogenated alkyl group.

Further, the third aspect of the acid generator (A) include α-(p-toluenesulfonyloxyimino)-phenylacetonitrile, α-(benzenesulfonyloxyimino)-2,4-dichlorophenylacetonitrile, α-(benzenesulfonyloxyimino)-2,6-dichlorophenylacetonitrile, α-(2-chlorobenzenesulfonyloxyimino)-4-methoxyphenylacetonitrile and α-(ethylsulfonyloxyimino)-1-cyclopentenylacetonitrile, and compounds represented by the following formula (a4) having an oximesulfonate group.

[Chem. 7]

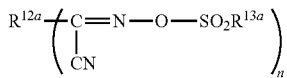

(a4)

In the above formula (a4), $R^{12a}$ represents a monovalent, bivalent or trivalent organic group, $R^{13a}$ represents a substituted or unsubstituted saturated hydrocarbon group, an unsaturated hydrocarbon group, or an aromatic compound group, and n represents the number of repeating units of the structure in the parentheses.

In the formula (a4), the aromatic compound group indicates a group of compounds having physical and chemical properties characteristic of aromatic compounds, and examples thereof include aryl groups such as a phenyl group and a naphthyl group, and heteroaryl groups such as a furyl group and a thienyl group. These may have one or more appropriate substituents such as halogen atoms, alkyl groups, alkoxy groups and nitro groups on the rings. It is particularly preferable that $R^{13a}$ is an alkyl group having 1 or more and 6 or less carbon atoms such as a methyl group, an ethyl group, a propyl group, and a butyl group. In particular, compounds in which $R^{12a}$ represents an aromatic compound group, and $R^{13a}$ represents an alkyl group having 1 or more and 4 or less carbon atoms are preferred.

Examples of the acid generator represented by the above formula (a4) include compounds in which $R^{12a}$ is any one of a phenyl group, a methylphenyl group and a methoxyphenyl group, and $R^{13a}$ is a methyl group, provided that n is 1, and specific examples thereof include α-(methylsulfonyloxyimino)-1-phenylacetonitrile, α-(methylsulfonyloxyimino)-1-(p-methylphenyl)acetonitrile, α-(methylsulfonyloxyimino)-1-(p-methoxyphenyl)acetonitrile, [2-(propylsulfonyloxyimino)-2,3-dihydroxythiophene-3-ylidene] (o-tolyl)acetonitrile and the like. Provided that n is 2, the acid generator represented by the above formula (a4) is specifically an acid generator represented by the following formulae.

[Chem. 8]

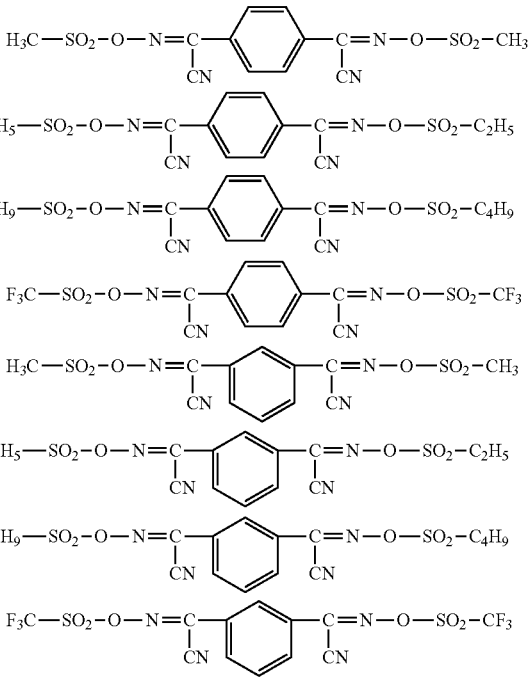

In addition, the fourth aspect of the acid generator (A) include onium salts that have a naphthalene ring at their cation moiety. The expression "have a naphthalene ring" indicates having a structure derived from naphthalene and also indicates at least two ring structures and their aromatic properties are maintained. The naphthalene ring may have a substituent such as a linear or branched alkyl group having 1 or more and 6 or less carbon atoms, a hydroxyl group, a linear or branched alkoxy group having 1 or more and 6 or less carbon atoms or the like. The structure derived from the naphthalene ring, which may be of a monovalent group (one free valance) or of a bivalent group (two free valences), is desirably of a monovalent group (in this regard, the number of free valance is counted except for the portions connecting with the substituents described above). The number of naphthalene rings is preferably 1 or more and 3 or less.

Preferably, the cation moiety of the onium salt having a naphthalene ring at the cation moiety is of the structure represented by the following formula (a5).

[Chem. 9]

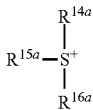

(a5)

In the above formula (a5), at least one of $R^{14a}$, $R^{15a}$ and $R^{16a}$ represents a group represented by the following formula (a6), and the remaining represents a linear or branched alkyl group having 1 or more and 6 or less carbon atoms, a phenyl group which may have a substituent, a hydroxyl group, or a linear or branched alkoxy group having 1 or more and 6 or less carbon atoms. Alternatively, one of $R^{14a}$, $R^{15a}$ and $R^{16a}$ is a group represented by the following formula (a6), and the remaining two are each independently a linear or branched alkylene group having 1 or more and 6 or less carbon atoms, and these terminals may bond to form a ring structure.

[Chem. 10]

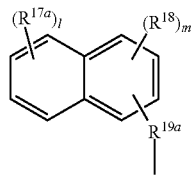

(a6)

In the formula (a6), $R^{17a}$ and $R^{18a}$ each independently represent a hydroxyl group, a linear or branched alkoxy group having 1 or more and 6 or less carbon atoms, or a linear or branched alkyl group having 1 or more and 6 or less carbon atoms, and $R^{19a}$ represents a single bond or a linear or branched alkylene group having 1 or more and 6 or less carbon atoms that may have a substituent. l and m each independently represent an integer of 0 or more and 2 or less, and l+m is 3 or less. Herein, when there exists a plurality of $R^{17a}$, they may be identical to or different from each other. Furthermore, when there exists a plurality of $R^{18a}$, they may be identical to or different from each other.

Preferably, among $R^{14a}$, $R^{15a}$ and $R^{16a}$ as above, the number of groups represented by the above formula (a6) is one in view of the stability of the compound, and the remaining are linear or branched alkylene groups having 1 or more and 6 or less carbon atoms of which the terminals may bond to form a ring. In this case, the two alkylene groups described above form a 3 to 9 membered ring including sulfur atom(s). Preferably, the number of atoms to form the ring (including sulfur atom(s)) is 5 or more and 6 or less.

Examples of the substituent, which the alkylene group may have, include an oxygen atom (in this case, a carbonyl group is formed together with a carbon atom that constitutes the alkylene group), a hydroxy group or the like.

Furthermore, examples of the substituent, which the phenyl group may have, include a hydroxyl group, a linear or branched alkoxy group having 1 or more and 6 or less carbon atoms, a linear or branched alkyl group having 1 or more and 6 or less carbon atoms, or the like.

Examples of cations for the suitable cation moiety include cations represented by the following formulae (a7) and (a8), and the structure represented by the following formula (a8) is particularly preferable.

[Chem. 11]

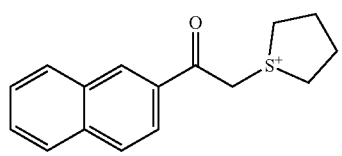

(a7)

-continued

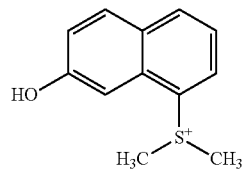

(a8)

The cation moieties, which may be of an iodonium salt or a sulfonium salt, are desirably of a sulfonium salt in view of acid-producing efficiency.

It is, therefore, desirable that the suitable anions for the anion moiety of the onium salt having a naphthalene ring at the cation moiety is an anion capable of forming a sulfonium salt.

The anion moiety of the acid generator is exemplified by fluoroalkylsulfonic acid ions or aryl sulfonic acid ions, of which hydrogen atom(s) being partially or entirely fluorinated.

The alkyl group of the fluoroalkylsulfonic acid ions may be linear, branched or cyclic and have 1 or more and 20 or less carbon atoms. Preferably, the carbon number is 1 or more and 10 or less in view of bulkiness and diffusion distance of the produced acid. In particular, branched or cyclic alkyl groups are preferable due to shorter diffusion length. Also, methyl, ethyl, propyl, butyl, octyl groups and the like are preferable due to being inexpensively synthesizable.

The aryl group of the aryl sulfonic acid ions may be an aryl group having 6 or more and 20 or less carbon atoms, and is exemplified by a phenol group or a naphthyl group that may be unsubstituted or substituted with an alkyl group or a halogen atom. In particular, aryl groups having 6 or more and 10 or less carbon atoms are preferable due to being inexpensively synthesizable. Specific examples of preferable aryl group include phenyl, toluenesulfonyl, ethylphenyl, naphthyl, methylnaphthyl groups and the like.

When hydrogen atoms in the above fluoroalkylsulfonic acid ion or the aryl sulfonic acid ion are partially or entirely substituted with a fluorine atom, the fluorination rate is preferably 10% or more and 100% or less, and more preferably 50% or more and 100% or less; it is particularly preferable that all hydrogen atoms are each substituted with a fluorine atom in view of higher acid strength. Specific examples thereof include trifluoromethane sulfonate, perfluorobutane sulfonate, perfluorooctane sulfonate, perfluorobenzene sulfonate, and the like.

Among these, the preferable anion moiety is exemplified by those represented by the following formula (a9).

[Chem. 12]

$$R^{20a}SO_3^-$$ (a9)

In the above formula (a9), $R^{20a}$ represents groups represented by the following formulae (a10), (a11), and (a12).

[Chem. 13]

—$C_xF_{2x+1}$ (a10)

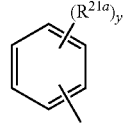 (a11)

-continued (a12)

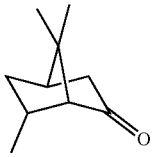

In the above formula (a10), x represents an integer of 1 or more and 4 or less. Also, in the above formula (a11), $R^{21a}$ represents a hydrogen atom, a hydroxyl group, a linear or branched alkyl group having 1 or more and 6 or less carbon atoms, or a linear or branched alkoxy group having 1 or more and 6 or less carbon atoms, and y represents an integer of 1 or more and 3 or less. Of these, trifluoromethane sulfonate, and perfluorobutane sulfonate are preferable in view of safety.

In addition, a nitrogen-containing moiety represented by the following formulae (a13) and (a14) may also be used for the anion moiety.

[Chem. 14]

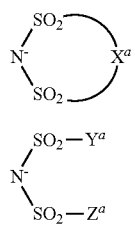

In the formulae (a13) and (a14), $X^a$ represents a linear or branched alkylene group in which at least one hydrogen atom is substituted with a fluorine atom, the carbon number of the alkylene group is 2 or more and 6 or less, preferably 3 or more and 5 or less, and most preferably the carbon number is 3. In addition, $Y^a$ and $Z^a$ each independently represent a linear or branched alkyl group of which at least one hydrogen atom is substituted with a fluorine atom, the number of carbon atoms of the alkyl group is 1 or more and 10 or less, preferably 1 or more and 7 or less, and more preferably 1 or more and 3 or less.

The smaller number of carbon atoms in the alkylene group of $X^a$, or in the alkyl group of $Y^a$ or $Z^a$ is preferred since the solubility into organic solvent is favorable.

In addition, a larger number of hydrogen atoms each substituted with a fluorine atom in the alkylene group of $X^a$, or in the alkyl group of $Y^a$ or $Z^a$ is preferred since the acid strength becomes greater. The percentage of fluorine atoms in the alkylene group or alkyl group, i.e., the fluorination rate is preferably 70% or more and 100% or less and more preferably 90% or more and 100% or less, and most preferable are perfluoroalkylene or perfluoroalkyl groups in which all of the hydrogen atoms are each substituted with a fluorine atom.

Examples of preferable compounds for onium salts having a naphthalene ring at their cation moieties include compounds represented by the following formulae (a15) and (a16).

[Chem. 15]

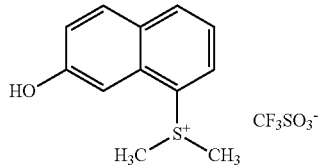

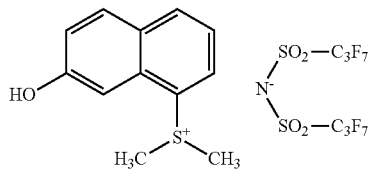

Also, the fifth aspect of the acid generator (A) include bissulfonyldiazomethanes such as bis(p-toluenesulfonyl)diazomethane, bis(1,1-dimethyl ethylsulfonyl)diazomethane, bis(cyclohexylsulfonyl)diazomethane and bis(2,4-dimethylphenylsulfonyl)diazomethane; nitrobenzyl derivatives such as 2-nitrobenzyl p-toluenesulfonate, 2,6-dinitrobenzyl p-toluenesulfonate, nitrobenzyl tosylate, dinitrobenzyl tosylate, nitrobenzyl sulfonate, nitrobenzyl carbonate and dinitrobenzyl carbonate; sulfonates such as pyrogalloltrimesylate, pyrogalloltritosylate, benzyltosylate, benzylsulfonate, N-methylsulfonyloxysuccinimide, N-trichloromethylsulfonyloxysuccinimide, N-phenylsulfonyloxymaleimide and N-methylsulfonyloxyphthalimide; trifluoromethane sulfonates such as N-(trifluoromethylsulfonyloxy)phthalimide, N-(trifluoromethylsulfonyloxy)-1,8-naphthalimide and N-(trifluoromethylsulfonyloxy)-4-butyl-1,8-naphthalimide; onium salts such as diphenyliodonium hexafluorophosphate, (4-methoxyphenyl)phenyliodonium trifluoromethanesulfonate, bis(p-tert-butylphenyl)iodonium trifluoromethanesulfonate, triphenylsulfonium hexafluorophosphate, (4-methoxyphenyl)diphenylsulfonium trifluoromethanesulfonate and (p-tert-butylphenyl)diphenylsulfonium trifluoromethanesulfonate; benzointosylates such as benzointosylate and α-methylbenzointosylate; other diphenyliodonium salts, triphenylsulfonium salts, phenyldiazonium salts, benzylcarbonates and the like.

The above-described acid generator (A) is not particularly limited as long as the photosensitive resin composition satisfies the aforementioned [Requirement 1]. However, from the viewpoint that the photosensitive resin composition satisfying the aforementioned [Requirement 1] is easily obtained, the acid generator (A) that does not include a hydroxyl group, in particular, a phenolic hydroxyl group.

This acid generator (A) may be used alone, or two or more types may be used in combination. Furthermore, the content of the acid generator (A) is adjusted to preferably 0.1% by mass or more and 10% by mass or less, more preferably 0.2% by mass or more and 6% by mass or less, and particularly preferably 0.5% by mass or more and 3% by mass or less, relative to the total mass of the solid component of the photosensitive resin composition. When the amount of the acid generator (A) used is adjusted to the range mentioned above, it is easy to prepare a photosensitive resin composition which is a uniform solution having satisfactory sensitivity and excellent storage stability.

<Resin (B)>

A resin (B) whose solubility in alkali increases under the action of acid is not particularly limited as long as the photosensitive resin composition satisfies the aforementioned [Requirement 1]. As the resin (B) whose solubility in alkali increases under the action of acid, any resin whose solubility in alkali increases under the action of acid can be used as long as the photosensitive resin composition satisfies the aforementioned [Requirement 1]. From the viewpoint that the photosensitive resin composition satisfying the aforementioned [Requirement 1] is easily obtained, it is preferable that the resin (B) does not include a hydroxyl group, in particular, a phenolic hydroxyl group.

As resin (B), the photosensitive resin composition preferably contains at least one resin selected from the group consisting of a novolac resin (B1), a polyhydroxystyrene resin (B2), and an acrylic resin (B3). Among these resins, the photosensitive resin composition preferably includes an acrylic resin (B3) as the resin (B) from the viewpoint that the photosensitive resin composition satisfying the aforementioned [Requirement 1] or the below-mentioned [Requirement 2] can be easily obtained. Typically, an embodiment in which the novolac resin (B1) and/or polyhydroxystyrene resin (B2) is used in combination with an acrylic resin (B3), or an embodiment in which an acrylic resin (B3) is singly used as the resin (B) can be employed.

Hereinafter, the novolac resin (B1), the polyhydroxystyrene resin (B2), and the acrylic resin (B3) are described sequentially.

[Novolac Resin (B1)]

As the novolak resin (B1), a resin including the constituent unit represented by the following formula (b1) may be used.

[Chem. 16]

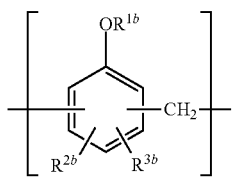

(b1)

In the formula (b1), $R^{1b}$ represents an acid-dissociable dissolution-inhibiting group, and $R^{2b}$ and $R^{3b}$ each independently represent a hydrogen atom or an alkyl group having 1 or more and 6 or less carbon atoms.

The acid-dissociable dissolution-inhibiting group represented by the above $R^{1b}$ is preferably a group represented by the following formula (b2) or (b3), a linear, branched or cyclic alkyl group having 1 or more and 6 or less carbon atoms, a vinyloxyethyl group, a tetrahydropyranyl group, a tetrahydrofuranyl group, or a trialkylsilyl group.

[Chem. 17]

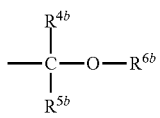

(b2)

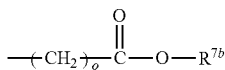

(b3)

In the above formulae (b2) and (b3), $R^{4b}$ and $R^{5b}$ each independently represent a hydrogen atom, or a linear or branched alkyl group having 1 or more and 6 or less carbon atoms, $R^{6b}$ represents a linear, branched or cyclic alkyl group having 1 or more and 10 or less carbon atoms, $R^{7b}$ represents a linear, branched or cyclic alkyl group having 1 or more and 6 or less carbon atoms, and o represents 0 or 1.

Examples of the above linear or branched alkyl group include a methyl group, an ethyl group, a propyl group, an isopropyl group, an n-butyl group, an isobutyl group, a tert-butyl group, a pentyl group, an isopentyl group, a neopentyl group, and the like. Also, examples of the above cyclic alkyl group include a cyclopentyl group, a cyclohexyl group, and the like.

Specific examples of the acid-dissociable dissolution-inhibiting group represented by the above formula (b2) include a methoxyethyl group, ethoxyethyl group, n-propoxyethyl group, isopropoxyethyl group, n-butoxyethyl group, isobutoxyethyl group, tert-butoxyethyl group, cyclohexyloxyethyl group, methoxypropyl group, ethoxypropyl group, 1-methoxy-1-methyl-ethyl group, 1-ethoxy-1-methylethyl group, and the like. Furthermore, specific examples of the acid-dissociable dissolution-inhibiting group represented by the above formula (b3) include a tert-butoxycarbonyl group, a tert-butoxycarbonylmethyl group, and the like. Examples of the above trialkylsilyl group include a trimethylsilyl group and tri-tert-butyldimethylsilyl group in which each alkyl group has 1 or more and 6 or less carbon atoms.

[Polyhydroxystyrene Resin (B2)]

As the polyhydroxystyrene resin (B2), a resin including a constituent unit represented by the following formula (b4) may be used.

[Chem. 18]

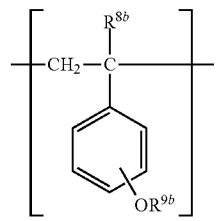

(b4)

In the above formula (b4), $R^{8b}$ represents a hydrogen atom or an alkyl group having 1 or more and 6 or less carbon atoms, and $R^{9b}$ represents an acid-dissociable dissolution-inhibiting group.

The above alkyl group having 1 or more and 6 or less carbon atoms may include, for example, linear, branched or cyclic alkyl groups having 1 or more and 6 or less carbon atoms. Examples of the linear or branched alkyl group include a methyl group, ethyl group, propyl group, isopropyl group, n-butyl group, isobutyl group, tert-butyl group, pentyl group, isopentyl group, neopentyl group, and the like. Examples of the cyclic alkyl group include a cyclopentyl group and cyclohexyl group.

The acid-dissociable dissolution-inhibiting group represented by the above $R^{9b}$ may be similar to the acid-dissociable dissolution-inhibiting groups exemplified in terms of the above formulae (b2) and (b3).

Furthermore, the polyhydroxystyrene resin (B2) may include another polymerizable compound as a constituent unit in order to moderately control physical or chemical properties. The polymerizable compound is exemplified by conventional radical polymerizable compounds and anion polymerizable compounds. Examples of the polymerizable compound include monocarboxylic acids such as acrylic acid, methacrylic acid and crotonic acid; dicarboxylic acids such as maleic acid, fumaric acid and itaconic acid; methacrylic acid derivatives having a carboxyl group and an ester bond such as 2-methacryloyloxyethyl succinic acid, 2-methacryloyloxyethyl maleic acid, 2-methacryloyloxyethyl phthalic acid and 2-methacryloyloxyethyl hexahydrophthalic acid; (meth)acrylic acid alkyl esters such as methyl (meth)acrylate, ethyl (meth)acrylate and butyl (meth)acrylate; (meth)acrylic acid hydroxyalkyl esters such as 2-hydroxyethyl (meth)acrylate and 2-hydroxypropyl (meth)acrylate; (meth)acrylic acid aryl esters such as phenyl (meth)acrylate and benzyl (meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; and amide bond-containing polymerizable compounds such as acrylamide and methacrylamide.

[Acrylic Resin (B3)]

An acrylic resin (B3) is not particularly limited as long as it is an acrylic resin the solubility of which in alkali increases under the action of acid, and has conventionally blended in various photosensitive resin compositions. Preferably, the acrylic resin (B3) contains a constituent unit (b-3) derived from, for example, an acrylic ester including an —$SO_2$-containing cyclic group or a lactone-containing cyclic group. In such a case, when a resist pattern is formed, a resist pattern having a preferable cross-sectional shape can be easily formed.

(—$SO_2$-Containing Cyclic Group)

Herein, the "—$SO_2$-containing cyclic group" refers to a cyclic group having a cyclic group containing a ring including —$SO_2$— in the ring skeleton thereof, specifically a cyclic group in which the sulfur atom (S) in —$SO_2$— forms a part of the ring skeleton of the cyclic group. Considering a ring including —$SO_2$— in the ring skeleton thereof as the first ring, a group having that ring alone is called a monocyclic group, and a group further having another ring structure is called a polycyclic group regardless of its structure. The —$SO_2$— containing cyclic group may be monocyclic or polycyclic.

In particular, the —$SO_2$-containing cyclic group is preferably a cyclic group containing —O—$SO_2$— in the ring skeleton thereof, i.e., a cyclic group containing a sultone ring in which —O—S— in —O—$SO_2$— forms a part of the ring skeleton.

The number of carbon atoms in an —$SO_2$-containing cyclic group is preferably 3 or more and 30 or less, more preferably 4 or more and 20 or less, even more preferably 4 or more and 15 or less, and in particular preferably 4 or more and 12 or less. The above number of carbon atoms is the number of carbon atoms constituting a ring skeleton, and shall not include the number of carbon atoms in a substituent.

The —$SO_2$-containing cyclic group may be an —$SO_2$-containing aliphatic cyclic group or an —$SO_2$-containing aromatic cyclic group. It is preferably an —$SO_2$-containing aliphatic cyclic group.

—$SO_2$— containing aliphatic cyclic groups include a group in which at least one hydrogen atom is removed from an aliphatic hydrocarbon ring where a part of the carbon atoms constituting the ring skeleton thereof is(are) substituted with —$SO_2$— or —O—$SO_2$—. More specifically, they include a group in which at least one hydrogen atom is removed from an aliphatic hydrocarbon ring where —$CH_2$— constituting the ring skeleton thereof is substituted with —$SO_2$— and a group in which at least one hydrogen atom is removed from an aliphatic hydrocarbon ring where —$CH_2$—$CH_2$— constituting the ring thereof is substituted with —O—$SO_2$—.

The number of carbon atoms in the above alicyclic hydrocarbon ring is preferably 3 or more and 20 or less, more preferably 3 or more and 12 or less. The above alicyclic hydrocarbon ring may be polycyclic, or may be monocyclic. As the monocyclic alicyclic hydrocarbon group, preferred is a group in which two hydrogen atoms are removed from monocycloalkane having 3 or more and 6 or less carbon atoms. Examples of the above monocycloalkane can include cyclopentane, cyclohexane and the like. As the polycyclic alicyclic hydrocarbon ring, preferred is a group in which two hydrogen atoms are removed from polycycloalkane having 7 or more and 12 or less carbon atoms, and specific examples of the above polycycloalkane include adamantane, norbornane, isobornane, tricyclodecane, tetracyclododecane and the like.

The —$SO_2$-containing cyclic group may have a substituent. Examples of the above substituent include, for example, an alkyl group, an alkoxy group, a halogen atom, a halogenated alkyl group, a hydroxy group, an oxygen atom (=O), —COOR'', —OC(=O)R'', a hydroxyalkyl group, a cyano group and the like.

For an alkyl group as the above substituent, preferred is an alkyl group having 1 or more and 6 or less carbon atoms. The above alkyl group is preferably linear or branched. Specific examples include a methyl group, an ethyl group, an n-propyl group, an isopropyl group, an n-butyl group, an isobutyl group, a tert-butyl group, an n-pentyl group, an isopentyl group, a neopentyl group, an n-hexyl group and the like. Among these, a methyl group or an ethyl group is preferred, and a methyl group is particularly preferred.

For an alkoxy group as the above substituent, preferred is an alkoxy group having 1 or more and 6 or less carbon atoms. The above alkoxy group is preferably linear or branched. Specific examples include a group in which an alkyl groups recited as an alkyl group for the above substituent is attached to the oxygen atom (—O—).

Halogen atoms as the above substituent include a fluorine atom, a chlorine atom, a bromine atom, an iodine atom and the like, and a fluorine atom is preferred.

Halogenated alkyl groups for the above substituent include a group in which a part or all of the hydrogen atoms in the above alkyl group is(are) substituted with the above halogen atom(s)

Halogenated alkyl groups as the above substituent include a group in which a part or all of the hydrogen atoms in the alkyl groups recited as an alkyl group for the above substituent is(are) substituted with the above halogen atom(s). As the above halogenated alkyl group, a fluorinated alkyl group is preferred, and a perfluoroalkyl group is particularly preferred.

R"s in the aforementioned —COOR" and —OC(=O)R" are either a hydrogen atom or a linear, branched or cyclic alkyl group having 1 or more and 15 or less carbon atoms.

In a case where R" is a linear or branched alkyl group, the number of carbon atoms in the above chain alkyl group is preferably 1 or more and 10 or less, more preferably 1 or more and 5 or less, and in particular preferably 1 or 2.

In a case where R" is a cyclic alkyl group, the number of carbon atoms in the above cyclic alkyl group is preferably 3 or more and 15 or less, more preferably 4 or more and 12 or less, and in particular preferably 5 or more and 10 or less. Specific examples can include a group in which one or more hydrogen atoms are removed from monocycloalkane; and polycycloalkane such as bicycloalkane, tricycloalkane, tetracycloalkane and the like optionally substituted with a fluorine atom or a fluorinated alkyl group. More specific examples include a group in which one or more hydrogen atoms are removed from monocycloalkane such as cyclopentane and cyclohexane; and polycycloalkane such as adamantane, norbornane, isobornane, tricyclodecane and tetracyclododecane.

For a hydroxyalkyl group as the above substituent, preferred is a hydroxyalkyl group having 1 or more and 6 or less carbon atoms. Specific examples include a group in which at least one of the hydrogen atoms in the alkyl groups recited as an alkyl group for the above substituent is substituted with a hydroxy group.

More specific examples of the —SO$_2$-containing cyclic group include the groups represented by the following formulae (3-1) to (3-4).

[Chem. 19]

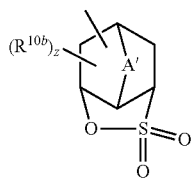

(3-1)

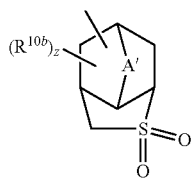

(3-2)

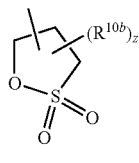

(3-3)

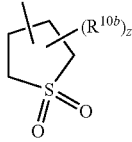

(3-4)

(In the formulae, A' represents an alkylene group having 1 or more and 5 or less carbon atoms optionally including an oxygen atom or a sulfur atom, an oxygen atom or a sulfur atom; z represents an integer of 0 or more and 2 or less; $R^{10b}$ represents an alkyl group, an alkoxy group, a halogenated alkyl group, a hydroxy group, —COOR", —OC(=O)R", a hydroxyalkyl group, or a cyano group; and R" represents a hydrogen atom or an alkyl group.)

In the above formulae (3-1) to (3-4), A' represents an alkylene group having 1 or more and 5 or less carbon atoms optionally including an oxygen atom (—O—) or a sulfur atom (—S—), an oxygen atom or a sulfur atom. As an alkylene group having 1 or more and 5 or less carbon atoms in A', a linear or branched alkylene group is preferred, and examples thereof include a methylene group, an ethylene group, an n-propylene group, an isopropylene group and the like.

In a case where the above alkylene group includes an oxygen atom or a sulfur atom, specific examples thereof include a group in which —O— or —S— is present at a terminal or between carbon atoms of the above alkylene group, for example, —O—CH$_2$—, —CH$_2$—O—CH$_2$—, —S—CH$_2$—, —CH$_2$—S—CH$_2$—, and the like. As A', an alkylene group having 1 or more and 5 or less carbon atoms or —O— is preferred, and an alkylene group having 1 or more and 5 or less carbon atoms is more preferred, and a methylene group is most preferred.

z may be any of 0, 1, and 2, and is most preferably 0. In a case where z is 2, a plurality of $R^{10b}$ may be the same, or may differ from each other.

An alkyl group, —COOR", —OC(=O)R" and a hydroxyalkyl group in $R^{10b}$ include those similar to the groups described above for the alkyl group, the alkoxy group, the halogenated alkyl group, —COOR", —OC(=O)R" and the hydroxyalkyl group, respectively, which are recited as a substituent optionally contained in the —SO$_2$-containing cyclic group.

Below, specific cyclic groups represented by the above formulae (3-1) to (3-4) will be illustrated. Note here that "Ac" in the formulae represents an acetyl group.

[Chem. 20]

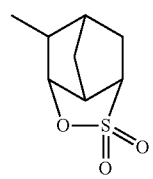

(3-1-1)

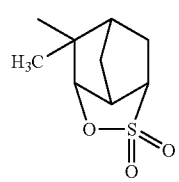

(3-1-2)

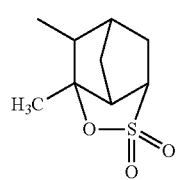

(3-1-3)

-continued
(3-1-4) 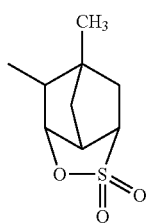
(3-1-5) 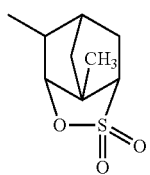
(3-1-6) 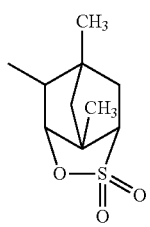
(3-1-7) 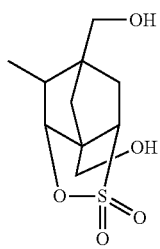
(3-1-8) 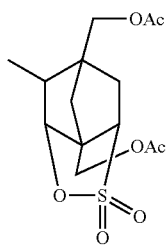
(3-1-9) 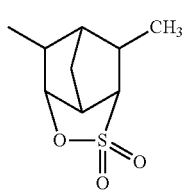
(3-1-10) 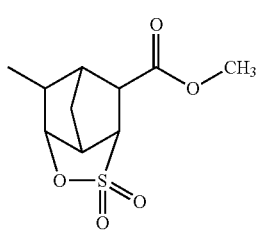
-continued
(3-1-11) 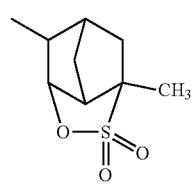
(3-1-12) 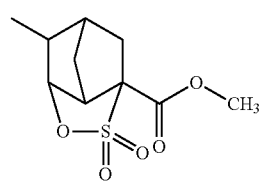
(3-1-13) 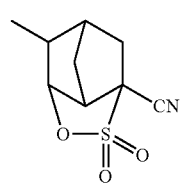
(3-1-14) 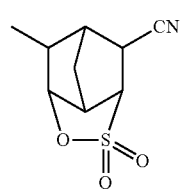
(3-1-15) 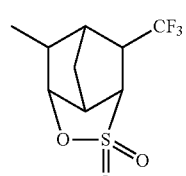
(3-1-16) 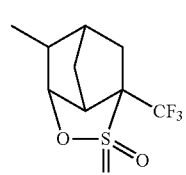
(3-1-17) 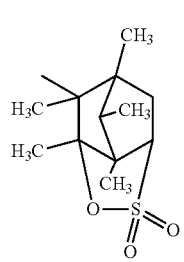
(3-1-18) 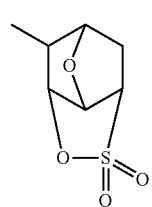

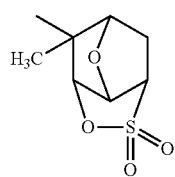 (3-1-19)
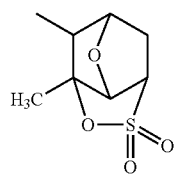 (3-1-20)
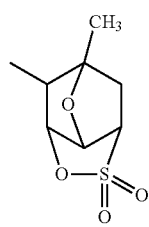 (3-1-21)
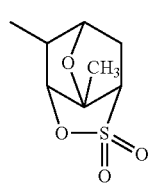 (3-1-22)
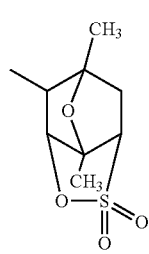 (3-1-23)
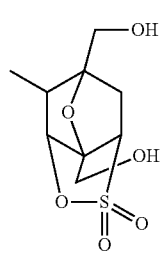 (3-1-24)
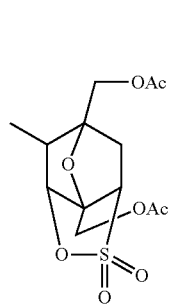 (3-1-25)
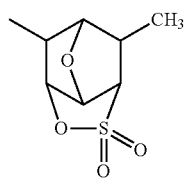 (3-1-26)
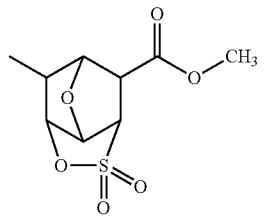 (3-1-27)
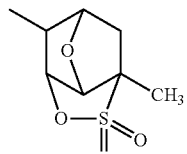 (3-1-28)
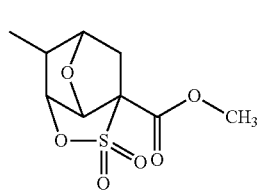 (3-1-29)
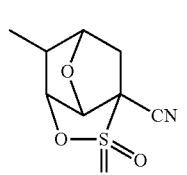 (3-1-30)
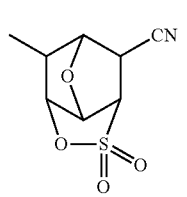 (3-1-31)
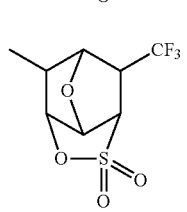 (3-1-32)
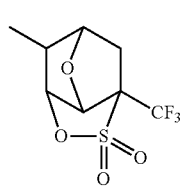 (3-1-33)

(3-2-1)

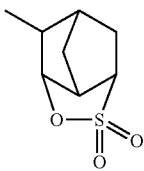

(3-2-2)

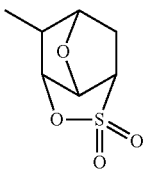

(3-3-1)

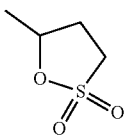

(3-4-1)

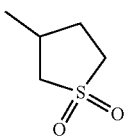

As the —SO$_2$-containing cyclic group, among those shown above, a group represented by the above formula (3-1) is preferred, and at least one selected from the group consisting of the groups represented by any of the aforementioned formulae (3-1-1), (3-1-18), (3-3-1) and (3-4-1) is more preferred, and a group represented by the aforementioned formula (3-1-1) is most preferred.

(Lactone-Containing Cyclic Group)

The "lactone-containing cyclic group" refers to a cyclic group containing a ring (lactone ring) including —O—C(=O)— in the ring skeleton thereof. Considering the lactone ring as the first ring, a group having that lactone ring alone is called a monocyclic group, and a group further having another ring structure is called a polycyclic group regardless of its structure. The lactone-containing cyclic group may be a monocyclic group, or may be a polycyclic group.

There is no particular limitation on the lactone-containing cyclic group in the constituent unit (b-3), and any cyclic group containing lactone can be used. Specifically, examples of the lactone-containing monocyclic groups include a group in which one hydrogen atom is removed from 4 to 6 membered ring lactone, for example, a group in which one hydrogen atom is removed from β-propiono lactone, a group in which one hydrogen atom is removed from γ-butyrolactone, a group in which one hydrogen atom is removed from δ-valerolactone and the like. Further, lactone-containing polycyclic groups include a group in which one hydrogen atom is removed from bicycloalkane, tricycloalkane and tetracycloalkane having a lactone ring.

As to the structure of the constituent unit (b-3), as long as the constituent unit (b-3) has an —SO$_2$-containing cyclic group or a lactone-containing cyclic group, the structure of parts other than an —SO$_2$-containing cyclic group and a lactone-containing cyclic group is not particularly limited. A preferred constituent unit (b-3) is at least one constituent unit selected from the group consisting of a constituent unit (b-3-S) derived from an acrylic acid ester including an —SO$_2$-containing cyclic group in which a hydrogen atom attached to the carbon atom in the α position may be substituted with a substituent; and a constituent unit (b-3-L) derived from an acrylic acid ester including a lactone-containing cyclic group in which the hydrogen atom attached to the carbon atom in the α position may be substituted with a substituent.

[Constituent Unit (b-3-S)]

More specifically, examples of the constituent unit (b-3-S) include one represented by the following formula (b-S1).

[Chem. 22]

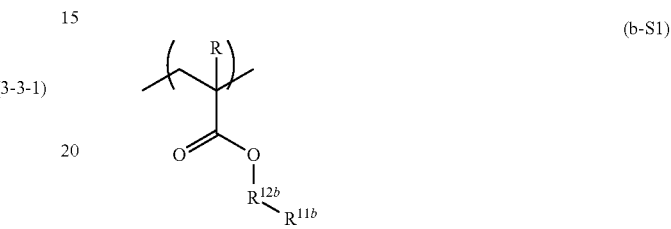

(b-S1)

(In the formula, R represents a hydrogen atom, an alkyl group having 1 or more 5 or less carbon atoms or a halogenated alkyl group having 1 or more 5 or less carbon atoms; and $R^{11b}$ represents an —SO$_2$-containing cyclic group; and $R^{12b}$ represents a single-bond or divalent linking group.)

In the formula (b-S1), R is similarly defined as above. $R^{11b}$ is similarly defined as in the —SO$_2$-containing cyclic group described above. $R^{12b}$ may be either a single-bond linking group or a divalent linking group. A divalent linking group is preferred due to the superior effect of the present invention.

There is no particular limitation on the divalent linking group in $R^{12b}$, and suitable examples include an optionally substituted divalent hydrocarbon group, a divalent linking group including a heteroatom, and the like.

Optionally Substituted Divalent Hydrocarbon Group

The hydrocarbon group as a divalent linking group may be an aliphatic hydrocarbon group, or may be an aromatic hydrocarbon group. The aliphatic hydrocarbon group means a hydrocarbon group without aromaticity. The above aliphatic hydrocarbon group may be saturated or may be unsaturated. Usually, a saturated hydrocarbon group is preferred. More specifically, examples of the above aliphatic hydrocarbon group include a linear or branched aliphatic hydrocarbon group, an aliphatic hydrocarbon group including a ring in the structure thereof and the like.

The number of carbon atoms in the linear or branched aliphatic hydrocarbon group is preferably 1 or more and 10 or less, more preferably 1 or more and 8 or less, and even more preferably 1 or more and 5 or less.

As the linear aliphatic hydrocarbon group, a linear alkylene group is preferred. Specific examples include a methylene group [—CH$_2$—], an ethylene group [—(CH$_2$)$_2$—], a trimethylene group [—(CH$_2$)$_3$—], a tetramethylene group [—(CH$_2$)$_4$—], a pentamethylene group [—(CH$_2$)$_5$-] and the like.

As the branched aliphatic hydrocarbon group, a branched alkylene group is preferred. Specific examples include alkyl alkylene groups such as alkyl methylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; alkyl ethylene groups such as —CH $(CH_3)CH_2-$, $-CH(CH_3)CH(CH_3)-$, $-C(CH_3)_2CH_2-$, $-CH(CH_2CH_3)CH_2-$ and $-C(CH_2CH_3)_2-CH_2-$; alkyl trimethylene groups such as $-CH(CH_3)CH_2CH_2-$ and $-CH_2CH(CH_3)CH_2-$; alkyl tetramethylene groups such as $-CH(CH_3)CH_2CH_2CH_2-$ and $-CH_2CH(CH_3)CH_2CH_2-$; and the like. As an alkyl group in the alkyl alkylene group, a linear alkyl group having 1 or more and 5 or less carbon atoms is preferred.

The above linear or branched aliphatic hydrocarbon group may or may not have a substituent (a group or atom other than a hydrogen atom) which substitutes a hydrogen atom. Examples of the substituent include a fluorine atom, a fluorinated alkyl group having 1 or more and 5 or less carbon atoms substituted with a fluorine atom, an oxo group (=O) and the like.

Examples of the above aliphatic hydrocarbon group including a ring in the structure thereof include a cyclic aliphatic hydrocarbon group optionally including a hetero atom in the ring structure (a group in which two hydrogen atoms are removed from an aliphatic hydrocarbon ring); a group in which the above cyclic aliphatic hydrocarbon group is attached to an end of a linear or branched aliphatic hydrocarbon group; a group in which the above cyclic aliphatic hydrocarbon group is present in a linear or branched aliphatic hydrocarbon group along the chain; and the like. Examples of the above linear or branched aliphatic hydrocarbon group include groups similar to the above.

The number of carbon atoms in the cyclic aliphatic hydrocarbon group is preferably 3 or more and 20 or less, and more preferably 3 or more and 12 or less.

The cyclic aliphatic hydrocarbon group may be polycyclic, or may be monocyclic. As the monocyclic aliphatic hydrocarbon group, a group in which two hydrogen atoms are removed from monocycloalkane is preferred. The number of carbon atoms in the above monocycloalkane is preferably 3 or more and 6 or less. Specific examples include cyclopentane, cyclohexane and the like. As the polycyclic aliphatic hydrocarbon group, a group in which two hydrogen atoms are removed from polycycloalkane is preferred. The number of carbon atoms in the above polycycloalkane is preferably 7 or more and 12 or less. Specific examples include adamantane, norbornane, isobornane, tricyclodecane, tetracyclododecane and the like.

The cyclic aliphatic hydrocarbon group may or may not have a substituent which substitutes a hydrogen atom (a group or atom other than a hydrogen atom). Examples of the above substituent include an alkyl group, an alkoxy group, a halogen atom, a halogenated alkyl group, a hydroxy group, an oxo group (=O) and the like.

For an alkyl group as the above substituent, an alkyl group having 1 or more and 5 or less carbon atoms is preferred, and a methyl group, an ethyl group, a propyl group, an n-butyl group and a tert-butyl group are more preferred.

For an alkoxy group as the above substituent, an alkoxy group having 1 or more and 5 or less carbon atoms is preferred, and a methoxy group, an ethoxy group, an n-propoxy group, an iso-propoxy group, an n-butoxy group and a tert-butoxy group are more preferred, and a methoxy group and an ethoxy group are particularly preferred.

Halogen atoms as the above substituent include a fluorine atom, a chlorine atom, a bromine atom, an iodine atom and the like, and a fluorine atom is preferred.

Halogenated alkyl groups as the above substituent include a group in which a part or all of hydrogen atoms in the aforementioned alkyl group is(are) substituted with the above halogen atom(s)

In the cyclic aliphatic hydrocarbon group, a part of carbon atoms constituting the ring structure thereof may be substituted with $-O-$, or $-S-$. As the substituent including the above hetero atom, preferred are $-O-$, $-C(=O)-O-$, $-S-$, $-S(=O)_2-$ and $-S(=O)_2-O-$.

The aromatic hydrocarbon group as the divalent hydrocarbon group is a divalent hydrocarbon group having at least one aromatic ring, and may have a substituent. There is no particular limitation on the aromatic ring as long as it is a cyclic conjugated system having a $4n+2\pi$ electrons, and it may be monocyclic or may be polycyclic. The number of carbon atoms in the aromatic ring is preferably 5 or more and 30 or less, more preferably 5 or more and 20 or less, further more preferably 6 or more and 15 or less, and particularly preferably 6 or more and 12 or less. However, the number of carbon atoms in a substituent shall not be included in the above number of carbon atoms.

Specifically, aromatic rings include aromatic hydrocarbon rings such as benzene, naphthalene, anthracene and phenanthrene; aromatic heterocycles in which a part of the carbon atoms constituting the above aromatic hydrocarbon ring is (are) substituted with hetero atom(s). Hetero atoms in the aromatic heterocycle include an oxygen atom, a sulfur atom, a nitrogen atom and the like. Specifically, aromatic heterocycles include a pyridine ring, a thiophene ring, and the like.

Specific examples of the aromatic hydrocarbon group as a divalent hydrocarbon group include a group in which two hydrogen atoms are removed from the above aromatic hydrocarbon ring or the above aromatic heterocycle (an arylene group or a heteroarylene group); a group in which two hydrogen atoms are removed from an aromatic compound including two or more aromatic rings (for example, biphenyl, fluorene and the like); a group in which one hydrogen atom from a group where one hydrogen atom is removed from the above aromatic hydrocarbon ring or the above aromatic heterocycle (an aryl group or a heteroaryl group) is substituted with an alkylene group (for example, a group in which one hydrogen atom is further removed from an aryl group in an arylalkyl group such as a benzyl group, a phenethyl group, a 1-naphthylmethyl group, a 2-naphthylmethyl group, a 1-naphthylethyl group and a 2-naphthylethyl group); and the like.

The number of carbon atoms in the above alkylene group bonded to an aryl group or a heteroaryl group is preferably 1 or more and 4 or less, more preferably 1 or more and 2 or less, and particularly preferably 1.

In the above aromatic hydrocarbon group, a hydrogen atom of the above aromatic hydrocarbon group may be substituted with a substituent. For example, a hydrogen atom attached to an aromatic ring in the above aromatic hydrocarbon group may be substituted with a substituent. Examples of the substituent include an alkyl group, an alkoxy group, a halogen atom, a halogenated alkyl group, a hydroxy group, an oxo group (=O) and the like.

For an alkyl group as the above substituent, an alkyl group having 1 or more and 5 or less carbon atoms is preferred, and a methyl group, an ethyl group, an n-propyl group, an n-butyl group and a tert-butyl group are more preferred.

For an alkoxy group as the above substituent, an alkoxy group having 1 or more and 5 or less carbon atoms is preferred, and a methoxy group, an ethoxy group, an n-propoxy group, an iso-propoxy group, an n-butoxy group and a tert-butoxy group are preferred, and a methoxy group and an ethoxy group are more preferred.

Halogen atoms as the above substituent include a fluorine atom, a chlorine atom, a bromine atom, an iodine atom and the like, and a fluorine atom is preferred.

Halogenated alkyl groups as the above substituent include a group in which a part or all of hydrogen atoms in the aforementioned alkyl group is(are) substituted with the above halogen atom(s)

Divalent Linking Group Including Hetero Atom

A hetero atom in the divalent linking group including a hetero atom is an atom other than a carbon atom and a hydrogen atom, and examples thereof include an oxygen atom, a nitrogen atom, a sulfur atom, a halogen atom and the like.

Specific examples of the divalent linking group including a hetero atom include non-hydrocarbon based linking groups such as —O—, —C(=O)—, —C(=O)—O—, —O—C(=O)—O—, —S—, —S(=O)$_2$—, —S(=O)$_2$—O—, —NH—, —NH—C(=O)—, —NH—C(=NH)—, =N—, and combinations of at least one of these non-hydrocarbon based linking groups and a divalent hydrocarbon group and the like. Examples of the above divalent hydrocarbon group include those similar to the aforementioned divalent hydrocarbon groups optionally having a substituent, and linear or branched aliphatic hydrocarbon groups are preferred.

Among those described above, —NH— in —C(=O)—NH—, and H in —NH— and —NH—C(=NH)— may be substituted with a substituent such as an alkyl group or an acyl group, respectively. The number of carbon atoms in the above substituent is preferably 1 or more and 10 or less, more preferably 1 or more and 8 or less, and in particular preferably 1 or more and 5 or less.

As a divalent linking group in $R^{12b}$, a linear or branched alkylene group, a cyclic aliphatic hydrocarbon group, or a divalent linking group including a hetero atom is preferred.

In a case where the divalent linking group in $R^{12b}$ is a linear or branched alkylene group, the number of carbon atoms in the above alkylene group is preferably 1 or more and 10 or less, more preferably 1 or more and 6 or less, in particular preferably 1 or more and 4 or less, and most preferably 1 or more and 3 or less. Specific examples include groups similar to the linear alkylene groups or branched alkylene groups recited as a linear and branched aliphatic hydrocarbon group in the description of the "divalent hydrocarbon group optionally having a substituent" as the aforementioned divalent linking group.

In a case where the divalent linking group in $R^{12b}$ is an cyclic aliphatic hydrocarbon group, examples of the above cyclic aliphatic hydrocarbon group include groups similar to the cyclic aliphatic hydrocarbon groups recited as the "aliphatic hydrocarbon group including a ring in the structure" in the description of the "divalent hydrocarbon group optionally having a substituent" as the aforementioned divalent linking group.

As the above cyclic aliphatic hydrocarbon group, particularly preferred is a group in which two or more hydrogen atoms are removed from cyclopentane, cyclohexane, norbornane, isobornane, adamantane, tricyclodecane or tetracyclododecane.

In a case where the divalent linking group in $R^{12b}$ is a divalent linking group including a hetero atom, groups preferred as the above linking groups include —O—, —C(=O)—O—, —C(=O)—, —O—C(=O)—O—, —C(=O)—NH—, —NH— (H may be substituted with a substituent such as an alkyl group or an acyl group), —S—, —S(=O)$_2$—, —S(=O)$_2$—O— and a group represented by the general formula —Y$^1$—O—Y$^2$—, —[Y$^1$—C(=O)—O]$_{m'}$—Y$^2$— or —Y$^1$—O—C(=O)—Y$_2$— (wherein Y$^1$ and Y$^2$ are divalent hydrocarbon groups each independently, optionally having a substituent, and O represents an oxygen atom, and m' is an integer of 0 or more and 3 or less).

In a case where the divalent linking group in $R^{12b}$ is —NH— the hydrogen atom in —NH— may be substituted with a substituent such as an alkyl group or an acyl group. The number of carbon atoms in the above substituent (an alkyl group, an acyl group and the like) is preferably 1 or more and 10 or less, more preferably 1 or more and 8 or less, and in particular preferably 1 or more and 5 or less.

Y$^1$ and Y$^2$ in the formula Y$^1$—O—Y$^2$—, —[Y$^1$—C(=O)—O]$_{m'}$—Y$^2$— or —Y$^1$—O—C(=O)—Y$^2$— are divalent hydrocarbon groups each independently, optionally having a substituent. Examples of the above divalent hydrocarbon group include groups similar to the "divalent hydrocarbon group optionally having a substituent" recited in the description of the above divalent linking group.

As Y$^1$, a linear aliphatic hydrocarbon group is preferred, and a linear alkylene group is more preferred, and a linear alkylene group having 1 or more and 5 or less carbon atoms is more preferred, and a methylene group and an ethylene group are particularly preferred.

As Y$^2$, a linear or branched aliphatic hydrocarbon group is preferred, and a methylene group, an ethylene group and an alkylmethylene group are more preferred. The alkyl group in the above alkylmethylene group is preferably a linear alkyl group having 1 or more and 5 or less carbon atoms, more preferably a linear alkyl group having 1 or more and 3 or less carbon atoms, and particularly preferably a methyl group.

In a group represented by the formula —[Y$^1$—C(=O)—O]$_{m'}$—Y$^2$—, m' is an integer of 0 or more and 3 or less, preferably an integer of 0 or more and 2 or less, more preferably 0 or 1, and particularly preferably 1. In other words, as a group represented by the formula —[Y$^1$—C(=O)—O]$_{m'}$—Y$^2$—, a group represented by the formula —Y$^1$—C(=O)—O—Y$^2$— is particularly preferred. Among these, a group represented by the formula —(CH$_2$)$_{a'}$—C(=O)—O—(CH$_2$)$_{b'}$— is preferred. In the above formula, a' is an integer of 1 or more and 10 or less, preferably an integer of 1 or more and 8 or less, more preferably an integer of 1 or more and 5 or less, even more preferably 1 or 2, and most preferably 1. b' is an integer of 1 or more and 10 or less, preferably an integer of 1 or more and 8 or less, more preferably an integer of 1 or more and 5 or less, even more preferably 1 or 2, and most preferably 1.

With regard to the divalent linking group in $R^{12b}$, an organic group including a combination of at least one non-hydrocarbon group and a divalent hydrocarbon group is preferred as the divalent linking group including a hetero atom. Among these, a linear chain group having an oxygen atom as a hetero atom, for example, a group including an ether bond or an ester bond is preferred, and a group represented by the aforementioned formula —Y$^1$—O—Y$^2$—, —[Y$^1$—C(=O)—O]$_{m'}$—Y$^2$— or —Y$^1$—O—C(=O)—Y$^2$— is more preferred, and a group represented by the aforementioned formula —[Y$^1$—C(=O)—O]$_{m'}$—Y$^2$— or —Y$^1$—O—C(=O)—Y$^2$— is particularly preferred.

As the divalent linking group in $R^{12b}$, a group including an alkylene group or an ester bond (—C(=O)—O—) is preferred.

The above alkylene group is preferably a linear or branched alkylene group. Suitable examples of the above linear aliphatic hydrocarbon group include a methylene group [—CH$_2$—], an ethylene group [—(CH$_2$)$_2$—], a trimethylene group [—(CH$_2$)$_3$—], a tetramethylene group [—(CH$_2$)$_4$—], a pentamethylene group [—(CH$_2$)$_5$-] and the like. Suitable examples of the above branched alkylene group include alkyl alkylene groups such as alkyl methylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; alkyl ethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$— and —C(CH$_2$CH$_3$)$_2$—CH$_2$—; alkyl trimethylene groups such as —CH(CH$_3$)CH$_2$CH$_2$— and —CH$_2$CH(CH$_3$)CH$_2$—; alkyl tetramethylene groups such as —CH(CH$_3$)CH$_2$CH$_2$CH$_2$— and —CH$_2$CH(CH$_3$) CH$_2$CH$_2$—.

As the divalent linking group including an ester bond, particularly preferred is a group represented by the formula: —R$^{13b}$—C(=O)—O—[wherein R$^{13b}$ represents a divalent linking group.]. In other words, the constituent unit (b-3-S) is preferably a constituent unit represented by the following formula (b-S1-1).

[Chem. 23]

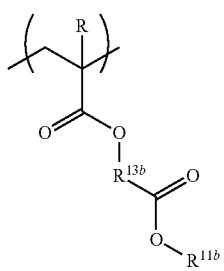

(b-S1-1)

(In the formula, R and R$^{11b}$ are each similar to the above, and R$^{13b}$ represents a divalent linking group.)

There is no particular limitation for R$^{13b}$, examples thereof include groups similar to the aforementioned divalent linking group in R$^{12b}$. As the divalent linking group in R$^{13b}$, a linear or branched alkylene group, an aliphatic hydrocarbon group including a ring in the structure, or a divalent linking group including a hetero atom is preferred, and a linear or branched alkylene group or a divalent linking group including an oxygen atom as a hetero atom is preferred.

As the linear alkylene group, a methylene group or an ethylene group is preferred, and a methylene group is particularly preferred. As the branched alkylene group, an alkylmethylene group or an alkylethylene group is preferred, and —CH(CH$_3$)—, —C(CH$_3$)$_2$— or —C(CH$_3$)$_2$CH$_2$— is particularly preferred.

As the divalent linking group including an oxygen atom, a divalent linking group including an ether bond or an ester bond is preferred, and the aforementioned —Y$^1$—O—Y$^2$—, —[Y$^1$—C(=O)—O]$_{m'}$—Y$^2$— or —Y$^1$—O—C(=O)—Y$^2$— is more preferred. Y$^1$ and Y$^2$ are each independently divalent hydrocarbon groups optionally having a substituent, and m' is an integer of 0 or more and 3 or less. Among these, —Y$^1$—O—C(=O)—Y$^2$— is preferred, and a group represented by —(CH$_2$)$_c$—O—C(=O)—(CH$_2$)$_d$— is particularly preferred. c is an integer of 1 or more and 5 or less, and 1 or 2 is preferred. d is an integer of 1 or more and 5 or less, and 1 or 2 is preferred.

As the constituent unit (b-3-S), in particular, one represented by the following formula (b-S1-11) or (b-S1-12) is preferred, and one represented by the formula (b-S1-12) is more preferred.

[Chem. 24]

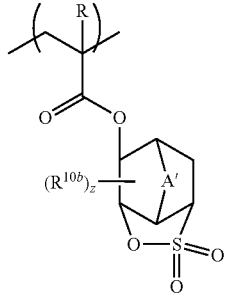

(b-S1-11)

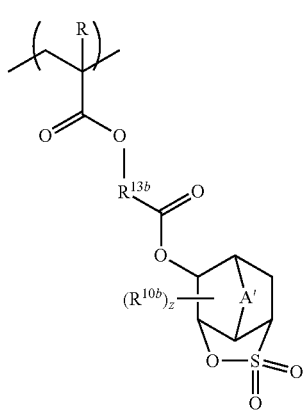

(b-S1-12)

(In the formulae, R, A', R$^{10b}$, z and R$^{13b}$ are each the same as the above.)

In the formula (b-S1-11), A' is preferably a methylene group, an oxygen atom (—O—) or a sulfur atom (—S—).

As R$^{13b}$, preferred is a linear or branched alkylene group or a divalent linking group including an oxygen atom. Examples of the linear or branched alkylene group and the divalent linking group including an oxygen atom in R$^{13b}$ include groups similar to the aforementioned linear or branched alkylene group and the aforementioned divalent linking group including an oxygen atom, respectively.

As the constituent unit represented by the formula (b-S1-12), particularly preferred is one represented by the following formula (b-S1-12a) or (b-S1-12b).

[Chem. 25]

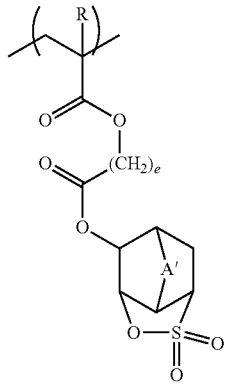

(b-S1-12a)

(b-S1-12b)

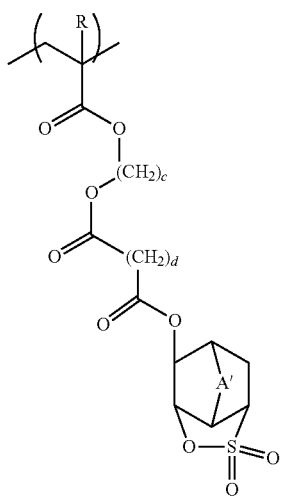

(In the formulae, R and A' are each the same as the above, and c to e are each independently an integer of 1 or more and 3 or less.)

[Constituent Unit (b-3-L)]

Examples of the constituent unit (b-3-L) include, for example, a constituent unit in which $R^{11b}$ in the aforementioned formula (b-S1) is substituted with a lactone-containing cyclic group. More specifically they include those represented by the following formulae (b-L1) to (b-L5).

[Chem. 26]

(b-L1)

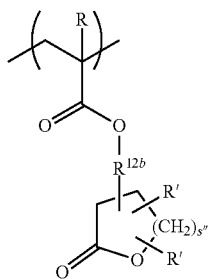

(b-L2)

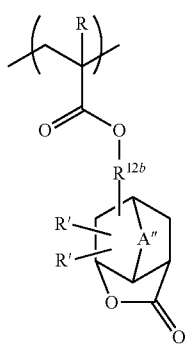

(b-L3)

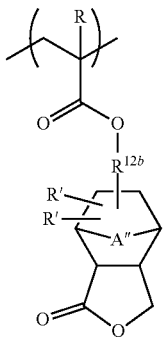

(b-L4)

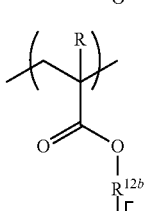

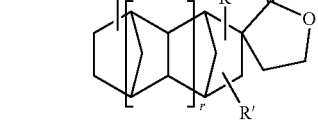

(b-L5)

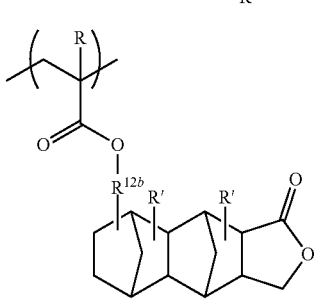

(In the formulae, R represents a hydrogen atom, an alkyl group having 1 or more and 5 or less carbon atoms or a halogenated alkyl group having 1 or more and 5 or less carbon atoms; R' represents each independently a hydrogen atom, an alkyl group, an alkoxy group, a halogenated alkyl group, a hydroxy group, —COOR", —OC(=O)R", a hydroxyalkyl group or a cyano group, and R" represents a hydrogen atom or an alkyl group; $R^{12b}$ represents a single bond or divalent linking group, and s" is an integer of 0 or more and 2 or less; A" represents an alkylene group having 1 or more and 5 or less carbon atoms optionally including an oxygen atom or a sulfur atom, an oxygen atom or a sulfur atom; and r is 0 or 1.)

R in the formulae (b-L1) to (b-L5) is the same as the above. Examples of the alkyl group, the alkoxy group, the halogenated alkyl group, —COOR", —OC(=O)R" and the hydroxyalkyl group in R' include groups similar to those described for the alkyl group, the alkoxy group, the halogenated alkyl group, —COOR", —OC(=O)R" and the hydroxyalkyl group recited as a substituent which the —SO₂— containing cyclic group may have, respectively.

R' is preferably a hydrogen atom in view of easy industrial availability and the like. The alkyl group in R" may be any of a linear, branched or cyclic chain. In a case where R" is a linear or branched alkyl group, the number of carbon atoms is preferably 1 or more and 10 or less, and more preferably 1 or more and 5 or less. In a case where R" is a cyclic alkyl group, the number of carbon atoms is preferably 3 or more and 15 or less, more preferably 4 or more and 12 or less, and most preferably 5 or more and 10 or less. Specific examples include a group in which one or more hydrogen atoms are removed from monocycloalkane and polycycloalkane such as bicycloalkane, tricycloalkane, tetracycloalkane and the like optionally substituted with a fluorine atom or a fluorinated alkyl group. Specific examples include a group in which one or more hydrogen atoms are removed from monocycloalkane such as cyclopentane and cyclohexane; and polycycloalkane such as adamantane, norbornane, isobornane, tricyclodecane and tetracyclododecane; and the like. Examples of A″ include groups similar to A′ in the aforementioned formula (3-1). A″ is preferably an alkylene group having 1 to 5 carbon atoms, an oxygen atom (—O—) or a sulfur atom (—S—), more preferably an alkylene group having 1 or more and 5 or less carbon atoms or —O—. As the alkylene group having 1 or more and 5 or less carbon atoms, a methylene group or a dimethylmethylene group is more preferred, and a methylene group is most preferred.

$R^{12b}$ is similar to $R^{12b}$ in the aforementioned formula (b-S1). In the formula (b-L1), s″ is preferably 1 or 2. Below, specific examples of the constituent units represented by the aforementioned formulae (b-L1) to (b-L3) will be illustrated. In each of the following formulae, R″ represents a hydrogen atom, a methyl group or a trifluoromethyl group.

[Chem. 27]

(b-L1-1)

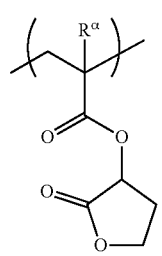

(b-L1-2)

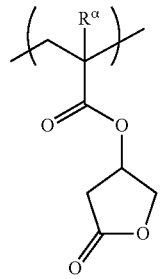

(b-L1-3)

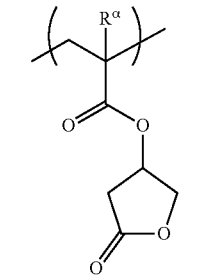

(b-L1-4)

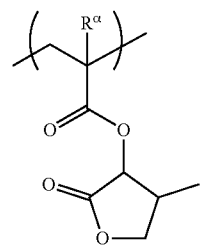

(b-L1-5)

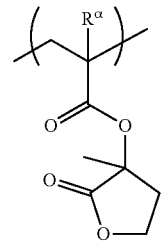

(b-L1-6)

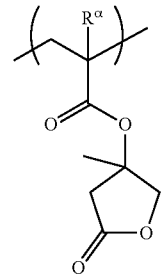

(b-L1-7)

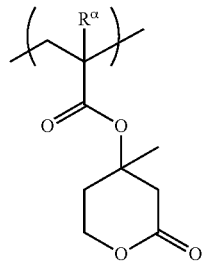

(b-L1-8)

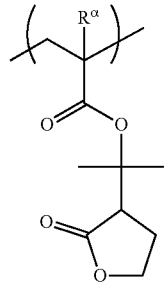

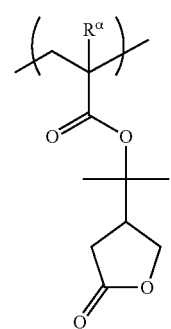
(b-L1-9)
(b-L1-10)
(b-L1-11)
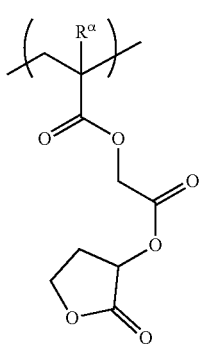
(b-L1-12)
(b-L1-13)
[Chem. 28]
(b-L2-1)
(b-L2-2)
(b-L2-3)

(b-L2-4)
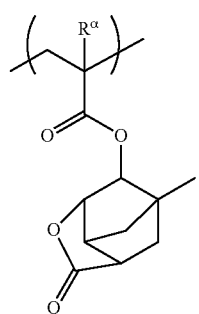
(b-L2-5)
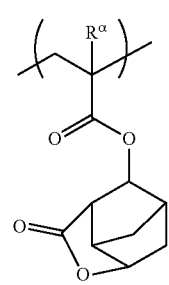
(b-L2-6)
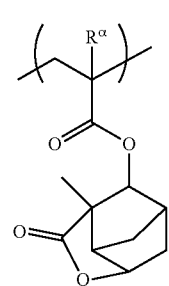
(b-L2-7)
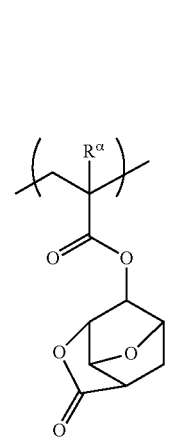
(b-L2-8)
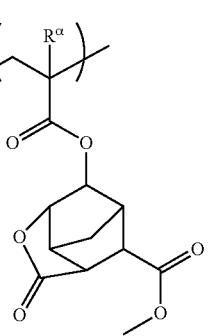
(b-L2-9)
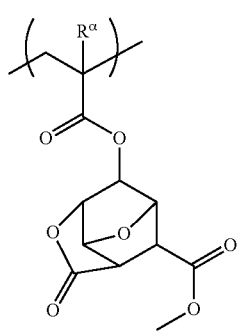
(b-L2-10)
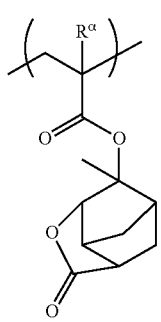
(b-L2-11)
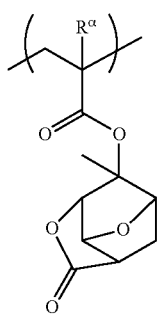
(b-L2-12)
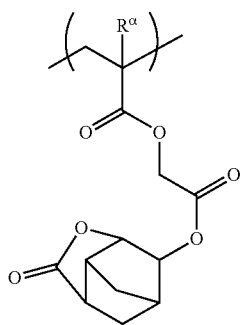

(b-L2-13)
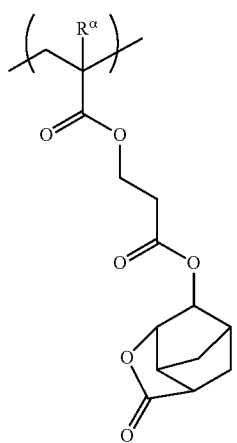
(b-L2-14)
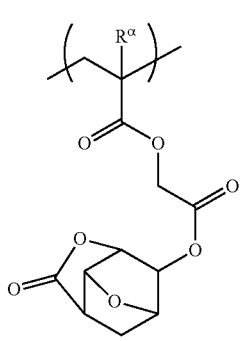
(b-L2-15)
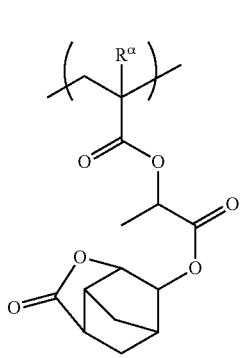
(b-L2-16)
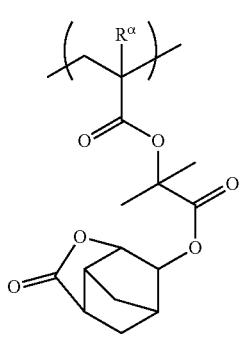
(b-L2-17)
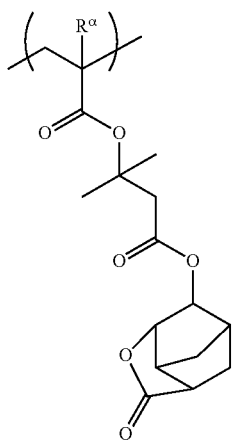
[Chem. 29]
(b-L3-1)
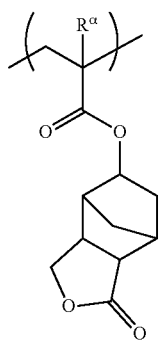
(b-L3-2)
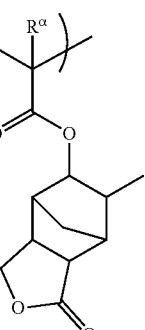
(b-L3-3)
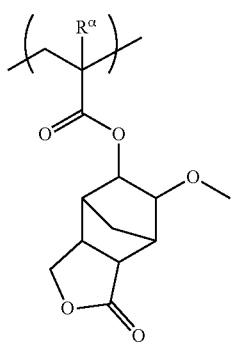

(b-L3-4)

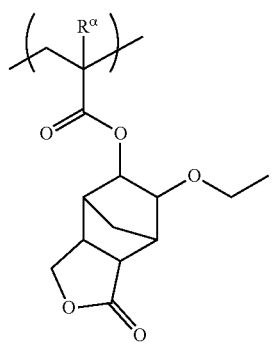

(b-L7)

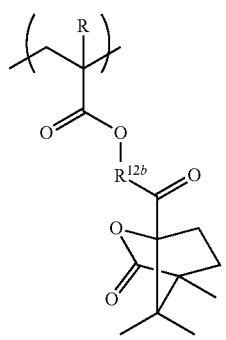

(b-L3-5)

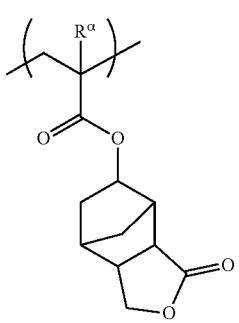

R and $R^{12b}$ in the formulae (b-L6) and (b-L7) are the same as the above.

Further, the acrylic resin (B3) includes constituent units represented by the following formulae (b5) to (b7), having an acid dissociable group, as constituent units that enhance the solubility of the acrylic resin (B3) in alkali under the action of acid.

As the constituent unit (b-3a-L), at least one selected from the group consisting of the constituent units represented by the aforementioned formulae (b-L1) to (b-L5) is preferred, and at least one selected from the group consisting of the constituent units represented by the formulae (b-L1) to (b-L3) is more preferred, and at least one selected from the group consisting of the constituent units represented by the aforementioned formula (b-L1) or (b-L3) is particularly preferred. Among these, at least one selected from the group consisting of the constituent units represented by the aforementioned formulae (b-L1-1), (b-L1-2), (b-L2-1), (b-L2-7), (b-L2-12), (b-L2-14), (b-L3-1) and (b-L3-5) is preferred.

Further, as the constituent unit (b-3-L), the constituent units represented by following formulae (b-L6) to (b-L7) are also preferred.

[Chem. 30]

[Chem. 31]

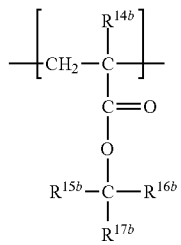

(b5)

(b-L6)

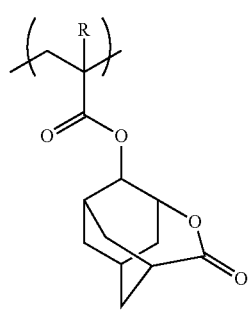

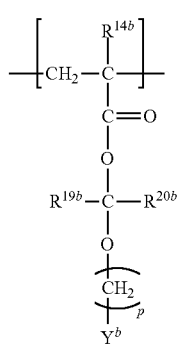

(b6)

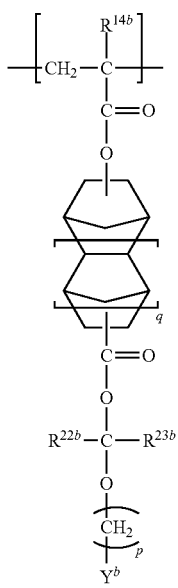

(b7)

In the above formulae (b5) to (b7), $R^{14b}$ and $R^{18b}$ to $R^{23b}$ each independently represent a hydrogen atom, a linear or branched alkyl group having 1 or more and 6 or less carbon atoms, a fluorine atom, or a linear or branched fluorinated alkyl group having 1 or more and 6 or less carbon atoms; $R^{15b}$ to $R^{17b}$ each independently represent a linear or branched alkyl group having 1 or more and 6 or less carbon atoms, a linear or branched fluorinated alkyl group having 1 or more and 6 or less carbon atoms, or an aliphatic cyclic group having 5 or more and 20 or less carbon atoms, and each independently represent a linear or branched alkyl group having 1 or more and 6 or less carbon atoms, or a linear or branched fluorinated alkyl group having 1 or more and 6 or less carbon atoms; and $R^{16b}$ and $R^{17b}$ may be bonded to each other to form a hydrocarbon ring having 5 or more and 20 or less carbon atoms together with the carbon atom to which both the groups are bonded; $Y^b$ represents an optionally substituted aliphatic group or alkyl group; p is an integer of 0 or more and 4 or less; and q is 0 or 1.

Note here that examples of the linear or branched alkyl group include a methyl group, ethyl group, propyl group, isopropyl group, n-butyl group, isobutyl group, tert-butyl group, pentyl group, isopentyl group, neopentyl group, and the like. Furthermore, the fluorinated alkyl group refers to the abovementioned alkyl groups of which the hydrogen atoms are partially or entirely substituted with fluorine atoms. Specific examples of aliphatic cyclic groups include groups obtained by removing one or more hydrogen atoms from monocycloalkanes or polycycloalkanes such as bicycloalkanes, tricycloalkanes, and tetracycloalkanes. Specifically, groups obtained by removing one hydrogen atom from a monocycloalkane such as cyclopentane, cyclohexane, cycloheptane, or cyclooctane, or a polycycloalkane such as adamantane, norbornane, isobornane, tricyclodecane, or tetracyclododecane may be mentioned. In particular, groups obtained by removing one hydrogen atom from cyclohexane or adamantane (which may further be substituted) are preferred.

When $R^{16b}$ and $R^{17b}$ do not combine with each other to form a hydrocarbon ring, the above $R^{15b}$, $R^{16b}$, and $R^{17b}$ preferably represent a linear or branched alkyl group having 2 or more and 4 or less carbon atoms, for example, from the viewpoints of a high contrast and favorable resolution and depth of focus. The above $R^{19b}$, $R^{20b}$, $R^{22b}$, and $R^{23b}$ preferably represent a hydrogen atom or a methyl group.

The above $R^{16b}$ and $R^{17b}$ may form an aliphatic cyclic group having 5 or more and 20 or less carbon atoms together with a carbon atom to which the both are attached. Specific examples of such an alicyclic group are the groups of monocycloalkanes and polycycloalkanes such as bicycloalkanes, tricycloalkanes and tetracycloalkanes from which one or more hydrogen atoms are removed. Specific examples thereof are the groups of monocycloalkanes such as cyclopentane, cyclohexane, cycloheptane and cyclooctane and polycycloalkanes such as adamantane, norbornane, isobornane, tricyclodecane and tetracyclododecane from which one or more hydrogen atoms are removed. Particularly preferable are the groups of cyclohexane and adamantane from which one or more hydrogen atoms are removed (that may further have a substituent).

Further, in a case where an aliphatic cyclic group to be formed with the above $R^{16b}$ and $R^{17b}$ has a substituent on the ring skeleton thereof, examples of the substituent include a polar group such as a hydroxy group, a carboxyl group, a cyano group and an oxygen atom (=O), and a linear or branched alkyl group having 1 or more and 4 or less carbon atoms. As the polar group, an oxygen atom (=O) is particularly preferred.

The above $Y^b$ is an alicyclic group or an alkyl group; and examples thereof are the groups of monocycloalkanes and polycycloalkanes such as bicycloalkanes, tricycloalkanes and tetracycloalkanes from which one or more hydrogen atoms are removed. Specific examples thereof are the groups of monocycloalkanes such as cyclopentane, cyclohexane, cycloheptane and cyclooctane, and polycycloalkanes such as adamantane, norbornane, isobornane, tricyclodecane and tetracyclododecane from which one or more hydrogen atoms are removed. Particularly preferable is the group of adamantane from which one or more hydrogen atoms are removed (that may further have a substituent).

When the alicyclic group of the above $Y^b$ has a substituent on the ring skeleton, the substituent is exemplified by polar groups such as a hydroxy group, carboxyl group, cyano group and oxygen atom (=O), and linear or branched alkyl groups having 1 or more and 4 or less carbon atoms. The polar group is preferably an oxygen atom (=O) in particular.

When $Y^b$ is an alkyl group, it is preferably a linear or branched alkyl group having 1 or more and 20 or less carbon atoms, and more preferably 6 or more and 15 or less carbon atoms. The alkyl group is an alkoxyalkyl group particularly preferable. Examples of such an alkoxyalkyl group include a 1-methoxyethyl group, 1-ethoxyethyl group, 1-n-propoxyethyl group, 1-isopropoxyethyl group, 1-n-butoxyethyl group, 1-isobutoxyethyl group, 1-tert-butoxyethyl group, 1-methoxypropyl group, 1-ethoxypropyl group, 1-methoxy-1-methylethyl group, 1-ethoxy-1-methylethyl group, and the like.

Preferable specific examples of the constituent unit represented by the above formula (b5) include constituent units represented by the following formulae (b5-1) to (b5-33).

[Chem. 32]
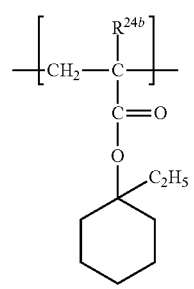 (b5-1)
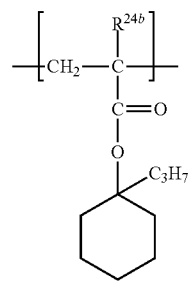 (b5-2)
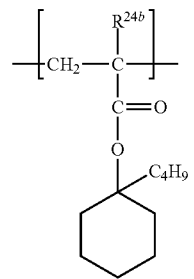 (b5-3)
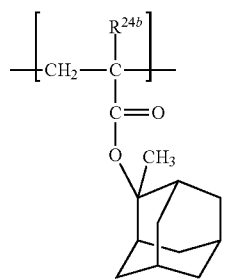 (b5-4)
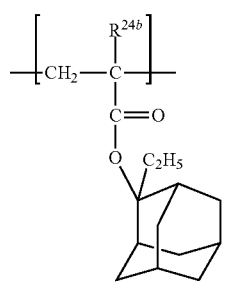 (b5-5)
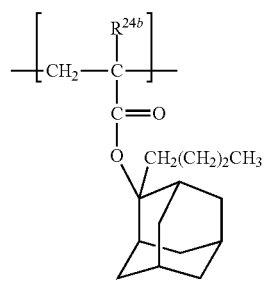 (b5-6)
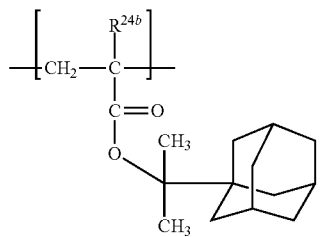 (b5-7)
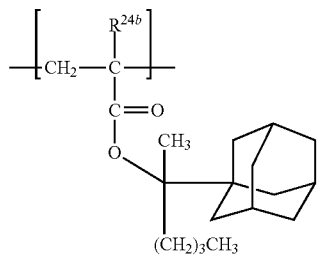 (b5-8)
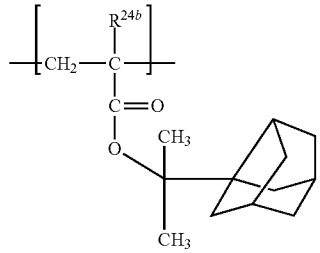 (b5-9)
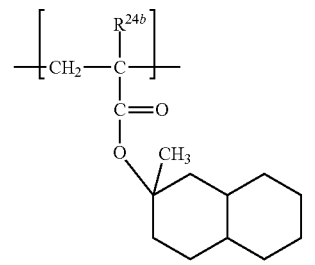 (b5-10)
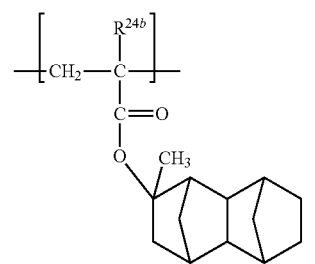 (b5-11)

(b5-12) 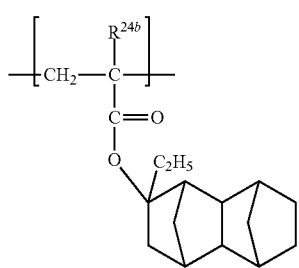
(b5-13) 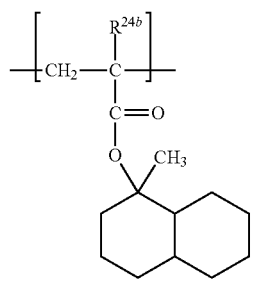
(b5-14) 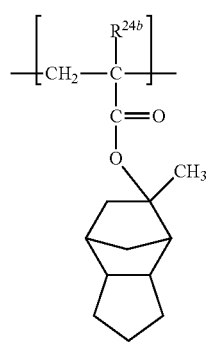
(b5-15) 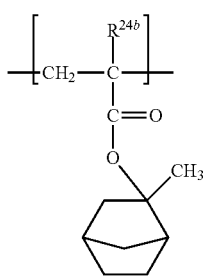
(b5-16) 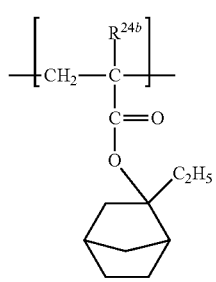
(b5-17) 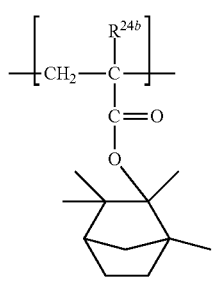
(b5-18) 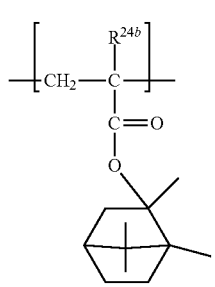
(b5-19) 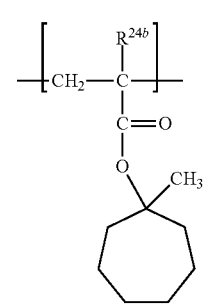
(b5-20) 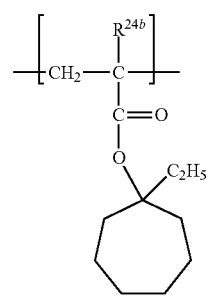
(b5-21) 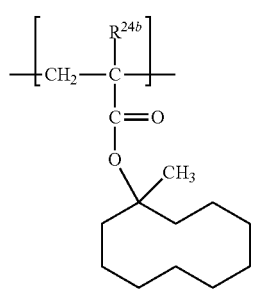

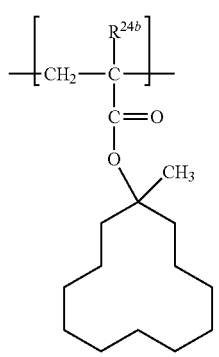 (b5-22)
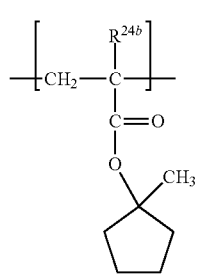 (b5-23)
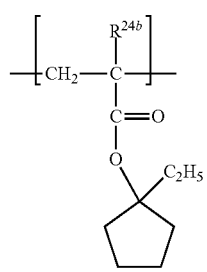 (b5-24)
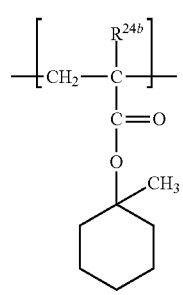 (b5-25)
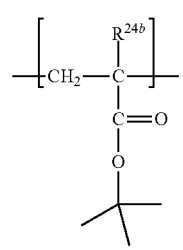 (b5-26)
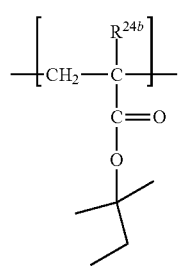 (b5-27)
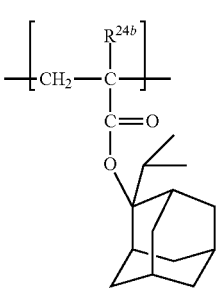 (b5-28)
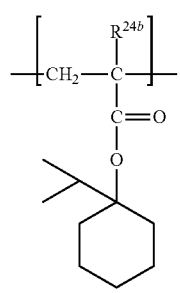 (b5-29)
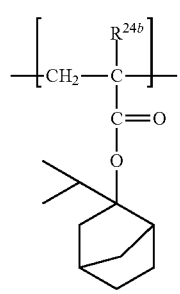 (b5-30)
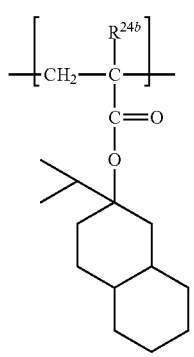 (b5-31)

(b5-32)
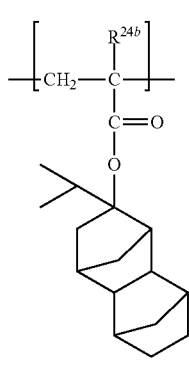
(b5-33)
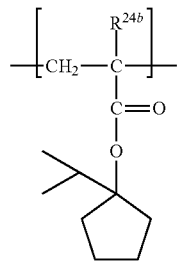
In the above formulae (b5-1) to (b5-33), $R^{24b}$ represents a hydrogen atom or a methyl group.
Preferable specific examples of the constituent unit represented by the above formula (b6) include constituent units represented by the following formulae (b6-1) to (b6-26)
[Chem. 33]
(b6-1)
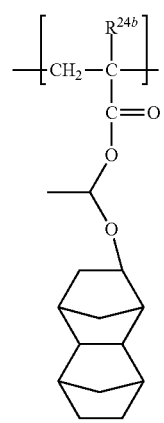
(b6-2)
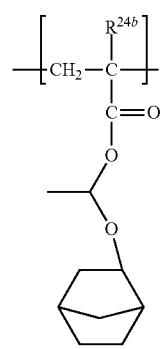
(b6-3)
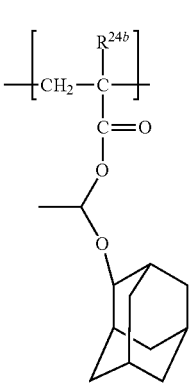
(b6-4)
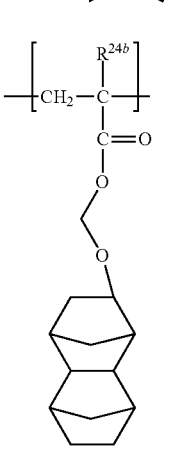
(b6-5)
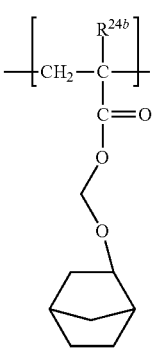
(b6-6)
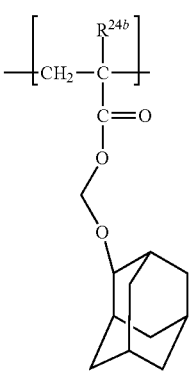

(b6-7) 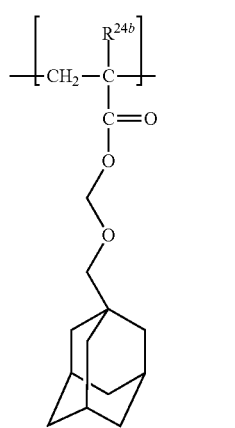
(b6-8) 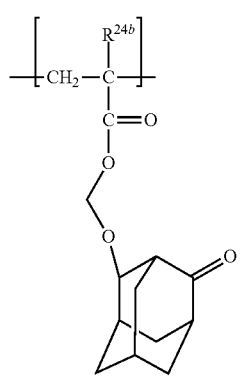
(b6-9) 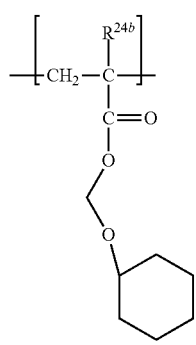
(b6-10) 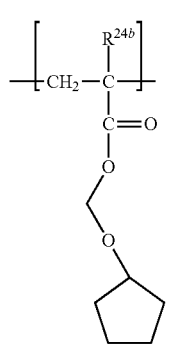
(b6-11) 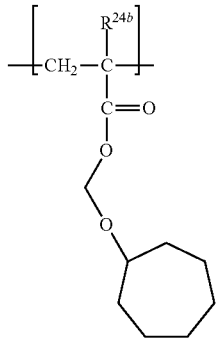
(b6-12) 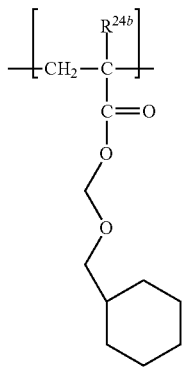
(b6-13) 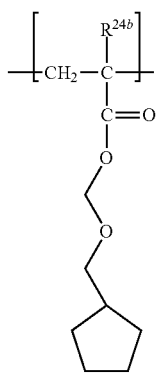
(b6-14) 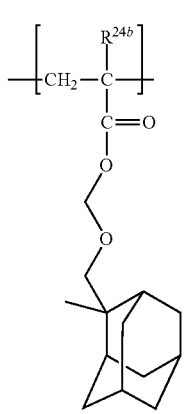

(b6-15) 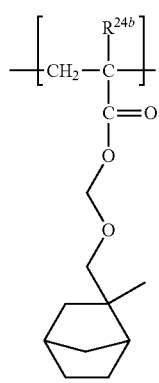
(b6-16) 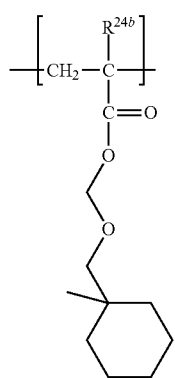
(b6-17) 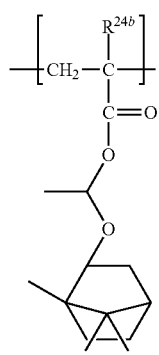
(b6-18) 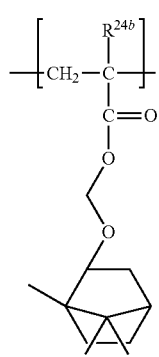
(b6-19) 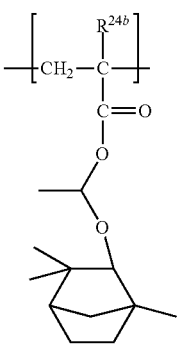
(b6-20) 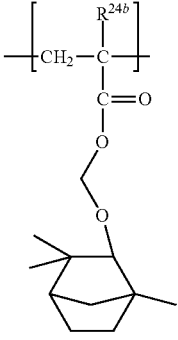
(b6-21) 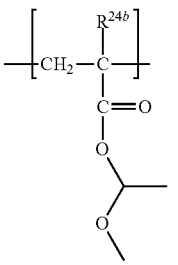
(b6-22) 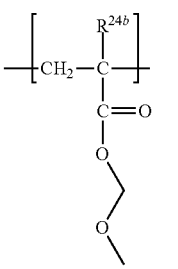
(b6-23) 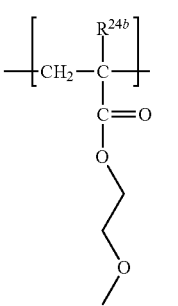

-continued
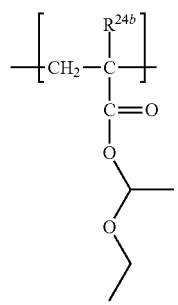
(b6-24)
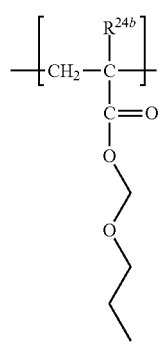
(b6-25)
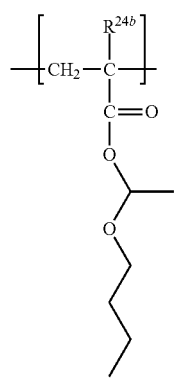
(b6-26)
[Chem. 34]
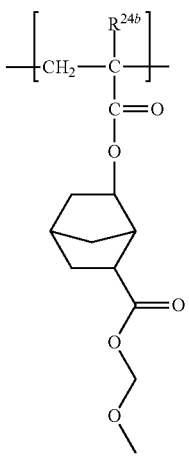
(b7-1)
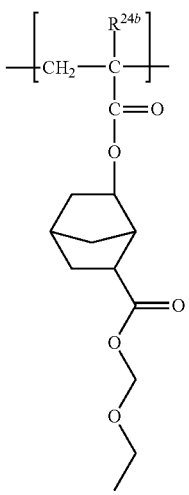
(b7-2)
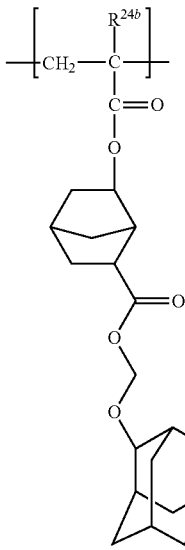
(b7-3)
In the above formulae (b6-1) to (b6-26), $R^{24b}$ represents a hydrogen atom or a methyl group.
Preferable specific examples of the constituent unit represented by the above formula (b7) include constituent units represented by the following formulae (b7-1) to (b7-15).

(b7-4)
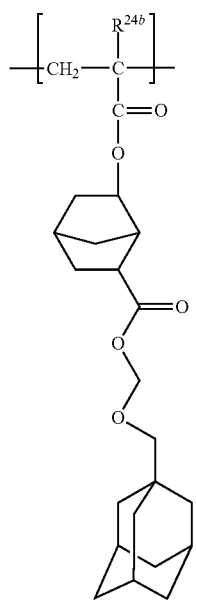
(b7-5)
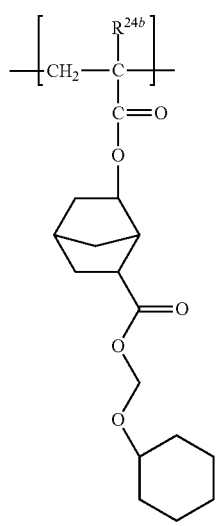
(b7-6)
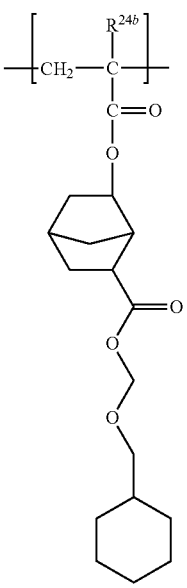
(b7-7)
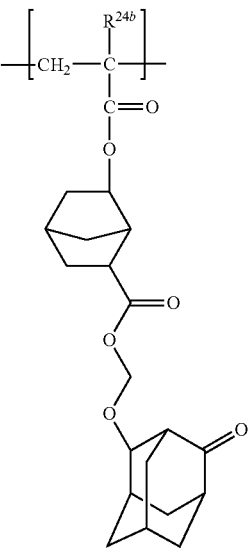

(b7-8)
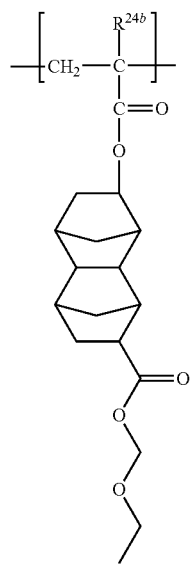
(b7-9)
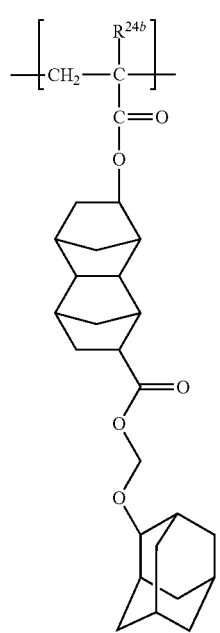
(b7-10)
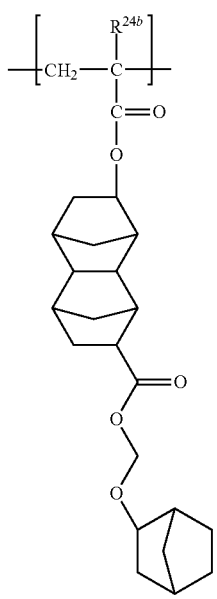
(b7-11)
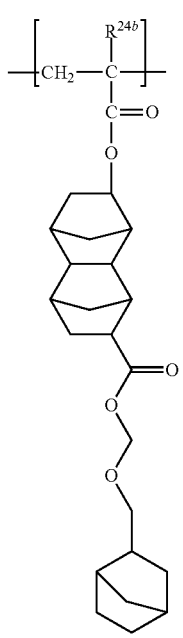

(b7-12) 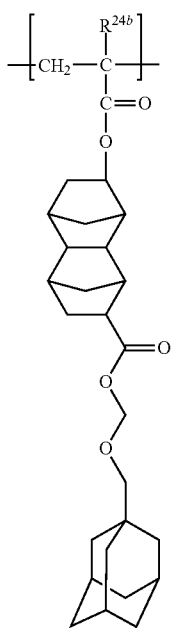

(b7-13) 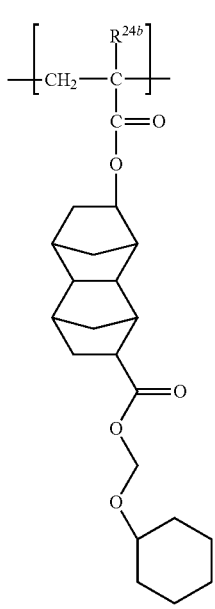

(b7-14) 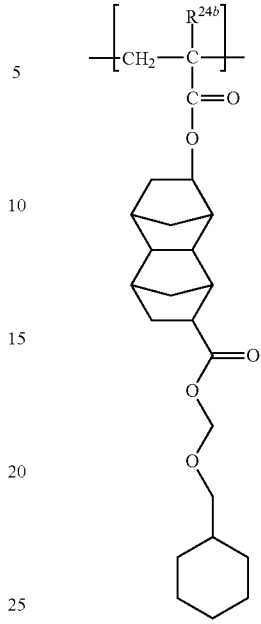

(b7-15) 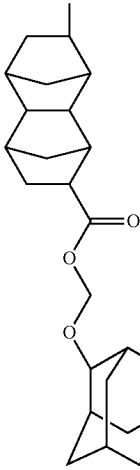

In the above formulae (b7-1) to (b7-15), $R^{24b}$ represents a hydrogen atom or a methyl group.

Among the constituent units represented by the formulae (b5) to (b7) described above, those represented by the formula (b6) are preferred in that they can be easily synthesized and relatively easily sensitized. Further, among the constituent units represented by the formula (b6), those in which $Y^b$ is an alkyl group are preferred, and those in which one or both of $R^{19b}$ and $R^{20b}$ are alkyl groups are preferred.

Further, the acrylic resin (B3) is preferably a resin including a copolymer including a constituent unit derived from a polymerizable compound having an ether bond together with a constituent unit represented by the above formulae (b5) to (b7).

Illustrative examples of the polymerizable compound having an ether bond include radical polymerizable compounds such as (meth)acrylic acid derivatives having an ether bond and an ester bond, and specific examples thereof include 2-methoxyethyl (meth)acrylate, 2-ethoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolyethylene glycol (meth)acrylate, methoxypolypropylene glycol (meth)acrylate, tetrahydrofurfuryl (meth)acrylate, and the like. Also, the above polymerizable compound having an ether bond is preferably, 2-methoxyethyl (meth) acrylate, 2-ethoxyethyl (meth)acrylate, or methoxytriethylene glycol (meth)acrylate. These polymerizable compounds may be used alone, or in combinations of two or more thereof.

Furthermore, the acrylic resin (B3) may include another polymerizable compound as a constituent unit in order to moderately control physical or chemical properties. The polymerizable compound is exemplified by conventional radical polymerizable compounds and anion polymerizable compounds.

Examples of the polymerizable compound include monocarboxylic acids such as acrylic acid, methacrylic acid and crotonic acid; dicarboxylic acids such as maleic acid, fumaric acid and itaconic acid; methacrylic acid derivatives having a carboxyl group and an ester bond such as 2-methacryloyloxyethyl succinic acid, 2-methacryloyloxyethyl maleic acid, 2-methacryloyloxyethyl phthalic acid, and 2-methacryloyloxyethyl hexahydrophthalic acid; (meth) acrylic acid alkyl esters such as methyl(meth)acrylate, ethyl (meth)acrylate, butyl(meth)acrylate and cyclohexyl(meth) acrylate; (meth)acrylic acid hydroxyalkyl esters such as 2-hydroxyethyl (meth)acrylate and 2-hydroxypropyl (meth) acrylate; (meth)acrylic acid aryl esters such as phenyl (meth) acrylate and benzyl (meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; amide bond-containing polymerizable compounds such as acrylamide and methacrylamide; and the like.

As described above, the acrylic resin (B3) may include a constituent unit derived from a polymerizable compound having a carboxy group such as the above monocarboxylic acids and dicarboxylic acids. However, it is preferable that the acrylic resin (B3) does not substantially include a constituent unit derived from a polymerizable compound having a carboxyl group, since a resist pattern including a nonresist portion having a favorable rectangular sectional shape can easily be formed. Specifically, the proportion of a constituent unit derived from a polymerizable compound having a carboxyl group in the acrylic resin (B3) is preferably 20% by mass or less, more preferably 15% by mass or less, and particularly preferably 5% by mass or less. In acrylic resin (B3), acrylic resin including a relatively large amount of constituent unit derived from a polymerizable compound having a carboxy group is preferably used in combination with an acrylic resin that includes only a small amount of constituent unit derived from a polymerizable compound having a carboxy group or does not include this constituent unit.

Furthermore, examples of the polymerizable compound include (meth)acrylic acid esters having a non-acid-dissociable aliphatic polycyclic group, and vinyl group-containing aromatic compounds and the like. As the non-acid-dissociable aliphatic polycyclic group, particularly, a tricyclodecanyl group, an adamantyl group, a tetracyclododecanyl group, an isobornyl group, a norbornyl group, and the like are preferred in view of easy industrial availability and the like. These aliphatic polycyclic groups may have a linear or branched alkyl group having 1 or more and 5 or less carbon atoms as a substituent.

Specific examples of the constituent units derived from the (meth)acrylic acid esters having a non-acid-dissociable aliphatic polycyclic group include constituent units having structures represented by the following formulae (b8-1) to (b8-5).

[Chem. 35]

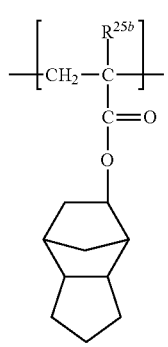

(b8-1)

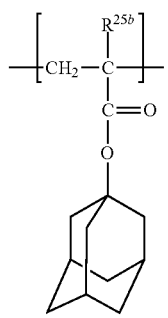

(b8-2)

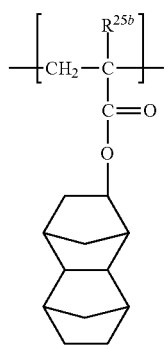

(b8-3)

-continued

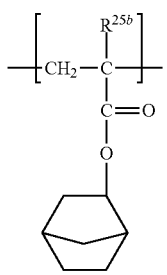
(b8-4)

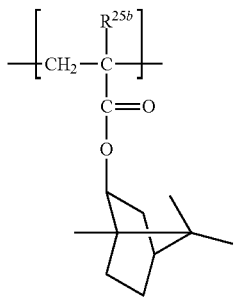
(b8-5)

In formulae (b8-1) to (b8-5), $R^{25b}$ represents a hydrogen atom or a methyl group.

When the acrylic resin (B3) includes the constituent unit (b-3) including a —SO$_2$-containing cyclic group or a lactone-containing cyclic group, the content of the constituent unit (b-3) in the acrylic resin (B3) is preferably 5% by mass or more, more preferably 10% by mass or more, and particularly preferably 10% by mass or more and 50% by mass or less, and most preferably 10% by mass or more and 30% by mass or less. In a case where the photosensitive resin composition includes the constituent unit (b-3) having the above-mentioned range of amount, both good developing property and a good pattern shape can be easily achieved simultaneously.

Further, in the acrylic resin (B3), a constituent unit represented by the aforementioned formulae (b5) to (b7) is preferably included in an amount of 5% by mass or more, more preferably 10% by mass or more, and particularly preferably 10% by mass or more and 50% by mass or less.

The acrylic resin (B3) preferably includes the above constituent unit derived from a polymerizable compound having an ether bond. The content of the constituent unit derived from a polymerizable compound having an ether bond in the acrylic resin (B3) is preferably 0% by mass or more and 50% by mass or less, more preferably 5% by mass or more and 30% by mass or less.

The acrylic resin (B3) preferably includes the above constituent unit derived from (meth)acrylic acid esters having a non-acid-dissociable aliphatic polycyclic group. The content of the constituent unit derived from (meth)acrylic acid esters having a non-acid-dissociable aliphatic polycyclic group in the acrylic resin (B3) is preferably 0% by mass or more and 50% by mass or less, and more preferably 5% by mass or more and 30% by mass or less.

As long as the photosensitive resin composition contains a predetermined amount of the acrylic resin (B3), an acrylic resin other than the acrylic resin (B3) described above can also be used as the resin (B). There is no particular limitation for such an acrylic resin other than the acrylic resin (B3) as long as it includes a constituent unit represented by the aforementioned formulae (b5) to (b7).

The mass-average molecular weight of the resin (B) described above in terms of polystyrene is preferably 10000 or more and 600000 or less, more preferably 20000 or more and 400000 or less, and even more preferably 30000 or more and 300000 or less. A mass-average molecular weight within these ranges allows a photosensitive resin layer to maintain sufficient strength without reducing detachability from a substrate, and can further prevent a swelled profile and crack generation when plating.

It is also preferred that the resin (B) has a dispersivity of 1.05 or more. Dispersivity herein indicates a value of a mass average molecular weight divided by a number average molecular weight. A dispersivity in the range described above can avoid problems with respect to stress resistance on intended plating or possible swelling of metal layers resulting from the plating process.

The content of the resin (B) is preferably 5% by mass or more and 60% by mass or less with respect to the total solid content of the photosensitive resin composition.

<Lewis Acidic Compound (C)>

It is also preferable that a photosensitive resin composition contains a Lewis acidic compound (C). When the photosensitive resin composition includes a Lewis acidic compound (C), a photosensitive resin composition with high sensitivity is easily obtained, so that a resist pattern whose cross-sectional shape is rectangular is easily formed using a photosensitive resin composition. Furthermore, when a pattern is formed using the photosensitive resin composition, when time required for each process at the time of pattern formation or time required between the processes is long, a pattern having a desired shape and dimension may not be easily formed, or developing property may be deteriorated. However, when a Lewis acidic compound (C) is blended into the photosensitive resin composition, such adverse effects on the pattern shape or the developing property can be mitigated or a process margin can be widened.

The Lewis acidic compound (C) herein represents "a compound that acts as an electron-pair receptor having an empty orbital capable of receiving at least one electron pair." The Lewis acidic compound (C) is not particularly limited as long as it corresponds to the above definition, and is a compound which is recognized as the Lewis acidic compound by a person skilled in the art. As the Lewis acidic compound (C), a compound that does not correspond to a Bronsted acid (proton acid) is preferably used. Specific examples of the Lewis acidic compound (C) include boron fluoride, ether complexes of boron fluoride (for example, BF$_3$.Et$_2$O, BF$_3$.Me$_2$O, BF$_3$.THF, etc., Et represents an ethyl group, Me represents a methyl group, and THF represents tetrahydrofuran), organic boron compounds (for example, tri-n-octyl borate, tri-n-butyl borate, triphenyl borate, triphenylboron, etc.), titanium chloride, aluminum chloride, aluminum bromide, gallium chloride, gallium bromide, indium chloride, thallium trifluoroacetate, tin chloride, zinc chloride, zinc bromide, zinc iodide, zinc trifluoromethanesulfonate, zinc acetate, zinc nitrate, zinc tetrafluoroborate, manganese chloride, manganese bromide, nickel chloride, nickel bromide, nickel cyanide, nickel acetylacetonate, cadmium chloride, cadmium bromide, stannous chloride, stannous bromide, stannous sulfate, stannous tartrate, and the like. Furthermore, other specific examples of the Lewis acidic compound (C) include chloride, bromide, sulfate, nitrate, carboxylate, or trifluoromethanesulfonate, of the rare earth metal element, and cobalt chloride, ferrous chloride, yttrium chloride, and the like. Examples of the rare earth metal element herein include lanthanum, cerium, praseodymium, neodymium, samarium, europium, gadolinium, terbium, dysprosium, holmium, erbium, thulium, ytterbium, and lutetium.

From the viewpoint of easiness in availability and good effect by addition thereof, it is preferable that the Lewis acidic compound (C) contains a Lewis acidic compound including elements belonging to Group 13. Herein, examples of the elements belonging to Group 13 include boron, aluminum, gallium, indium, and thallium. Among the above elements belonging to Group 13, boron is preferable from the viewpoint that the Lewis acidic compound (C) is easily available and addition effect is particularly excellent. In other words, it is preferable that the Lewis acidic compound (C) contains a Lewis acidic compound including boron.

Examples of the Lewis acidic compound containing boron include boron fluoride, ether complexes of boron fluoride, boron halides such as boron chloride and boron bromide, and various organic boron compounds. As the Lewis acidic compound including boron, an organic boron compound is preferable because the content ratio of halogen atoms in the Lewis acidic compound is small and the photosensitive resin composition is easily applicable to an application requiring a low halogen content.

Preferable examples of the organic boron compound include a boron compound represented by the following formula (c1):

$$B(R^{c1})_{n1}(OR^{c2})_{(3-n1)} \quad (c1)$$

(In the formula (c1), $R^{c1}$ and $R^{c2}$ each independently represent a hydrocarbon group having 1 or more and 20 or less carbon atoms; the hydrocarbon group may have one or more substituents; n1 is an integer of 0 to 3; when a plurality of $R^{c1}$ exists, two of the plurality of $R^{c1}$ may be bonded to each other to form a ring; and when a plurality of $OR^2$ is present, two of the plurality of $OR^2$ may be bonded to each other to form a ring).

The photosensitive resin composition preferably includes one or more boron compounds represented by the above formula (c1) as the Lewis acidic compound (C) mentioned above.

In the formula (c1), $R^{c1}$ and $R^{c2}$ are a hydrocarbon group, the number of carbon atoms of the hydrocarbon group is 1 or more and 20 or less. The hydrocarbon group having 1 or more and 20 or less carbon atoms may be an aliphatic hydrocarbon group, or an aromatic hydrocarbon group, a hydrocarbon group having a combination of an aliphatic group and an aromatic group. As the hydrocarbon group having 1 or more and 20 or less carbon atoms, a saturated aliphatic hydrocarbon group, or an aromatic hydrocarbon group is preferable. The number of carbon atoms of the hydrocarbon group as $R^{c1}$ and $R^{C2}$ is preferably 1 or more and 10 or less. When the hydrocarbon group is an aliphatic hydrocarbon group, the number of carbon atoms thereof is preferably 1 or more and 6 or less, and particularly preferably 1 or more and 4 or less. The hydrocarbon group as $R^{c1}$ and $R^{c2}$ may be a saturated hydrocarbon group, or an unsaturated hydrocarbon group, and a saturated hydrocarbon group is preferable. When the hydrocarbon group as $R^{c1}$ and $R^{c2}$ is an aliphatic hydrocarbon group, the aliphatic hydrocarbon group may be linear, branched or cyclic or combination thereof.

Suitable specific examples of aromatic hydrocarbon groups include a phenyl group, a naphthalene-1-yl group, a naphthalene-2-yl group, a 4-phenylphenyl, 3-phenylphenyl, and 2-phenylphenyl. Among them, a phenyl group is preferable.

The saturated aliphatic hydrocarbon group is preferably an alkyl group. Suitable examples of alkyl groups include a methyl group, an ethyl group, an n-propyl group, an isopropyl group, an n-butyl group, an isobutyl group, a sec-butyl group, a tert-butyl group, an n-pentyl group, an n-hexyl group, an n-heptyl group, an n-octyl group, a 2-ethyl hexyl group, an n-nonyl group, and an n-decyl group.

The hydrocarbon group as $R^{c1}$ and $R^{c2}$ may have one or more substituents. Examples of the substituent include a halogen atom, a hydroxyl group, an alkyl group, an aralkyl group, an alkoxy group, a cycloalkyloxy group, an aryloxy group, an aralkyloxy group, an alkylthio group, a cycloalkylthio group, an arylthio group, an aralkylthio group, an acyl group, an acyloxy group, an acylthio group, an alkoxycarbonyl group, a cycloalkyloxycarbonyl group, an aryloxycarbonyl group, an amino group, an N-monosubstituted amino group, an N,N-disubstituted amino group, a carbamoyl group (—CO—NH$_2$), an N-monosubstituted carbamoyl group, an N,N-disubstituted carbamoyl group, a nitro group and a cyano group. The number carbon atoms in the substituent is not particularly limited within a range where the objects of the present invention are not impaired, but the number is preferably 1 or more and 10 or less, and more preferably 1 or more and 6 or less.

Suitable specific examples of the organic boron compound represented by the above formula (c1) include the following compounds. Note here that in the following formulae, Pen represents a pentyl group, Hex represents a hexyl group, Hep represents a heptyl group, Oct represents an octyl group, Non represents a nonyl group, and Dec represents a decyl group.

[Chem. 36]

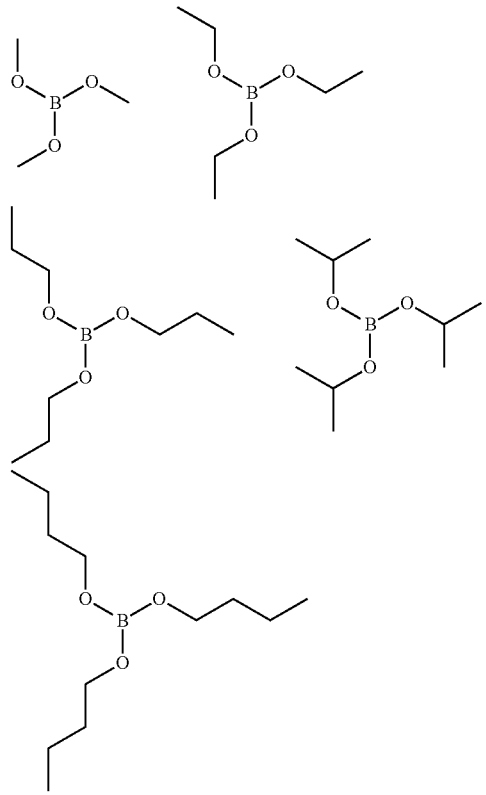

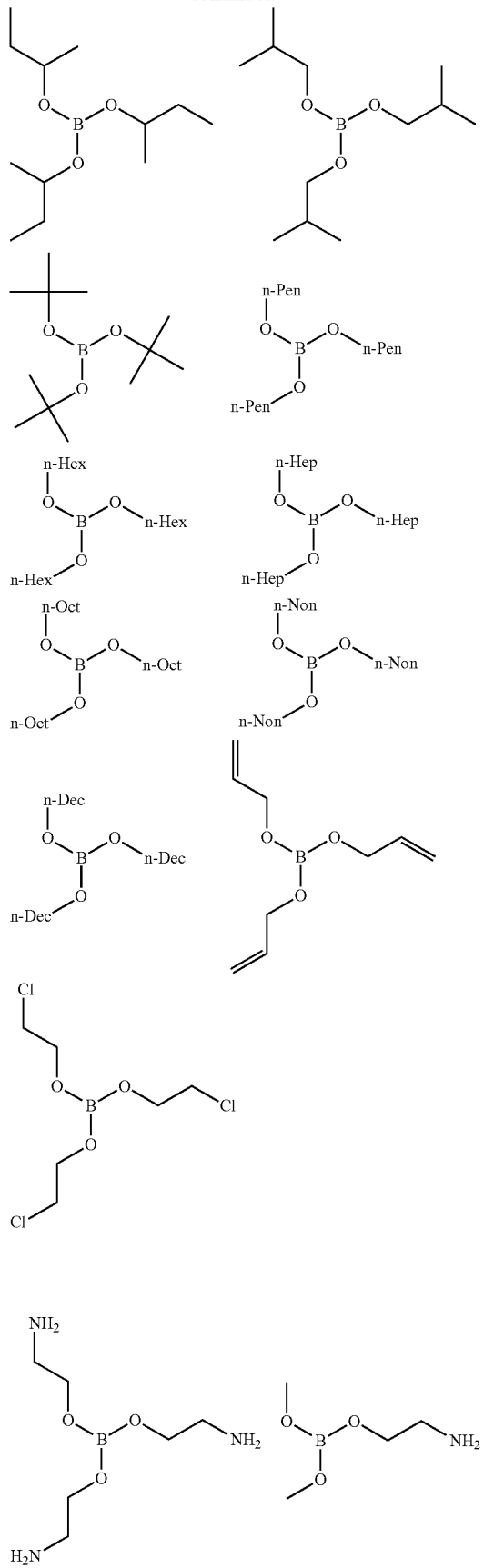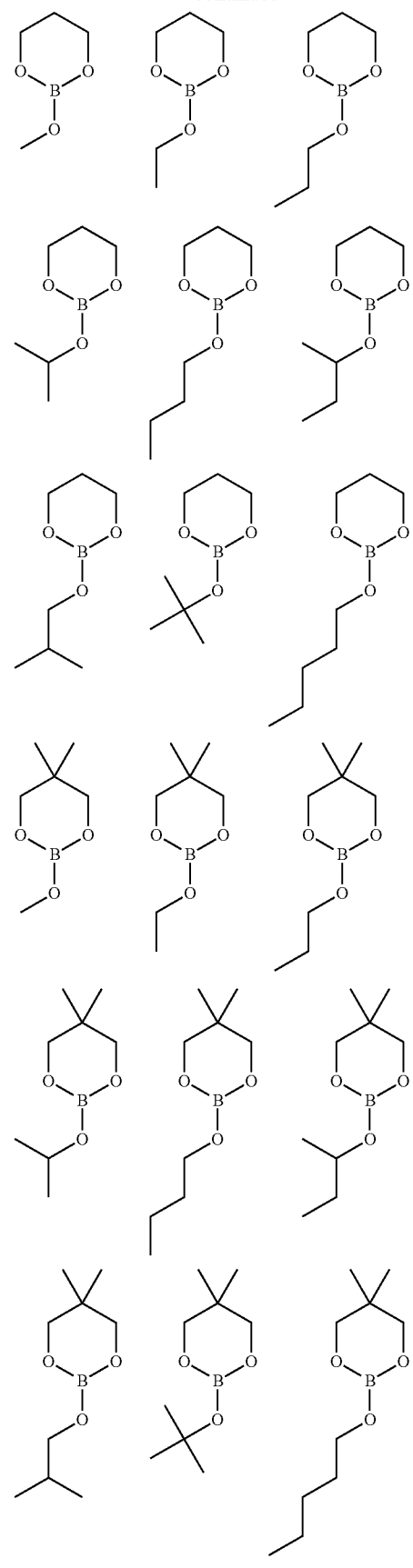

-continued
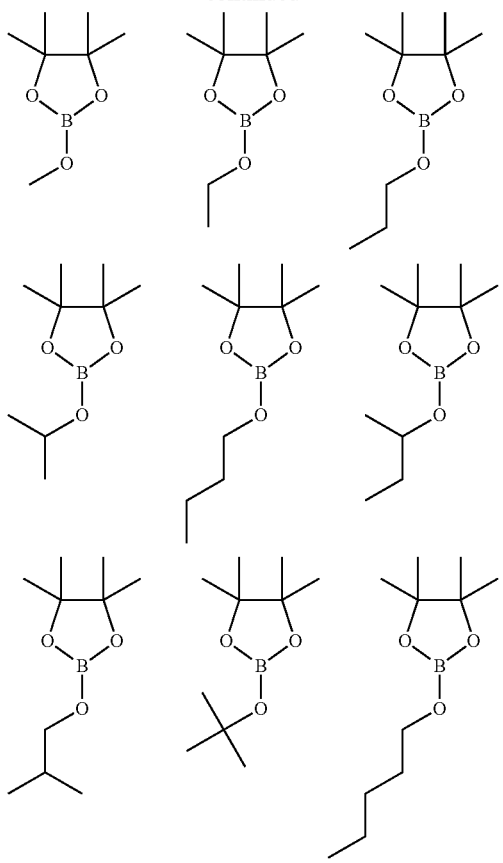
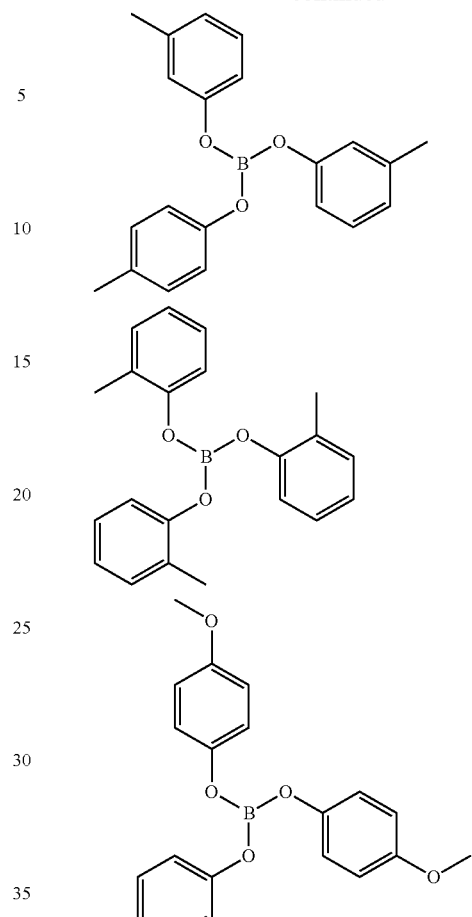
[Chem. 37]
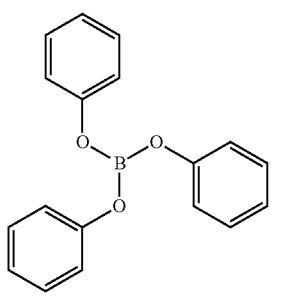
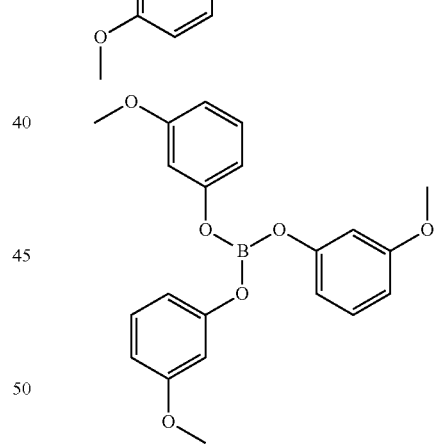
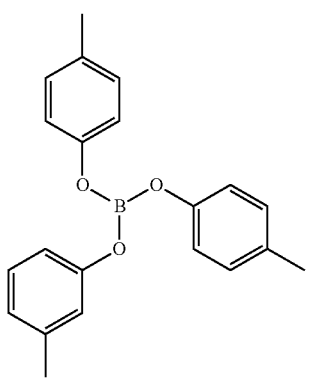
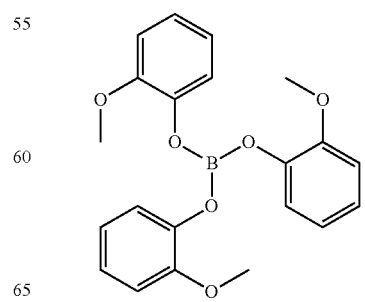

[Chem. 38]
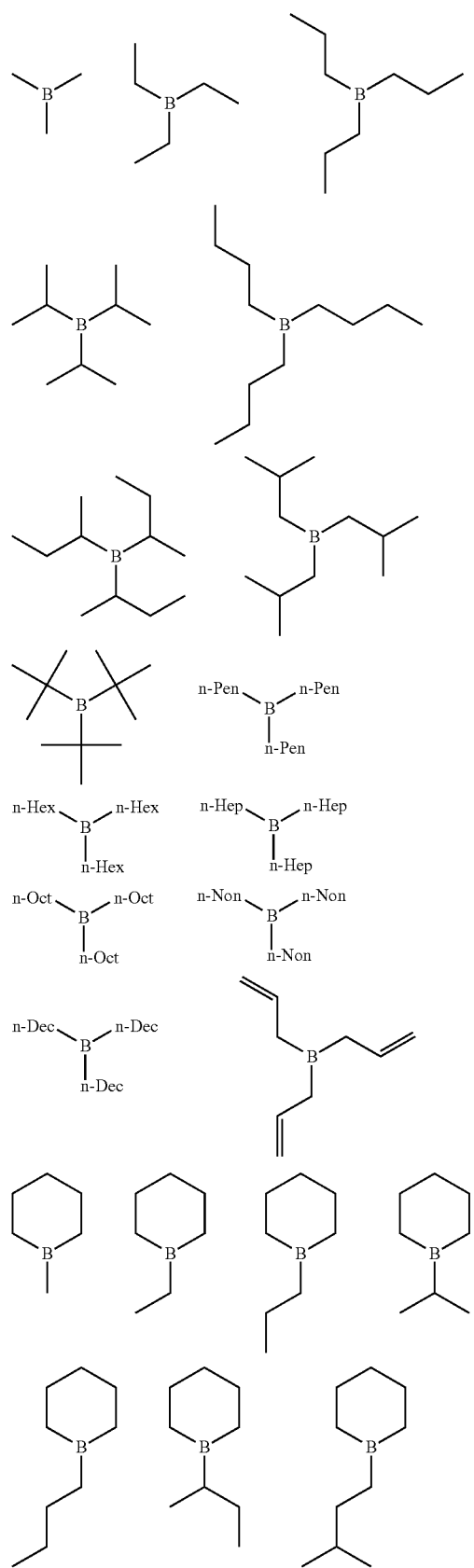
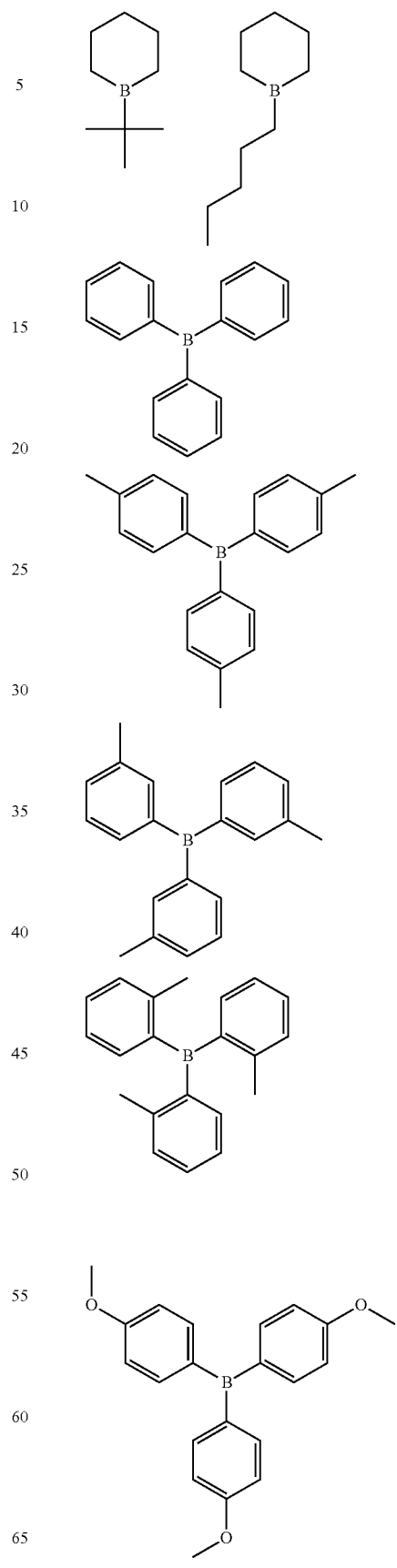

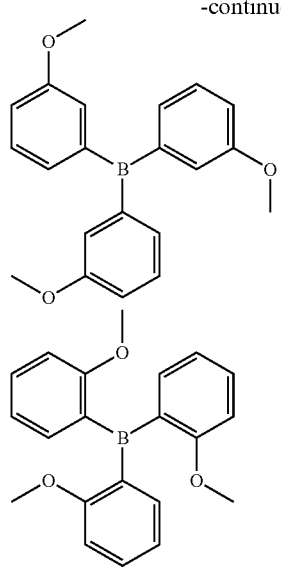
[Chem. 39]
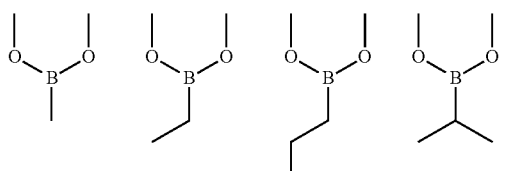
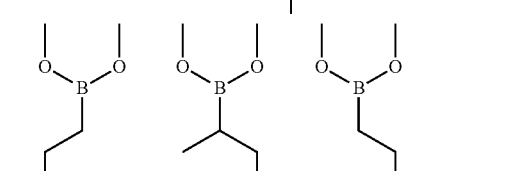
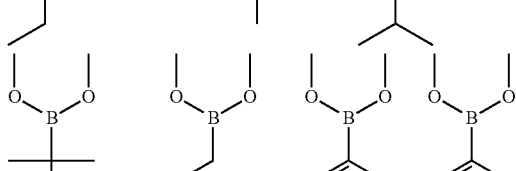
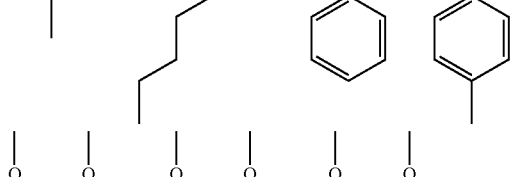
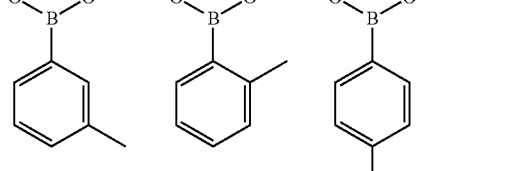
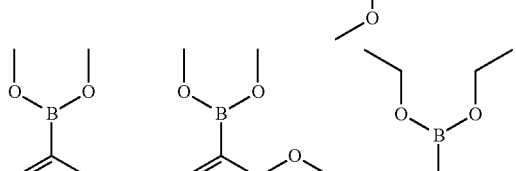
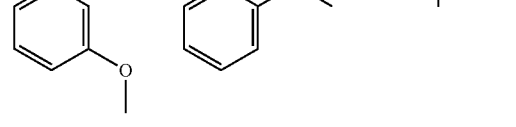
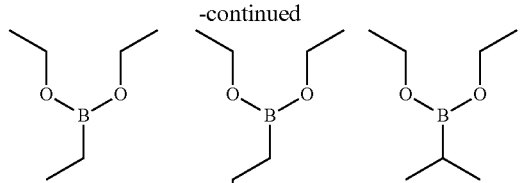
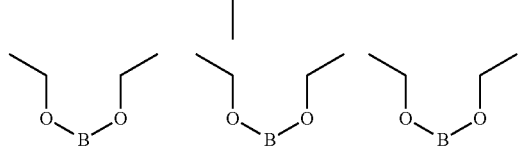
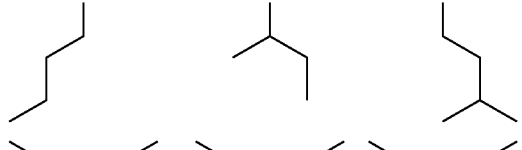
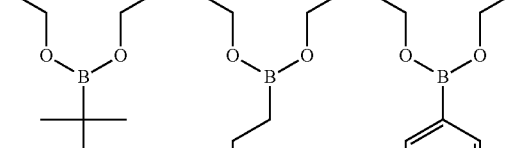
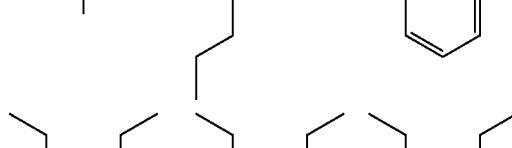
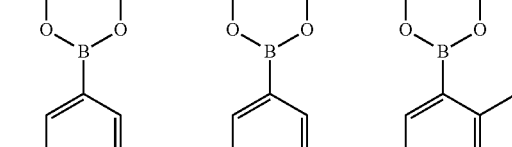
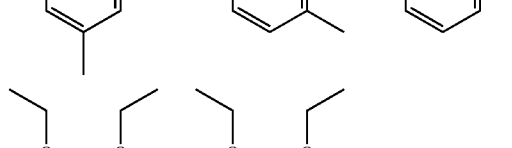
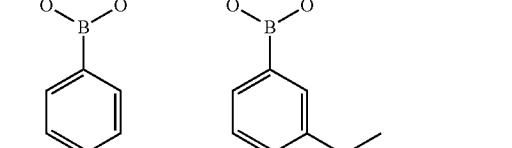
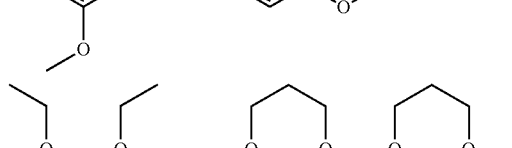
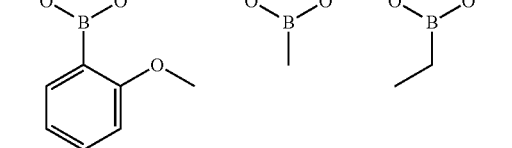
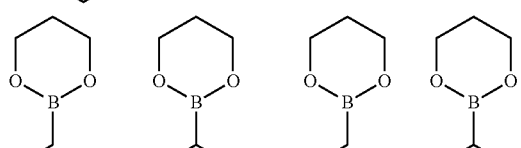

81
-continued
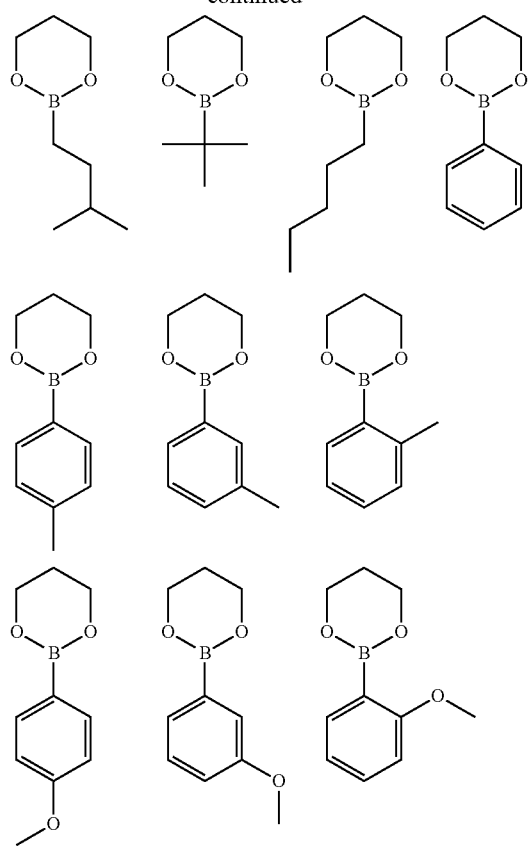
[Chem. 40]
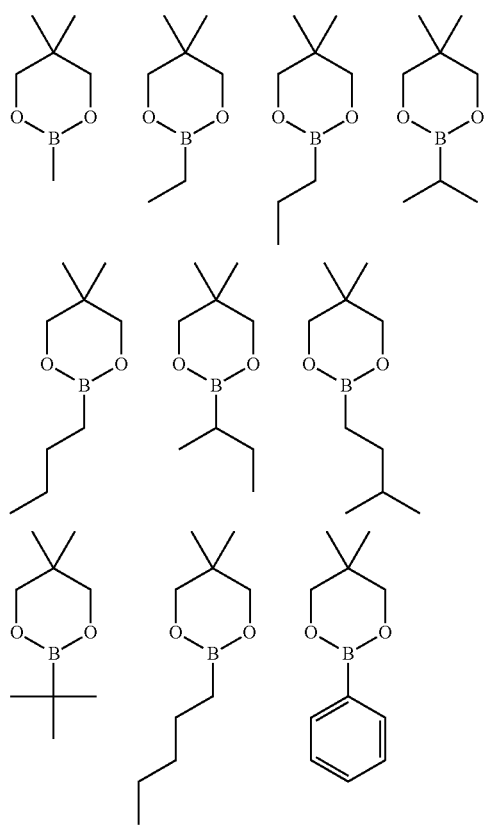
82
-continued
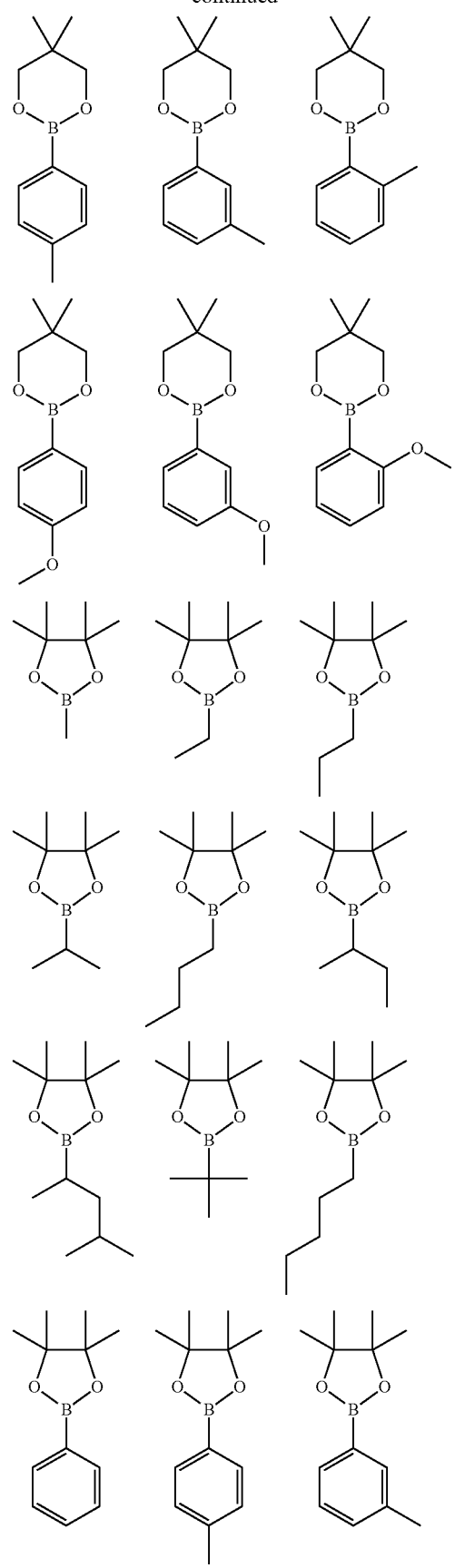

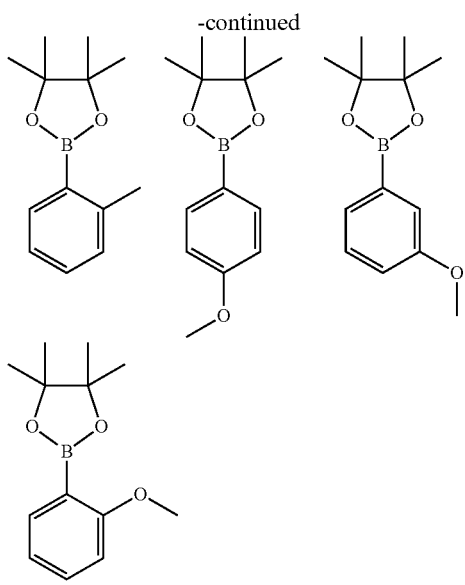

The Lewis acidic compound (C) is used in the amount in a range of preferably 0.01 parts by mass or more and 5 parts by mass or less, more preferably 0.01 parts by mass or more and 3 parts by mass or less, further preferably 0.05 part by mass or more and 2 parts by mass or less, relative to 100 parts by mass of the total mass of the above resin (B) and an alkali soluble resin (D) mentioned later.

<Alkali-Soluble Resin (D)>

It is preferred that the photosensitive resin composition further contains an alkali-soluble resin (D) in order to improve crack resistance. However, when the photosensitive resin composition excessively includes an alkali soluble resin (D), the above-described photosensitive resin composition satisfying the aforementioned [Requirement 1] may not be easily prepared. From this point, it is preferable that an alkali soluble resin (D) in the photosensitive resin composition is not included, or a blending amount is limited. The alkali-soluble resin as referred to herein may be determined as follows. A solution of the resin having a resin concentration of 20% by mass (solvent: propylene glycol monomethyl ether acetate) is used to form a resin film having a thickness of 1 μm on a substrate, and immersed in an aqueous 2.38% by mass TMAH (tetramethylammonium hydroxide) solution for 1 min. When the resin was dissolved in an amount of 0.01 μm or more, the resin is defined as being alkali soluble. As the alkali-soluble resin (D), preferably, for example, at least one selected from the group consisting of novolak resin (D1), polyhydroxystyrene resin (D2), and acrylic resin (D3), can be used.

In particular, when the novolac resin (D1), and/or the polyhydroxystyrene resin (D2) is used as the alkali soluble resin (D), the photosensitive resin composition satisfying the aforementioned [Requirement 1] may not be easily prepared. Therefore, the use amount of the novolac resin (D1), and/or the polyhydroxystyrene resin (D2) is preferably 0 parts by mass or more and 20 parts by mass or less, more preferably 0 parts by mass or more 15 parts by mass or less, further preferably 0 parts by mass or more 10 parts by mass or less, and particularly preferably 0 parts by mass or more 5 parts by mass or less when the total of the above resin (B) and the alkali soluble resin (D) is 100 parts by mass. When the use amount of the novolac resin (D1) and/or the polyhydroxystyrene resin is small as mentioned above, the photosensitive resin composition satisfying the aforementioned [Requirement 1] is easily obtained.

[Novolak Resin (D1)]

A novolak resin is prepared by addition condensation of, for example, aromatic compounds having a phenolic hydroxy group (hereinafter, merely referred to as "phenols") and aldehydes in the presence of an acid catalyst.

Examples of the above phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethyl phenol, 3,4,5-trimethyl phenol, p-phenylphenol, resorcinol, hydroquinone, hydroquinone monomethyl ether, pyrogallol, phloroglycinol, hydroxydiphenyl, bisphenol A, gallic acid, gallic acid ester, α-naphthol, β-naphthol, and the like. Examples of the above aldehydes include formaldehyde, furfural, benzaldehyde, nitrobenzaldehyde, acetaldehyde, and the like. The catalyst used in the addition condensation reaction is not particularly limited, and examples thereof include hydrochloric acid, nitric acid, sulfuric acid, formic acid, oxalic acid, acetic acid, etc., for acid catalyst.

The flexibility of the novolak resins can be enhanced more when o-cresol is used, a hydrogen atom of a hydroxyl group in the resins is substituted with other substituents, or bulky aldehydes are used.

The mass average molecular weight of novolac resin (D1) is not particularly limited as long as the purpose of the present invention is not impaired, but the mass average molecular weight is preferably 1,000 or more and 50,000 or less.

[Polyhydroxystyrene Resin (D2)]

The hydroxystyrene compound to constitute the polyhydroxystyrene resin (D2) is exemplified by p-hydroxystyrene, α-methylhydroxystyrene, α-ethylhydroxystyrene, and the like. Furthermore, the polyhydroxystyrene resin (D2) is preferably prepared to give a copolymer with a styrene resin. Examples of the styrene compound to constitute such a styrene resin include styrene, chlorostyrene, chloromethylstyrene, vinyltoluene, α-methylstyrene, and the like.

The mass average molecular weight of the polyhydroxystyrene resin (D2) is not particularly limited as long as the purpose of the present invention is not impaired, but the mass average molecular weight is preferably 1,000 or more and 50,000 or less.

[Acrylic Resin (D3)]

It is preferable that the acrylic resin (D3) includes a constituent unit derived from a polymerizable compound having an ether bond and a constituent unit derived from a polymerizable compound having a carboxyl group.

Examples of the above polymerizable compound having an ether bond include (meth)acrylic acid derivatives having an ether bond and an ester bond such as 2-methoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolypropylene glycol (meth)acrylate, tetrahydrofurfuryl (meth)acrylate, and the like. The above polymerizable compound having an ether bond is preferably, 2-methoxyethyl acrylate, and methoxytriethylene glycol acrylate. These polymerizable compounds may be used alone, or in combinations of two or more.

Examples of the above polymerizable compound having a carboxy group include monocarboxylic acids such as acrylic acid, methacrylic acid and crotonic acid; dicarboxylic acids such as maleic acid, fumaric acid and itaconic acid; compounds having a carboxy group and an ester bond such as 2-methacryloyloxyethyl succinic acid, 2-methacryloyloxyethyl maleic acid, 2-methacryloyloxyethyl phthalic acid, 2-methacryloyloxyethyl hexahydrophthalic acid and the like. The above polymerizable compound having a carboxy group is preferably, acrylic acid and methacrylic acid. These polymerizable compounds may be used alone, or in combinations of two or more thereof.

The mass average molecular weight of the acrylic resin (D3) is not particularly limited as long as the purpose of the present invention is not impaired, but the mass average molecular weight is preferably 50,000 or more and 800,000 or less.

The content of the alkali-soluble resin (D) is such that when the total amount of the above resin (B) and the alkali-soluble resin (D) is taken as 100 parts by mass, the content is preferably 0 parts by mass or more and 80 parts by mass or less, and more preferably 0 parts by mass or more and 60 parts by mass or less. By setting the content of the alkali-soluble resin (D) to the range described above, there is a tendency for resistance to cracking to increase, and film loss at the time of development can be prevented.

<Sulfur-Containing Compound (E)>

A photosensitive resin composition preferably includes a sulfur-containing compound (E). The sulfur-containing compound (E) is a compound including a sulfur atom that can coordinate with metal. Note here that in a compound that can generate two or more tautomers, at least one tautomer includes a sulfur atom that coordinates with metal constituting a metal layer, the compound corresponds to a sulfur-containing compound. When a resist pattern serving as a template for plating is formed on a surface made of metal such as Cu, defectives such as footing having a cross-sectional shape easily occur. However, when the photosensitive resin composition includes a sulfur-containing compound (E), even when a resist pattern is formed on a surface made of metal in a substrate, defectives such as footing having a cross-sectional shape is easily suppressed.

The sulfur atom that can coordinate with metal is included in a sulfur-containing compound as, for example, a mercapto group (—SH), a thiocarboxy group (—CO—SH), a dithiocarboxy group (—CS—SH), a thiocarbonyl group (—CS—), and the like. From the viewpoint of easiness in coordinating with metal and being excellent in suppressing footing, the sulfur-containing compound preferably includes a mercapto group.

Preferable examples of the sulfur-containing compound having a mercapto group include compounds represented by the following formula (e1).

[Chem. 41]

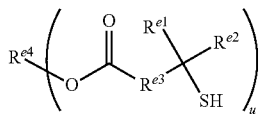

(e1)

(In the formula, $R^{e1}$ and $R^{e2}$ each independently represent a hydrogen atom or an alkyl group, $R^{e3}$ represents a single bond or an alkylene group, $R^{e4}$ represents a u-valence aliphatic group which may include an atom other than carbon, and u is an integer of 2 or more and 4 or less.)

$R^{e1}$ and $R^{e2}$ are an alkyl group, the alkyl group may be linear or branched, and is preferably linear. When $R^{e1}$ and $R^{e2}$ are an alkyl group, the number of carbon atoms of the alkyl group is not particularly limited within a range where the objects of the present invention are not impaired. The number of carbon atoms of the alkyl group is preferably 1 or more and 4 or less, particularly preferably 1 or 2, and the most preferably 1. As the combination of $R^{e1}$ and $R^{e2}$, preferably, one is a hydrogen atom and the other is an alkyl group, and particularly preferably one is a hydrogen atom and the other is a methyl group.

When $R^{e3}$ is an alkylene group, the alkylene group may be linear or branched, and is preferably linear. When $R^{e3}$ is an alkylene group, the number of carbon atoms of the alkylene group is not particularly limited within a range where the objects of the present invention are not impaired. The number of carbon atoms of the alkylene group is preferably 1 or more and 10 or less, more preferably 1 or more and 5 or less, particularly preferably 1 or 2, and the most preferably 1.

$R^{e4}$ is an aliphatic group having two or more and four or less valences and which may include an atom other than carbon atom. Examples of the atoms which may be included in $R^{e4}$ include a nitrogen atom, an oxygen atom, a sulfur atom, a fluorine atom, a chlorine atom, a bromine atom, an iodine atom, and the like. A structure of the aliphatic group as $R^{e4}$ may be linear or branched, or may be cyclic, and a structure combining these structures.

Among the compounds represented by the formula (e1), a compound represented by the following formula (e2) is more preferable.

[Chem. 42]

(e2)

(In the formula (e2), $R^{e4}$ and u are the same as those in the formula (e1).)

Among the compounds represented by the above formula (e2), the following compounds are preferable.

[Chem. 43]

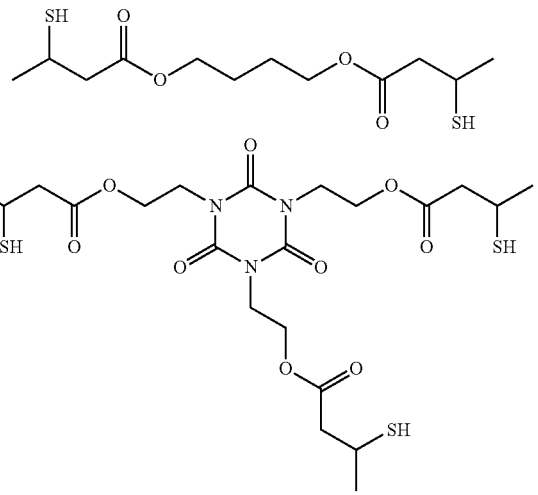

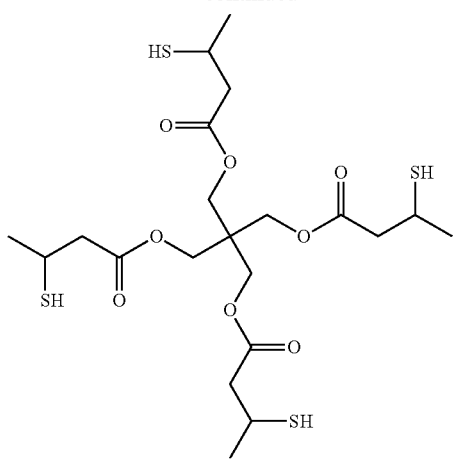

Compounds represented by the following formulae (e3-L1) to (e3-L7) are also preferable examples as the sulfur-containing compound having a mercapto group.

[Chem. 44]

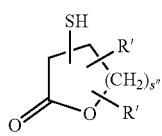
(e3-L1)

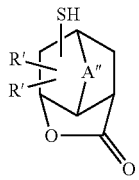
(e3-L2)

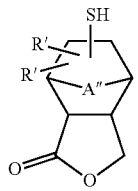
(e3-L3)

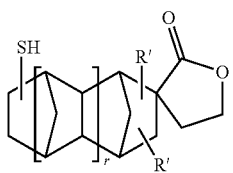
(e3-L4)

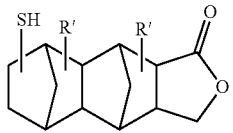
(e3-L5)

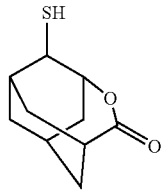
(e3-L6)

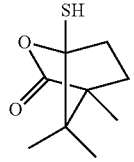
(e3-L7)

(In the formulae (e3-L1) to (e3-L7), R', s", A", and r are the same as in the formulae (b-L1) to (b-L7) described for the acrylic resin (B3).)

Suitable specific examples of the mercapto compound represented by the above formulae (e3-L1) to (e3-L7) include the following compounds.

[Chem. 45]

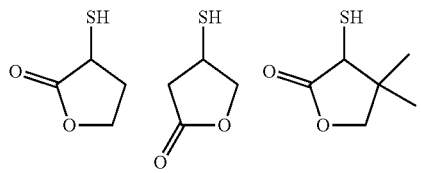

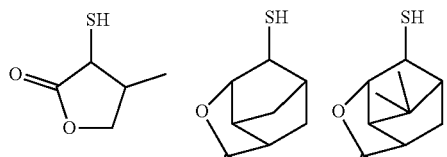

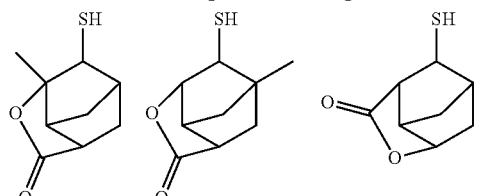

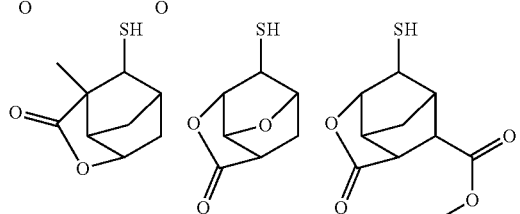

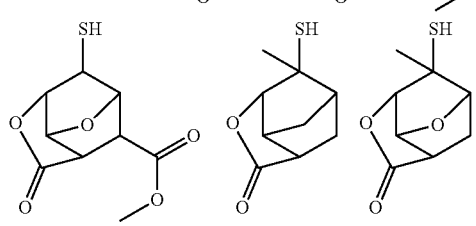

-continued

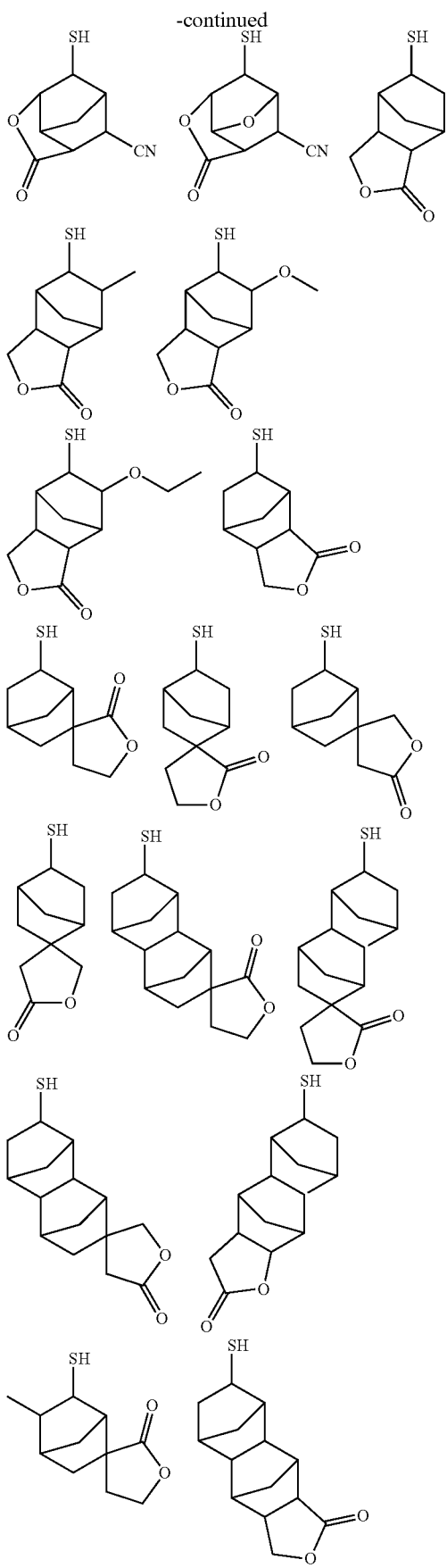

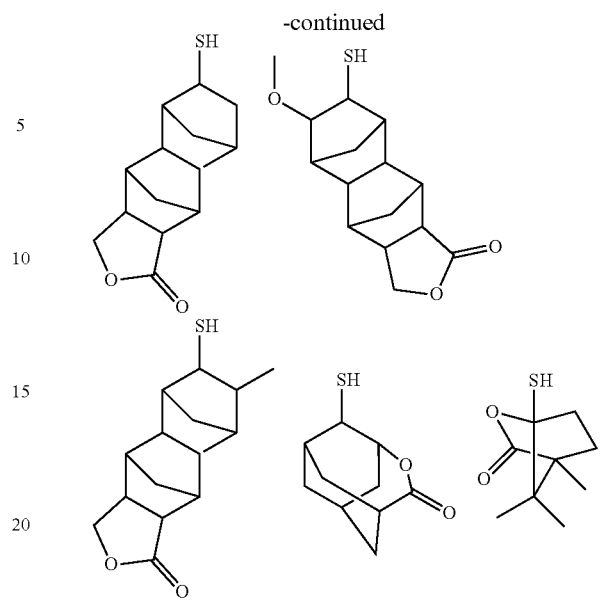

Compounds represented by the following formulae (e3-1) to (e3-4) are also preferable examples as the sulfur-containing compound having a mercapto group.

[Chem. 46]

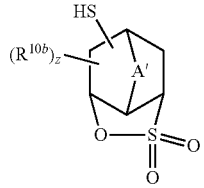

(e3-1)

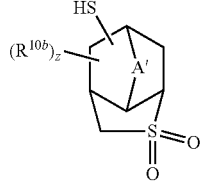

(e3-2)

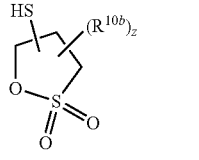

(e3-3)

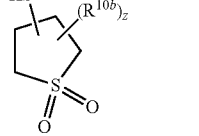

(e3-4)

(In the formulae (e3-1) to (e3-4), definitions of abbreviations are the same as mentioned for the formulae (3-1) to (3-4) described for acrylic resin (B3).)

Suitable specific examples of the mercapto compound represented by the above formulae (e3-1) to (e3-4) include the following compounds.

[Chem. 47]

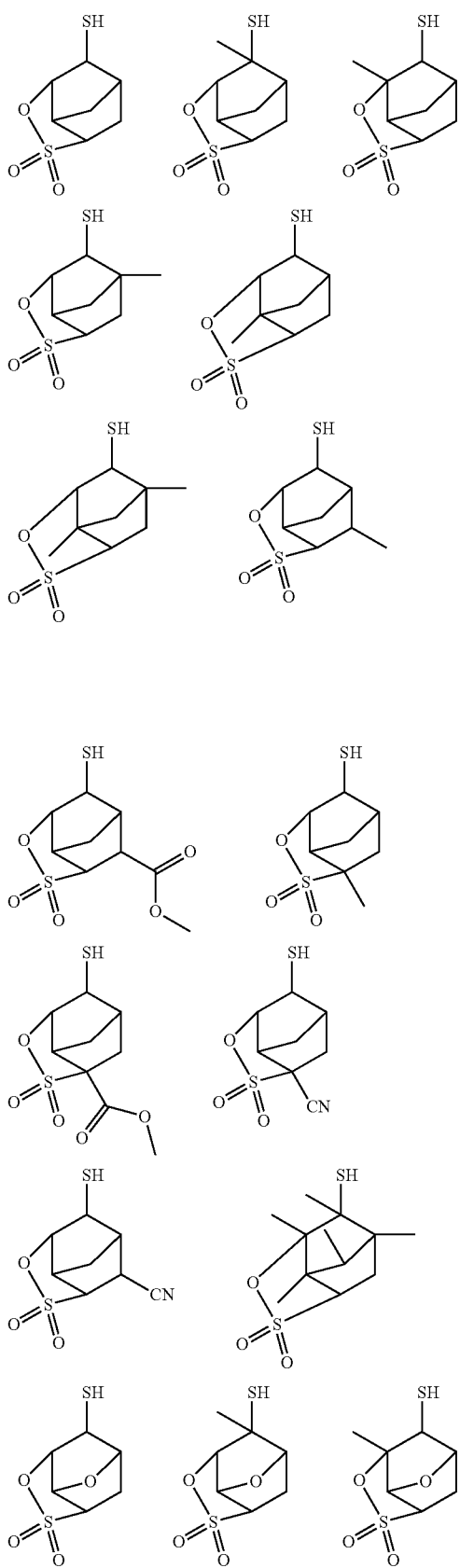

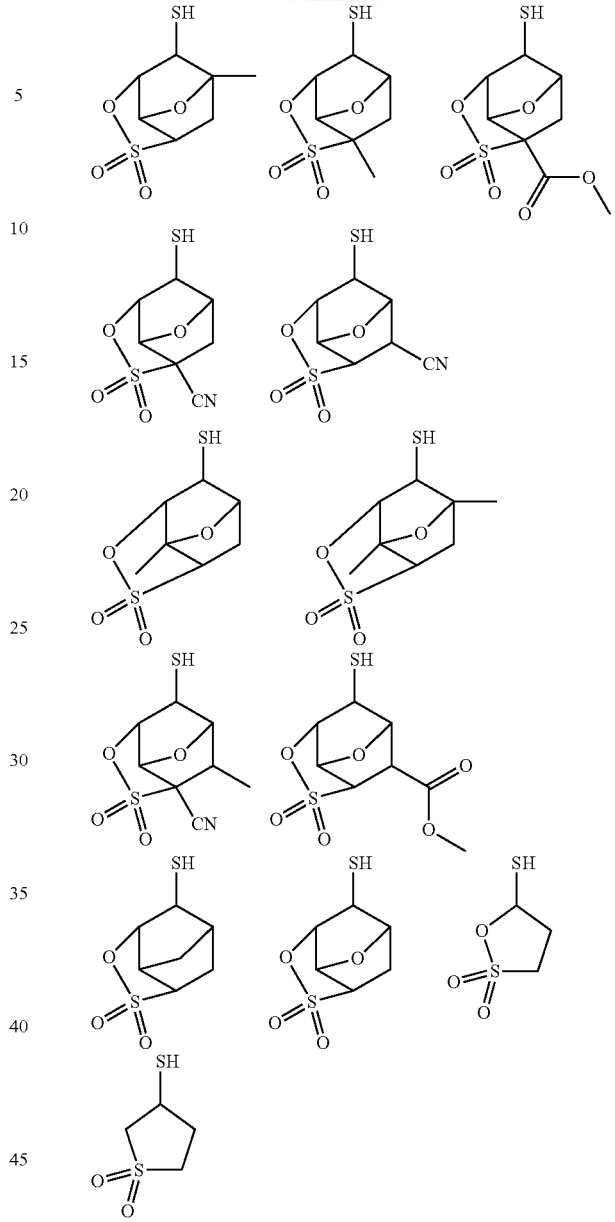

Furthermore, preferable examples of the compound having a mercapto group include compounds represented by the following formula (e4).

[Chem. 48]

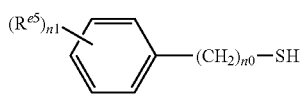

(In the formula (e4), $R^{e5}$ is a group selected from the group consisting of a hydroxyl group, an alkyl group having 1 or more 4 or less carbon atoms, an alkoxy group having 1 or more 4 or less carbon atoms, an alkylthio group having 1 or more and 4 or less carbon atoms, a hydroxyalkyl group having 1 or more and 4 or less carbon atoms, a mercapto alkyl group having 1 or more and 4 or less carbon atoms, a halogenated alkyl group having 1 or more and 4 or less carbon atoms, and a halogen atom, n1 is an integer of 0 or more and 3 or less, n0 is an integer of 0 or more and 3 or less, when n1 is 2 or 3, $R^{e5}$ may be the same as or different from each other.)

Specific examples when $R^{e5}$ is an alkyl group which may have a hydroxyl group having 1 or more 4 or less carbon atoms include a methyl group, an ethyl group, an n-propyl group, an isopropyl group, an n-butyl group, an isobutyl group, a sec-butyl group, and a tert-butyl group. Among these alkyl groups, a methyl group, a hydroxymethyl group, and an ethyl group are preferable.

Specific examples when $R^{e5}$ is an alkoxy group having 1 or more 4 or less carbon atoms include a methoxy group, an ethoxy group, an n-propyloxy group, an isopropyloxy group, an n-butyloxy group, an isobutyloxy group, a sec-butyloxy group, and a tert-butyloxy group. Among these alkoxy groups, a methoxy group and an ethoxy group are preferable, and a methoxy group is more preferable.

Specific examples when $R^{e5}$ is an alkylthio group having 1 or more 4 or less carbon atoms include a methylthio group, an ethylthio group, an n-propylthio group, an isopropylthio group, an n-butylthio group, an isobutylthio, a sec-butylthio group, and a tert-butylthio group. Among these alkylthio groups, a methylthio group, and an ethylthio group are preferable, and a methylthio group is more preferable.

Specific examples when $R^{e5}$ is a hydroxyalkyl group having 1 or more 4 or less carbon atoms include a hydroxymethyl group, a 2-hydroxyethyl group, a 1-hydroxyethyl group, a 3-hydroxy-n-propyl group, and a 4-hydroxy-n-butyl group, and the like. Among these hydroxyalkyl groups, a hydroxymethyl group, a 2-hydroxyethyl group, and a 1-hydroxyethyl group are preferable, and a hydroxymethyl group is more preferable.

Specific examples when $R^{E5}$ is a mercapto alkyl group having 1 or more 4 or less carbon atoms include a mercapto methyl group, a 2-mercapto ethyl group, a 1-mercapto ethyl group, a 3-mercapto-n-propyl group, a 4-mercapto-n-butyl group, and the like. Among these mercapto alkyl groups, a mercapto methyl group, a 2-mercapto ethyl group, and 1-mercapto ethyl group are preferable, and a mercapto methyl group is more preferable.

When $R^{e5}$ is an alkyl halide group having 1 or more 4 or less carbon atoms, examples of the halogen atom included in the alkyl halide group include fluorine, chlorine, bromine, iodine, and the like. Specific examples when $R^{e5}$ is an alkyl halide group having 1 or more 4 or less carbon atoms include a chloromethyl group, a bromomethyl group, an iodomethyl group, a fluoromethyl group, a dichloromethyl group, a dibromomethyl group, a difluoromethyl group, a trichloromethyl group, a tribromomethyl group, a trifluoromethyl group, a 2-chloroethyl group, a 2-bromoethyl group, a 2-fluoroethyl group, a 1,2-dichloroethyl group, a 2,2-difluoroethyl group, a 1-chloro-2-fluoroethyl group, 3-chloro-n-propyl group, a 3-bromon-propyl group, a 3-fluoro-n-propyl group, 4-chloro-n-butyl group, and the like. Among these alkyl halide groups, a chloromethyl group, a bromomethyl group, an iodomethyl group, a fluoromethyl group, a dichloromethyl group, a dibromomethyl group, a difluoromethyl group, a trichloromethyl group, a tribromomethyl group, and a trifluoromethyl group are preferable, and a chloromethyl group, a dichloromethyl group, a trichloromethyl group, and a trifluoromethyl group are more preferable.

Specific examples when $R^{e5}$ is a halogen atom include fluorine, chlorine, bromine, or iodine.

In the formula (e4), n1 is an integer of 0 or more 3 or less, and 1 is more preferable. When n1 is 2 or 3, a plurality of $R^{e5}$s may be the same as or different from each other.

In the compound represented by the formula (e4), a substituted position of $R^{e5}$ on a benzene ring is not particularly limited. The substituted position of $R^{e5}$ on a benzene ring is preferably a meta position or a para position with respect to the bond position of —$(CH_2)_{n0}$—SH.

The compound represented by the formula (e4) is preferably a compound having at least one group selected from the group consisting of an alkyl group, a hydroxyalkyl group, and a mercapto alkyl group as $R^{e5}$, and more preferably a compound having one group selected from the group consisting of an alkyl group, a hydroxyalkyl group, and a mercapto alkyl group as $R^{e5}$. When the compound represented by the formula (e4) has one group selected from the group consisting of an alkyl group, a hydroxyalkyl group, and a mercapto alkyl group as $R^{e5}$, the substituted position on the benzene ring of the alkyl group, the hydroxyalkyl group, or the mercapto alkyl group is preferably a meta position or a para position with respect to the bond position of —$(CH_2)_{n0}$—SH, and more preferably a para position.

In the formula (e4), n0 is an integer of 0 or more 3 or less. From the viewpoint that preparation or availability of a compound is easy, n is preferably 0 or 1, and more preferably 0.

Specific examples of the compound represented by the formula (e4) include p-mercaptophenol, p-thiocresol, m-thiocresol, 4-(methylthio)benzenethiol, 4-methoxybenzenethiol, 3-methoxybenzenethiol, 4-ethoxybenzenethiol, 4-isopropyloxy benzenethiol, 4-tert-butoxybenzenethiol, 3,4-dimethoxy benzenethiol, 3,4,5-trimethoxybenzenethiol, 4-ethylbenzenethiol, 4-isopropyl benzenethiol, 4-n-butyl-benzenethiol, 4-tert-butylbenzenethiol, 3-ethylbenzenethiol, 3-isopropyl benzenethiol, 3-n-butylbenzenethiol, 3-tert-butylbenzenethiol, 3,5-dimethyl benzenethiol, 3,4-dimethyl benzenethiol, 3-tert-butyl-4-methylbenzenethiol, 3-tert-4-methylbenzenethiol, 3-tert-butyl-5-methylbenzenethiol, 4-tert-butyl-3-methylbenzenethiol, 4-mercaptobenzyl alcohol, 3-mercaptobenzyl alcohol, 4-(mercaptomethyl)phenol, 3-(mercaptomethyl)phenol, 1,4-di(mercaptomethyl)phenol, 1,3-di(mercaptomethyl)phenol, 4-fluorobenzenethiol, 3-fluorobenzenethiol, 4-chlorobenzenethiol, 3-chlorobenzenethiol, 4-bromobenzenethiol, 4-iodobenzenethiol, 3-bromobenzenethiol, 3,4-dichlorobenzenethiol, 3,5-dichlorobenzenethiol, 3,4-difluorobenzenethiol, 3,5-difluorobenzenethiol, 4-mercaptocatechol, 2,6-di-tert-butyl-4-mercaptophenol, 3,5-di-tert-butyl-4-methoxybenzenethiol, 4-bromo-3-methylbenzenethiol, 4-(trifluoromethyl)benzenethiol, 3-(trifluoromethyl)benzenethiol, 3,5-bis(trifluoromethyl)benzenethiol, 4-methylthiobenzenethiol, 4-ethylthiobenzenethiol, 4-n-butylthiobenzenethiol, and 4-tert-butylthiobenzenethiol, and the like.

Furthermore, examples of the sulfur-containing compound having a mercapto group include a compound including nitrogen-containing aromatic heterocycle substituted with a mercapto group, and a tautomer of a compound including nitrogen-containing aromatic heterocycle substituted with a mercapto group. Preferable specific examples of the nitrogen-containing aromatic heterocycle include imidazole, pyrazole, 1,2,3-triazol, 1,2,4-triazol, oxazole, thiazole, pyridine, pyrimidine, pyridazine, pyrazine, 1,2,3-triazine, 1,2,4-triazine, 1,3,5-triazine, indole, indazole, benzimidazole, benzoxazole, benzothiazole, 1H-benzotriazole, quinoline, isoquinoline, cinnoline, phthalazine, quinazoline, quinoxaline, and 1,8-naphthyridine.

Suitable specific examples of a nitrogen-containing heterocyclic compound suitable as a sulfur-containing compound, and suitable tautomer of the nitrogen-containing heterocyclic compound include the following compounds.

[Chem. 49]

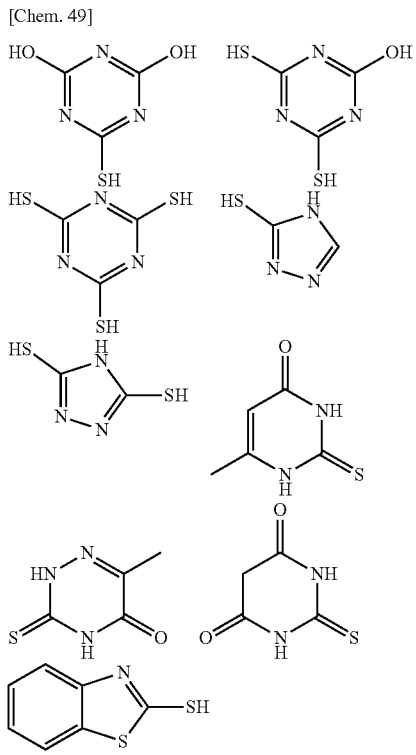

When the photosensitive resin composition includes a sulfur-containing compound (E), the use amount is preferably 0.01 parts by mass or more 5 parts by mass or less, more preferably 0.02 parts by mass or more 3 parts by mass or less, and particularly preferably 0.05 parts by mass or more 2 parts by mass or less with respect to 100 parts by mass that is the total mass of the above resin (B) and the alkali soluble resin (D) mentioned above.

<Acid Diffusion Control Agent (F)>

In order to improve the shape of resist pattern used as a template, the post-exposure delay stability of photosensitive resin film and the like, it is preferable that the photosensitive resin composition further contains an acid diffusion control agent (F). The acid diffusion control agent (F) is preferably a nitrogen-containing compound (F1), and an organic carboxylic acid, or an oxo acid of phosphorus or a derivative thereof (F2) may be further included as needed.

[Nitrogen-Containing Compound (F1)]

Examples of the nitrogen-containing compound (F1) include trimethylamine, diethylamine, triethylamine, di-n-propylamine, tri-n-propylamine, tri-n-pentylamine, tribenzylamine, diethanolamine, triethanolamine, n-hexylamine, n-heptyl amine, n-octyl amine, n-nonyl amine, ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, formamide, N-methylformamide, N,N-dimethylformamide, acetamide, N-methylacetamide, N,N-dimethylacetamide, propionamide, benzamide, pyrrolidone, N-methylpyrrolidone, methylurea, 1,1-dimethylurea, 1,3-dimethylurea, 1,1,3,3,-tetramethylurea, 1,3-diphenylurea, imidazole, benzimidazole, 4-methylimidazole, 8-oxyquinoline, acridine, purine, pyrrolidine, piperidine, 2,4,6-tri(2-pyridyl)-S-triazine, morpholine, 4-methylmorpholine, piperazine, 1,4-dimethylpiperazine, 1,4-diazabicyclo[2.2.2]octane, pyridine, and the like. These may be used alone, or in combinations of two or more thereof.

Furthermore, commercially available hindered amine compounds such as Adeka Stab LA-52, Adeka Stab LA-57, Adeka Stab LA-63P, Adeka Stab LA-68, Adeka Stab LA-72, Adeka Stab LA-77Y, Adeka Stab LA-77G, Adeka Stab LA-81, Adeka Stab LA-82, Adeka Stab LA-87 (all manufactured by ADEKA), and the like, and pyridine whose 2,6-position has been substituted with a substituent a hydrocarbon group such as 2,6-diphenyl pyridine and 2,6-di-tert-butyl pyridine can be used as the nitrogen-containing compound (F1).

The nitrogen-containing compound (F1) may be used in an amount typically in the range of 0 parts by mass or more and 5 parts by mass or less, and particularly preferably in the range of 0 parts by mass or more and 3 parts by mass or less, with respect to 100 parts by mass of total mass of the above resin (B) and the above alkali-soluble resin (D).

[Organic Carboxylic Acid or Oxo Acid of Phosphorus or Derivative Thereof (F2)]

Among the organic carboxylic acid, or the oxo acid of phosphorus or the derivative thereof (F2), specific preferred examples of the organic carboxylic acid include malonic acid, citric acid, malic acid, succinic acid, benzoic acid, salicylic acid and the like, and salicylic acid is particularly preferred.

Examples of the oxo acid of phosphorus or derivatives thereof include phosphoric acid and derivatives such as esters thereof such as phosphoric acid, phosphoric acid di-n-butyl ester, and phosphoric acid diphenyl ester; phosphonic acid and derivatives such as esters thereof such as phosphonic acid, phosphonic acid dimethyl ester, phosphonic acid di-n-butyl ester, phenylphosphonic acid, phosphonic acid diphenyl ester, and phosphonic acid dibenzyl ester; and phosphinic acid and derivatives such as esters thereof such as phosphinic acid and phenylphosphinic acid; and the like. Among these, phosphonic acid is particularly preferred. These may be used alone, or in combinations of two or more thereof.

The organic carboxylic acid or oxo acid of phosphorus or derivative thereof (F2) may be used in an amount usually in the range of 0 parts by mass or more and 5 parts by mass or less, and particularly preferably in the range of 0 parts by mass and 3 parts by mass or less, with respect to 100 parts by mass of total mass of the above resin (B) and the above alkali-soluble resin (D).

Moreover, in order to form a salt to allow for stabilization, the organic carboxylic acid, or the oxo acid of phosphorous or the derivative thereof (F2) is preferably used in an amount equivalent to that of the above nitrogen-containing compound (F1).

<Organic Solvent (S)>

The photosensitive resin composition contains an organic solvent (S). There is no particular limitation on the types of the organic solvent (S) when a certain amount of (S1) component is included as long as the objects of the present invention are not impaired, and an organic solvent appropriately selected from those conventionally used for positive-type photosensitive resin compositions can be used.

Specific examples of the compounds that can be used as the organic solvent (S) include ketones such as acetone, methyl ethyl ketone, cyclohexanone, methyl isoamyl ketone, and 2-heptanone; glycols such as ethylene glycol, diethylene glycol, propylene glycol, and dipropylene glycol; glycol monoacetates such as ethylene glycol monoacetate, diethylene glycol monoacetate, propylene glycol monoacetate, and dipropylene glycol monoacetate; glycol monoethers such as monomethyl ethers, monoethyl ethers, monopropyl ethers, monobutyl ethers and monophenyl ethers, of glycols such as ethylene glycol, diethylene glycol, propylene glycol, and dipropylene glycol; monomethyl ether, monoethyl ether, monopropyl ether, monobutyl ether, and monophenyl ether of glycol monoether monoacetates such as ethylene glycol monoacetate, diethylene glycol monoacetate, propylene glycol monoacetate, and dipropylene glycol monoacetate; cyclic ethers such as dioxane; esters such as ethyl formate, methyl lactate, ethyl lactate, methyl acetate, ethyl acetate, butyl acetate, methyl pyruvate, methyl acetoacetate, ethyl acetoacetate, methyl pyruvate, ethylethoxy acetate, methyl methoxypropionate, ethyl ethoxypropionate, methyl 2-hydroxypropionate, ethyl 2-hydroxypropionate, ethyl 2-hydroxy-2-methylpropionate, methyl 2-hydroxy-3-methylbutanate, 3-methoxybutyl acetate and 3-methyl-3-methoxybutyl acetate; aromatic hydrocarbons such as toluene and xylene; and the like. These may be used alone, or as a mixture of two or more thereof, as long as specific amount of (S1) component is used.

There is no particular limitation on the all content of the organic solvent (S) as long as the objects of the present invention are not impaired. In a case where a photosensitive resin composition is used for a thick-film application such that a photosensitive resin layer obtained by the spin coating method and the like has a film thickness of 5 μm or more, the organic solvent (S) is preferably used in a range where the solid content concentration of the photosensitive resin composition is 30% by mass or more and 55% by mass or less.

Furthermore, in the photosensitive resin composition, an organic solvent (S) includes 70% by mass or more of an organic solvent (S1) having a boiling point of 120 to 180° C. with respect to the entire organic solvent (S). In this way, when an organic solvent (S1) having a specific range of boiling point is included in a predetermined amount or more, a coated film can be obtained from a photosensitive resin composition.

The organic solvent (S1) can be appropriately selected from a solvent capable of preparing a photosensitive resin composition. Specific examples include butyl acetate (BA; boiling point: 126° C.), cyclopentanone (boiling point: 131° C.), cyclohexanone (AN; boiling point: 157° C.), ethylene glycol monomethyl ether acetate (boiling point: 145° C.), propylene glycol monomethyl ether acetate (PGMEA; boiling point: 146° C.), 3-methoxybutanol (boiling point: 161° C.), 3-methoxy butyl acetate (MA; boiling point: 171° C.), dipropylene glycol dimethyl ether (DMM; boiling point 175° C.), cyclohexanol acetate (CHXA; boiling point: 172° C.), and the like.

The amount of the organic solvent (S1) having such a boiling point is 70% by mass or more, preferably 80% by mass or more, more preferably 90% by mass or more, further preferably 95% by mass or more with respect to an entire organic solvent (S). Furthermore, the entire organic solvent (S) may be a (S1) component.

Furthermore, the organic solvent (S) may include a solvent (S2) whose boiling point is higher than the boiling point of the aforementioned (S1) component within a range where the objects of the present invention are not impaired. Specific examples of the high boiling-point solvent (S2) include ethylene glycol monobutyl ether acetate (boiling point: 188° C.), propylene glycol diacetate (PGDA; boiling point: 191° C.), gamma-butyrolactone (GBL; boiling point: 204° C.), dipropylene glycol methyl ether acetate (DPMA; boiling point 209° C.), diethylene glycol monoethyl ether acetate (EDGAC; boiling point: 218° C.), 1,3-butylene glycol diacetate (BGDA; boiling point: 232° C.), diethylene glycol monobutyl ether acetate (BDGAC; boiling point: 247° C.), triacetin (boiling point: 260° C.), and the like. Note here that from the viewpoint that the photosensitive resin composition satisfying the aforementioned [Requirement 1] is easily obtained, the amount of the high boiling-point solvent (S2) in the photosensitive resin composition is preferably 25% by mass or less, preferably 20% by mass or less, more preferably 15% by mass or less, further preferably 10% by mass or less, and particularly preferably 5% by mass or less with respect to the entire organic solvent (S). Furthermore, an embodiment in which the photosensitive resin composition does not include the high boiling-point solvent (S2) is also a preferable example.

<Other Components>

The photosensitive resin composition may further contain a polyvinyl resin for improving plasticity. Specific examples of the polyvinyl resin include polyvinyl chloride, polystyrene, polyvinyl acetate, polyvinylbenzoic acid, polyvinyl methyl ether, polyvinyl ethyl ether, polyvinyl pyrrolidone, and copolymers thereof, and the like. The polyvinyl resin is preferably polyvinyl methyl ether in view of lower glass transition temperatures.

Further, the photosensitive resin composition may also contain an adhesive auxiliary agent in order to improve the adhesiveness between a template formed with the photosensitive resin composition and a metal substrate.

Also, the photosensitive resin composition may further contain a surfactant for improving coating characteristics, defoaming characteristics, leveling characteristics, and the like. As the surfactant, for example, a fluorine-based surfactant or a silicone-based surfactant is preferably used. Specific examples of the fluorine-based surfactant include commercially available fluorine-based surfactants such as BM-1000 and BM-1100 (both manufactured by B.M-Chemie Co., Ltd.), Megafac F142D, Megafac F172, Megafac F173 and Megafac F183 (all manufactured by Dainippon Ink And Chemicals, Incorporated), Flolade FC-135, Flolade FC-170C, Flolade FC-430 and Flolade FC-431 (all manufactured by Sumitomo 3M Ltd.), Surflon S-112, Surflon S-113, Surflon S-131, Surflon S-141 and Surflon S-145 (all manufactured by Asahi Glass Co., Ltd.), SH-28PA, SH-190, SH-193, SZ-6032 and SF-8428 (all manufactured by Toray Silicone Co., Ltd.) and the like, but not limited thereto. As the silicone-based surfactant, an unmodified silicone-based surfactant, a polyether modified silicone-based surfactant, a polyester modified silicone-based surfactant, an alkyl modified silicone-based surfactant, an aralkyl modified silicone-based surfactant, a reactive silicone-based surfactant, and the like, can be preferably used. As the silicone-based surfactant, commercially available silicone-based surfactant can be used. Specific examples of the commercially available silicone-based surfactant include Paintad M (manufactured by Dow Corning Toray Co., Ltd.), Topica K1000, Topica K2000, and Topica K5000 (all manufactured by Takachiho Industry Co., Ltd.), XL-121 (polyether modified silicone-based surfactant, manufactured by Clariant Co.), BYK-310 (polyester modified silicone-based surfactant, manufactured by BYK), and the like.

Additionally, in order to finely adjust the solubility in a developing solution, the photosensitive resin composition may further contain an acid, an acid anhydride, or a solvent having a high boiling point.

Specific examples of the acid and acid anhydride include monocarboxylic acids such as acetic acid, propionic acid, n-butyric acid, isobutyric acid, n-valeric acid, isovaleric acid, benzoic acid, and cinnamic acid; hydroxymonocarboxylic acids such as lactic acid, 2-hydroxybutyric acid, 3-hydroxybutyric acid, salicylic acid, m-hydroxybenzoic acid, p-hydroxybenzoic acid, 2-hydroxycinnamic acid, 3-hydroxycinnamic acid, 4-hydroxycinnamic acid, 5-hydroxyisophthalic acid, and syringic acid; polyvalent carboxylic acids such as oxalic acid, succinic acid, glutaric acid, adipic acid, maleic acid, itaconic acid, hexahydrophthalic acid, phthalic acid, isophthalic acid, terephthalic acid, 1,2-cyclohexanedicarboxylic acid, 1,2,4-cyclohexanetricarboxylic acid, butanetetracarboxylic acid, trimellitic acid, pyromellitic acid, cyclopentanetetracarboxylic acid, butanetetracarboxylic acid, and 1,2,5,8-naphthalenetetracarboxylic acid; acid anhydrides such as itaconic anhydride, succinic anhydride, citraconic anhydride, dodecenylsuccinic anhydride, tricarbanilic anhydride, maleic anhydride, hexahydrophthalic anhydride, methyltetrahydrophthalic anhydride, Himic anhydride, 1,2,3,4-butanetetracarboxylic anhydride, cyclopentanetetracarboxylic dianhydride, phthalic anhydride, pyromellitic anhydride, trimellitic anhydride, benzophenonetetracarboxylic anhydride, ethylene glycol bis anhydrous trimellitate, and glycerin tris anhydrous trimellitate; and the like.

Moreover, the photosensitive resin composition may further contain a sensitizer for improving the sensitivity.

It is preferable that the above-described photosensitive resin composition further satisfies the following [Requirement 2].

[Requirement 2]

$I_a/I_b$ measured by the following steps (i) to (iv) is 0.1 or less:
(i) forming a 40-μm coated film by applying the chemically amplified positive-type photosensitive resin composition to a substrate;
(ii) baking the coated film firstly at 140° C. for 300 seconds, and further baking at 115° C. for 180 seconds to obtain a baked coated film;
(iii) pulverizing a part of the baked coated film, and measuring an IR spectrum together with KBr; and
(iv) determining $I_a/I_b$ where $I_a$ is an intensity of a signal derived from an —OH group positioned between 3000 cm$^{-1}$ to 3600 cm$^{-1}$ of the obtained IR spectrum, and $I_b$ is an intensity of a signal derived from a C=O group positioned between 1650 cm$^{-1}$ to 1780 cm$^{-1}$ of the obtained IR spectrum.

It is considered that $I_a/I_b$ has an influence on formation of a hydrogen bond in a component included in a coated film or a pattern formed using a photosensitive resin composition. When the value of $I_a/I_b$ is small, the amount of the hydroxyl group with respect to a carbonyl group (C=O) is small, and most of the hydroxyl group is considered to be involved in formation of a carbonyl group and a hydrogen bond. On the other hand, it is considered that the interaction between a hydroxyl group on a pattern surface and a surface of a plated article made of metal is also a cause of attaching of residues of a template to the plated article when a pattern serving as the template after the plated article is formed. As mentioned above, when the value of $I_a/I_b$ is small, interaction between a hydroxyl group on a pattern surface, and a surface of a plated article made of metal is reduced, and attaching of residues of the template on the plated article is considered to be suppressed.

The value of $I_a/I_b$ can be adjusted by adjusting, a hydroxyl group content and a carbonyl group content for component other than the organic solvent (S) included in the photosensitive resin composition.

<Method of Preparing Chemically Amplified Positive-Type Photosensitive Resin Composition>

A chemically amplified positive-type photosensitive resin composition is prepared by mixing and stirring the above components by the common method. Machines which can be used for mixing and stirring the above components include dissolvers, homogenizers, 3-roll mills and the like. After uniformly mixing the above components, the resulting mixture may be filtered through a mesh, a membrane filter and the like.

<<Photosensitive Dry Film>>

A photosensitive dry film includes a substrate film, and a photosensitive resin layer formed on the surface of the substrate film. The photosensitive resin layer is made of the aforementioned photosensitive resin compositions.

As the substrate film, a film having optical transparency is preferable. Specifically, a polyethylene terephthalate (PET) film, a polypropylene (PP) film, a polyethylene (PE) film, and the like. In view of excellent balance between the optical transparency and the breaking strength, a polyethylene terephthalate (PET) film is preferable.

The aforementioned photosensitive resin composition is applied on the substrate film to form a photosensitive resin layer, and thereby a photosensitive dry film is manufactured. When the photosensitive resin layer is formed on the substrate film, a photosensitive resin composition is applied and dried on the substrate film using an applicator, a bar coater, a wire bar coater, a roller coater, a curtain flow coater, and the like, so that a film thickness after drying is preferably 0.5 μm or more and 300 μm or less, more preferably 1 μm or more and 300 μm or less, and particularly preferably 3 μm or more and 100 μm or less.

The photosensitive dry film may have a protective film on the photosensitive resin layer. Examples of the protective film include a polyethylene terephthalate (PET) film, a polypropylene (PP) film, a polyethylene (PE) film, and the like.

<<Method of Producing Substrate with Template>>

There is no particular limitation on a method of forming a patterned resist film on a substrate using the photosensitive resin composition described above. Such a patterned resist film is suitably used as a template for forming a plated article. A suitable method includes a manufacturing method of a patterned resist film that includes: laminating a photosensitive resin layer on a substrate, the layer including the chemically amplified positive-type photosensitive resin composition, exposing the photosensitive resin layer through irradiation with an active ray or radiation in a position-selective manner, and developing the exposed photosensitive resin layer to form a template for forming a plated article.

When a substrate with a template for forming a plated article is manufactured, for the substrate, a substrate having a metal surface is used. As metal species constituting a metal surface, copper, gold and aluminum are preferred, and copper is more preferred.

The photosensitive resin layer is laminated on the substrate, for example, as follows. In other words, a liquid photosensitive resin composition is coated onto a substrate, and the coating is heated to remove the solvent and thus to form a photosensitive resin layer having a desired thickness. The thickness of the photosensitive resin layer is not particularly limited as long as it is possible to form a resist pattern serving as a template which has a desired thickness. The thickness of the photosensitive resin layer is not particularly limited, but is preferably 0.5 µm or more, more preferably 0.5 µm or more and 300 µm or less, and particularly preferably 1 µm or more and 150 µm or less, and most preferably 3 µm or more and 100 µm or less.

As a method of applying a photosensitive resin composition onto a substrate, methods such as the spin coating method, the slit coat method, the roll coat method, the screen printing method and the applicator method can be employed. Pre-baking is preferably performed on a photosensitive resin layer. The conditions of pre-baking may differ depending on the components in a photosensitive resin composition, the blending ratio, the thickness of a coating film and the like. They are usually about 2 minutes or more and 120 minutes or less at 70° C. or more and 200° C. or less, and preferably 80° C. or more and 150° C. or less.

The photosensitive resin layer formed as described above is selectively irradiated (exposed) with an active ray or radiation, for example, an ultraviolet radiation or visible light with a wavelength of 300 nm or more and 500 nm or less through a mask having a predetermined pattern.

Low pressure mercury lamps, high pressure mercury lamps, super high pressure mercury lamps, metal halide lamps, argon gas lasers, etc. can be used for the light source of the radiation. The radiation may include micro waves, infrared rays, visible lights, ultraviolet rays, X-rays, γ-rays, electron beams, proton beams, neutron beams, ion beams, etc. The irradiation dose of the radiation may vary depending on the constituent of the photosensitive resin composition, the film thickness of the photosensitive resin layer, and the like. For example, when an ultra high-pressure mercury lamp is used, the dose may be 100 mJ/cm$^2$ or more and 10,000 mJ/cm$^2$ or less. The radiation includes a light ray to activate the acid generator (A) in order to generate an acid.

After the exposure, the diffusion of acid is promoted by heating the photosensitive resin layer using a known method to change the alkali solubility of the photosensitive resin layer at an exposed portion in the photosensitive resin film.

Subsequently, the exposed photosensitive resin layer is developed in accordance with a conventionally known method, and an unnecessary portion is dissolved and removed to form a template having a predetermined shape for forming a plated article. At this time, as the developing solution, an alkaline aqueous solution is used.

As the developing solution, an aqueous solution of an alkali such as, for example, sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5.4.0]-7-undecene or 1,5-diazabicyclo[4.3.0]-5-nonane can be used. Also, an aqueous solution prepared by adding an adequate amount of a water-soluble organic solvent such as methanol or ethanol, or a surfactant to the above aqueous solution of the alkali can be used as the developing solution.

The developing time may vary depending on the constituent of the photosensitive resin composition, the film thickness of the photosensitive resin layer, and the like. Usually, the developing time is 1 minute or more and 30 minutes or less. The method of the development may be any one of a liquid-filling method, a dipping method, a paddle method, a spray developing method, and the like.

After development, it is washed with running water for 30 seconds or more and 90 seconds or less, and then dried with an air gun, an oven, and the like. In this manner, it is possible to form a template for forming a plated article, which has been patterned in a predetermined pattern on a metal surface of a substrate having a metal surface.

<<Method of Manufacturing Plated Article>>

A conductor such as a metal may be embedded, by plating, into a nonresist portion (a portion removed with a developing solution) in the template formed by the above method on the substrate to form a plated article, for example, like a contacting terminal such as a bump and a metal post, or Cu rewiring. The method of manufacturing a plated article typically includes: plating the substrate with a template to form a plated article in a template; and stripping a template from the substrate with a template after the plated article is formed. Note here that there is no particular limitation on the method of plate processing, and various conventionally known methods can be used. As a plating liquid, in particular, a solder plating liquid, a copper plating liquid, a gold plating liquid, a nickel plating liquid, a silver-tin plating liquid are suitably used. The pattern serving as a template formed using a photosensitive resin composition satisfying the aforementioned [Requirement 1] is preferably applied to manufacture of a plated article by silver-tin plating. In a case where silver-tin plating is carried out, when the pattern serving as a template is removed after the plated article is formed, attaching of residues of the template to the plated articles is remarkable. However, a pattern serving as a template is formed using the photosensitive resin composition satisfying the aforementioned [Requirement 1], attaching of the residues of the template to the plated article can be favorably suppressed. Finally, the remaining template is removed with a stripping liquid and the like in accordance with a conventional method after the plate article is manufactured. The stripping liquid is not particularly limited as long as it is capable of stripping the template, and does not damage the plated article or the substrate. Preferable examples of the stripping liquid include organic solvents such as acetone.

When the plated article is manufactured, it may be preferable that an exposed metal surface in a non-patterned portion of a resist pattern serving as a template for forming plated article is subjected to ashing treatment. Specific examples include case where a pattern formed of a photosensitive resin composition including a sulfur-containing compound (E) is used as a template to form a plated article. In this case, adhesiveness of the plated article to a metal surface may be easily damaged. This problem is remarkable in a case where sulfur-containing compound (E) represented by the above-mentioned formula (e1), and the sulfur-containing compound (E) represented by the formula (e4). However, the above-mentioned ashing treatment is carried out, even when a pattern formed using a photosensitive resin composition including a sulfur-containing compound (E) is used as a template, a plated article favorably adhering to the metal surface is easily obtained. Note here that in a case where a compound including a nitrogen-containing aromatic heterocycle substituted with a mercapto group is used as a sulfur-containing compound (E), the problem of adhesiveness of a plated article hardly occurs or occurs slightly. Therefore, in a case where a compound including a nitrogen-containing aromatic heterocycle substituted with a mercapto group is used as a sulfur-containing compound (E), a plated article having excellent adhesiveness with respect to the metal surface is easily formed without carrying out ashing treatment.

The ashing treatment is not particularly limited as long as long as it does not damage a resist pattern serving as a template for forming the plated article to such an extent that the plated article having a desired shape cannot be formed. Preferable ashing treatment methods include a method using oxygen plasma. For ashing with respect to the metal surface of the substrate using oxygen plasma, an oxygen plasma is generated using a known oxygen plasma generator, and the metal surface on the substrate is irradiated with the oxygen plasma.

Various gases which have conventionally been used for plasma treatment together with oxygen can be mixed into gas to be used for generating oxygen plasma within a range where the objects of the present invention are not impaired. Examples of such gas include nitrogen gas, hydrogen gas, $CF_4$ gas, and the like. Conditions of ashing using oxygen plasma are not particularly limited within a range where the objects of the present invention are not impaired, but treatment time is, for example, in a range of 10 seconds or more and 20 minutes or less, preferably in a range of 20 seconds or more and 18 minutes or less, and more preferably in a range of 30 seconds or more and 15 minutes or less. By setting the treatment time by oxygen plasma to the above range, an effect of improving the adhesiveness of the plated article can be easily achieved without changing a shape of the resist pattern.

According to the above method, when plated article is formed using a substrate with a template having a pattern formed using the above-described photosensitive resin composition as a template, a plated article can easily be manufactured while attaching of the residues of the template to the plated article is suppressed.

<Method of Providing Chemically Amplified Positive-Type Photosensitive Resin Composition>

The method of providing a chemically amplified positive-type photosensitive resin composition of this embodiment provides a chemically amplified positive-type photosensitive resin composition to a process line that executes the above-described method of manufacturing a substrate with a template or the above-described method of manufacturing a plated article. Herein, the chemically amplified positive-type photosensitive resin composition (photosensitive composition) may be prepared by appropriately selecting the above-described materials, and preparation timing of chemically amplified positive-type photosensitive resin composition may be determined in response to the size and the operation speed of the process line. Furthermore, the business entity performing the method of manufacturing a substrate with a template or the method of manufacturing a plated article and the business entity performing this providing method are not necessarily the same.

EXAMPLES

The present invention will be described in more detail below by way of Examples, but the present invention is not limited to these Examples.

Preparation Example 1

(Synthesis of Mercapto Compound E2)

In Preparation Example 1, a mercapto compound E2 having the following structure was synthesized as sulfur-containing compound (E).

[Chem. 50]

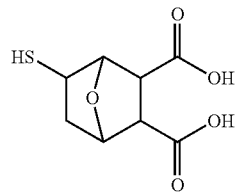

In a flask, 15.00 g of 7-oxanorborna-5-ene-2,3-dicarboxylic anhydride and 150.00 g of tetrahydrofuran were added, followed by stirring. Subsequently, 7.64 g of thioacetic acid (AcSH) was added in a flask, followed by stirring at room temperature for 3.5 hours. Then, the reaction solution was concentrated to obtain 22.11 g of 5-acetyl thio-7-oxanorbornane-2,3-dicarboxylic anhydride. In a flask, 22.11 g of 5-acetylthio-7-oxanorbornane-2,3-dicarboxylic anhydride and 30.11 g of an aqueous sodium hydroxide solution having the concentration of 10% by mass were added, and then contents in the flask were stirred at room temperature for 2 hours. Subsequently, hydrochloric acid (80.00 g) having the concentration of 20% by mass was added in the flask to acidify the reaction solution. Then, extraction with 200 g of ethyl acetate was performed four times to obtain an extraction liquid including a mercapto compound E2. The extraction liquid was concentrated and the collected residue was dissolved by adding 25.11 g of tetrahydrofuran (THF). Heptane was added dropwise to the obtained THF solution to precipitate the mercapto compound E2, and the precipitated mercapto compound E2 was collected by filtration. The measurement results of $^1$H-NMR of the mercapto compound E2 are shown below. $^1$H-NMR (DMSO-d6): δ12.10 (s, 2H), 4.72 (d, 1H), 4.43 (s, 1H), 3.10 (t, 1H), 3.01 (d, 1H), 2.85 (d, 1H), 2.75 (d, 1H), 2.10 (t, 1H), 1.40 (m, 1H)

[Chem. 51]

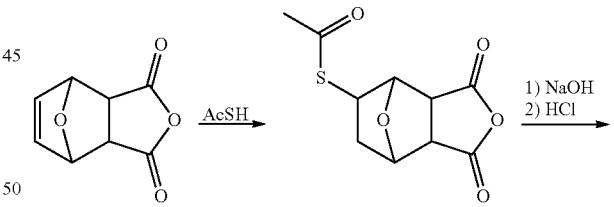

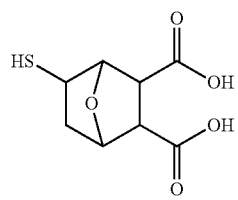

Examples 1 to 26, and Comparative Examples 1 to 34

In Examples and Comparative Examples, the following A1 and A2 were used as the acid generator (A).

[Chem. 52]

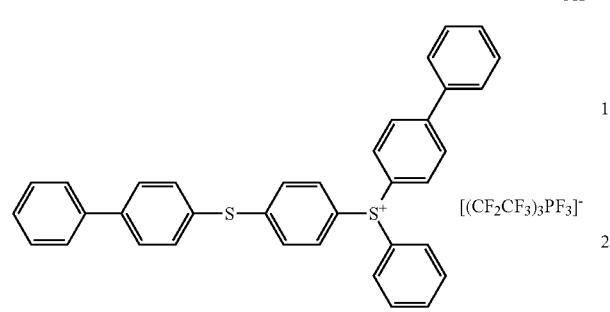

A1

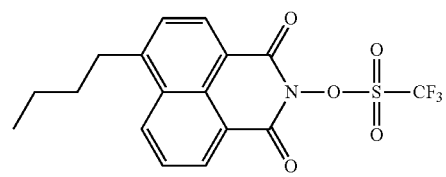

A2

In Examples and Comparative Examples, the following resins B1 to B11 were used as the resin whose solubility in alkali increases under the action of acid (resin (B)). The number at the lower right of the parentheses in each constituent unit in the following structural formula represents the content (% by mass) of the constituent unit in each resin. Each resin has a mass average molecular weight Mw as follows.

Resin B1 to B7: 40,000

Resin B8: 10,000

Resin B9: 20,000

Resin B10: 80,000

Resin B11: 120,000

[Chem. 53]

Resin B1, Resin B8-B11

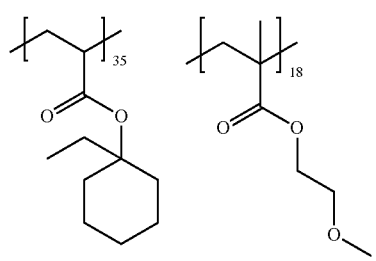

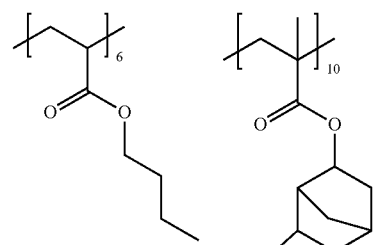

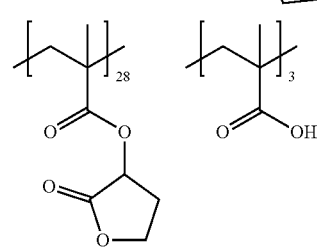

Resin B2

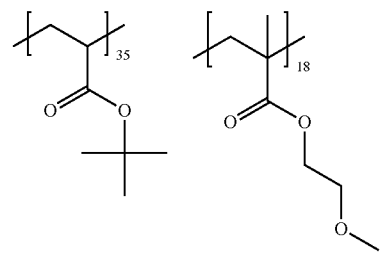

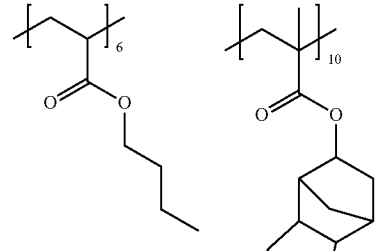

Resin B3

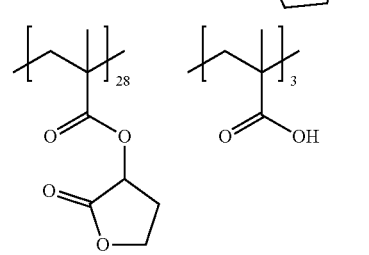

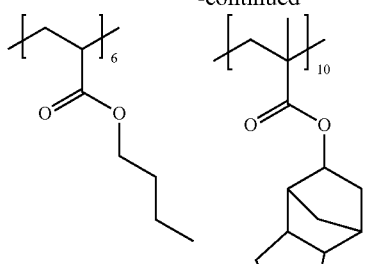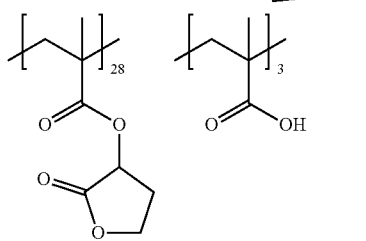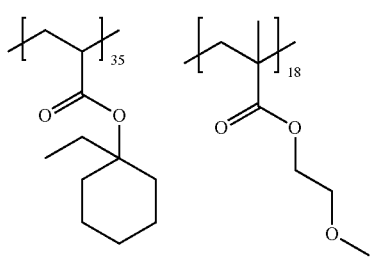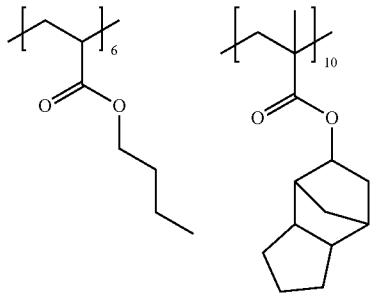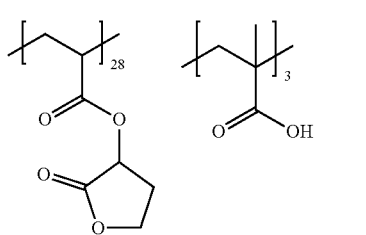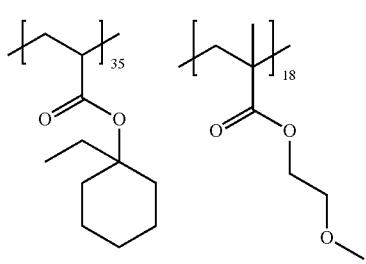
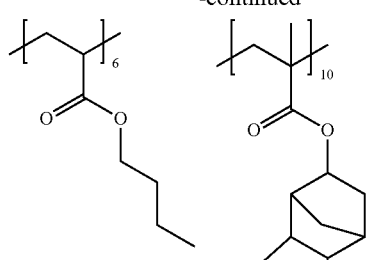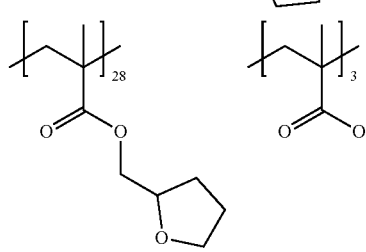
Resin B4
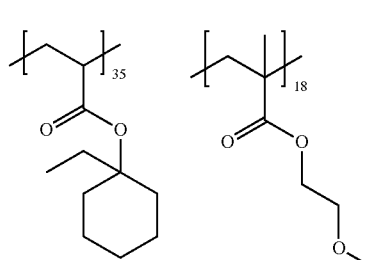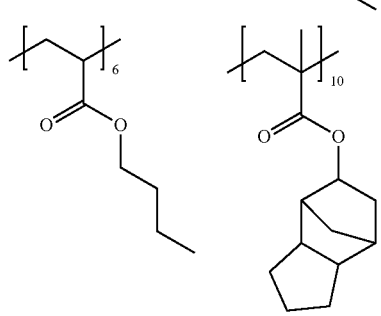
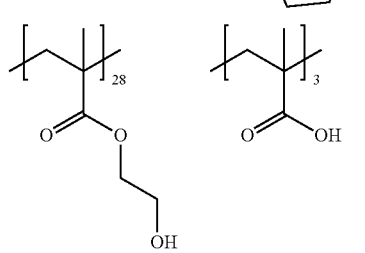
Resin B5
Resin B6
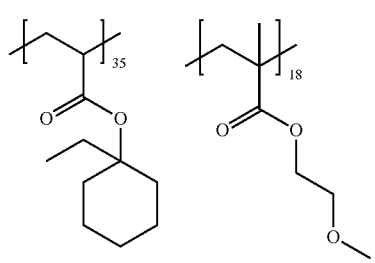
Resin B7

-continued

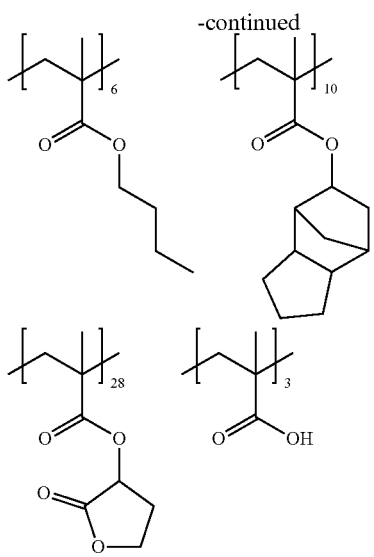

In Comparative Examples, as the alkali soluble resin (D), the following resin D1, resin D2, and resin D3 were used.
Resin D1: novolak resin (p-cresol single condensation product, mass average molecular weight (Mw): 8000)
Resin D2: polyhydroxystyrene resin (copolymer of p-hydroxystyrene/styrene/tert-butylacrylate=60/25/15 (mass ratio), mass average molecular weight (Mw): 10000)
Resin D3: polyhydroxystyrene resin (copolymer of p-hydroxystyrene/styrene=85/15 (mass ratio), mass average molecular weight (Mw): 2500), dispersivity (Mw/Mn): 2.4)
In Examples and Comparative Examples, as the sulfur-containing compound (E), E1 as the following compound and a mercapto compound E2 obtained in Preparation Example 1 were used.

[Chem. 54]

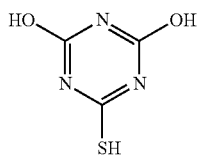

E1

In Examples and Comparative Examples, tripentyl amine (F1), LA-63P (manufactured by ADEKA) (F2), diphenyl pyridine (F3), and triphenyl pyridine (F4) were used as an acid diffusion control agent (F).

Examples 1 to 11, and Comparative Examples 1 to 7

The above A2 as the acid generator (A) in an amount of 0.3 parts by mass, the resin (B) and alkali soluble resin (D) in types and amounts shown in Table 1, the above E1 as the sulfur-containing compound (E) in an amount of 0.05 parts by mass, the above F3 and the F4 as the acid diffusion control agent (F) in an amount of 0.05 parts by mass, and a surfactant (BYK310, manufactured by BYK) in an amount of 0.05 parts by mass were dissolved in 3-methoxy butyl acetate (MA), or propylene glycol monomethyl ether acetate (PM) so that the solid content concentration became 45% by mass to obtain two types of photosensitive resin compositions having different types of organic solvents (S1) in each Example and Comparative Example.

Example 12 and Comparative Examples 8 to 12

In the same manner as in Examples 1 to 11 and Comparative Examples 1 to 7, except that the resin (B) and alkali soluble resin (D) each in types and amounts shown in Table 2 were used, and the sulfur-containing compound (E) was changed from the above E1 to the above E2, two types of photosensitive resin compositions having different types of organic solvents were obtained in each Example and Comparative Example.

Example 13, and Comparative Examples 13 to 17

In the same manner as in Examples 1 to 11 and Comparative Examples 1 to 7, except that the acid generator (A) was changed from 0.3 parts by mass of A2 to 2.0 parts by mass of A1, from 0.05 parts by mass of F3 to 0.05 parts by mass of F1, from 0.05 parts by mass of F4 to 0.05 parts by mass of F2, and the resin (B) and alkali soluble resin (D) in types and amounts shown in Table 3 were used, in Examples 1 to 11, in each Example and Comparative Example, two types of photosensitive resin compositions having different types of organic solvents were obtained.

Whether or not the photosensitive resin compositions of each Example and each Comparative Example satisfy the [Requirement 1] and [Requirement 2] described above was verified according to the verification method of the [Requirement 1] and [Requirement 2]. Specific method is described below. As to the requirement 1, the solvent residual rate for each type of the organic solvent is shown in Tables 1 to 3. As to the requirement 2, the value of $I_a/I_b$ (IR: hydroxyl group (OH)/carbonyl group (CO)) is shown in Tables 1 to 3. Note here that in the requirement 2, there is no difference in the value of $I_a/I_b$ in types of the organic solvents. Therefore, values measured using a photosensitive resin composition including methoxy butyl acetate is descried.

<Requirement 1>
Firstly, a photosensitive resin composition was applied to a substrate to form a 40-μm coated film. The coated film was baked for 30 seconds at a temperature higher by 10° C. than the boiling point of an organic solvent (S1) in the photosensitive resin composition, and the rate of methoxy butyl acetate (MA) or propylene glycol monomethyl ether acetate (PM) in total mass of the baked coated film (the solvent residual rate) was calculated by GC (gas chromatography). The coated film made of the photosensitive resin composition including MA was baked at 181° C., and the coated film made of the photosensitive resin composition including PM was baked at 156° C.

<Requirement 2>
Pre-baking and post-exposure baking (PEB) were carried out by the same method as the method for evaluating a pattern shape mentioned below except that a photosensitive resin layer was not exposed, and a test sample for FT-IR measurement was prepared. The obtained test sample was subjected to FT-IR measurement using Fourier transform infrared spectroscopy photometer (NICOLET 6700 manufactured by Thermo Fisher Scientific, analysis software: OMNIC). From the FT-IR measurement results, signal intensity of a peak top around wave number 3400 cm$^{-1}$ as a signal intensity $I_a$ derived from an —OH group, and signal intensity of a peak top around wave number 1740 cm$^{-1}$ as signal intensity $I_b$ derived from a C═O group were obtained. Then, the value of $I_a/I_b$ was calculated.

Furthermore, according to the following method, a pattern serving as a template for forming a plated article was formed on a copper substrate using the obtained photosensitive resin composition, and a pattern shape and an attaching state of residues to the plated article after the template was stripped were evaluation. These evaluation results are shown in Tables 1 to 3.

[Pattern Shape]

The photosensitive resin compositions from Examples and Comparative Examples were each applied on a copper substrate with a diameter of 8 inches to form a photosensitive resin layer having a thickness of 40 μm. Then, the photosensitive resin layers were pre-baked at 140° C. for 5 minutes. After the pre-baking, using a mask having a hole pattern capable of forming a circular opening having a diameter of 20 μm and an exposure device Prisma GHI (manufactured by Ultratech Inc.), pattern exposure was performed with the ghi line at an exposure dose greater by 1.2 times than the minimum exposure dose capable of forming a pattern having a predetermined size. Subsequently, the substrate was placed on a hot plate and post-exposure baking (PEB) was performed at 115° C. for 3 minutes. Then, an aqueous 2.38% by weight solution of tetramethylammonium hydroxide (developing solution, NMD-3, manufactured by Tokyo Ohka Kogyo Co., Ltd.) was added dropwise to the exposed photosensitive resin layer, and allowed to stand at 23° C. for 60 seconds. This operation was repeated four times in total. Subsequently, the surface of the resist pattern was washed with running water, and blown with nitrogen to obtain a resist pattern. For a copper substrate having the above-mentioned resist pattern as a template, a cross-sectional shape of the obtained resist pattern was observed under scanning electron microscope, and CD (Critical Dimension) of the top (a surface opposite side to the surface that is in contact in the pattern substrate) and CD of the bottom (a surface that is in contact with the pattern substrate) were measured. The value of "top CD−bottom CD" was calculated. Based on the obtained calculated value, the pattern shape was evaluated based on the following criteria.

◎: An absolute value of top CD−bottom CD is within 1 μm
O: An absolute value of top CD−bottom CD is more than 1 μm and within 2 μm
A: An absolute value of top CD−bottom CD is more than 2 μm and within 3 μm
x: An absolute value of top CD−bottom CD is more than 3 μm and within 4 μm

[Evaluation of Attaching State of Residue]

In the same manner as in the evaluation of a pattern shape, a copper substrate having a resist pattern as a template was prepared. Silver-tin plating was carried out according to the following method using the obtained substrate with a template to prepare a plated article in the template. Specifically, firstly, plasma ashing using oxygen gas ($O_2$) was carried out to a surface made or copper exposed on a nonresist section in the template. Then, plating was carried out using a silver-tin plating solution (product name: UTB TS-140 (manufactured by ISHIHARA CHEMICAL CO., LTD.) until the plated height reached 10 μm under the conditions in which the liquid temperature was 25° C. and cathodic current density was 4 ASD (A/dm$^2$). Thus, a columnar plated article was formed on a surface made of copper in the substrate. After the plated article was formed, the template on the copper substrate was stripped by rinsing with acetone. The plated article from which the template was stripped was observed under electron microscope, and presence or absence of attaching of residue of the template on the plated article was evaluated as follows.

O: No residue is attached.
Δ: Very little residue is attached.
x: Small amount of residue is attached.
xx: Large amount of residue is attached.

TABLE 1

| | Resin (B) Types/part by mass | Alkali soluble Resin (D) Types/part by mass | Pattern shape | Attaching state of residue | Requirement1 Solvent residual rate MA (% by mass) | Requirement1 Solvent residual rate PM (% by mass) | Requirement2 $I_a/I_b$ (IR: OH/CO) |
|---|---|---|---|---|---|---|---|
| Example1 | B1/100 | — | ◎ | O | 2.8 | 2.0 | 0.02 |
| Example2 | B2/100 | — | ◎ | O | 2.7 | 1.8 | 0.02 |
| Example3 | B3/100 | — | ◎ | O | 2.9 | 1.9 | 0.02 |
| Example4 | B4/100 | — | ◎ | O | 2.8 | 2.1 | 0.02 |
| Example5 | B5/100 | — | ◎ | O | 2.9 | 2.3 | 0.02 |
| Example6 | B6/100 | — | ◎ | O | 3.0 | 2.5 | 0.05 |
| Example7 | B7/100 | — | ◎ | O | 2.4 | 1.7 | 0.02 |
| Example8 | B8/100 | — | ◎ | O | 2.2 | 1.7 | 0.02 |
| Example9 | B9/100 | — | ◎ | O | 2.1 | 2.1 | 0.02 |
| Example10 | B10/100 | — | ◎ | O | 2.8 | 2.0 | 0.02 |
| Example11 | B11/100 | — | ◎ | O | 2.5 | 1.0 | 0.02 |
| Comparative Example1 | B1/40 | D1/40 D2/20 | ◎ | XX | 10.2 | 7.2 | 0.66 |
| Comparative Example2 | B1/80 | D2/20 | ◎ | Δ | 4.4 | 4.0 | 0.14 |
| Comparative Example3 | B1/60 | D2/40 | ◎ | X | 8.3 | 5.9 | 0.37 |
| Comparative Example4 | B1/80 | D3/20 | ◎ | Δ | 4.8 | 4.2 | 0.14 |
| Comparative Example5 | B1/60 | D3/40 | ◎ | X | 8.4 | 7.4 | 0.36 |
| Comparative Example6 | B1/80 | D1/20 | ◎ | X | 4.9 | 3.9 | 0.19 |
| Comparative Example7 | B1/50 | D1/50 | ◎ | XX | 9.4 | 8.4 | 0.41 |

TABLE 2

| | Resin (B) Types/part by mass | Alkali soluble Resin (D) Types/part by mass | Pattern shape | Attaching state of residue | Requirement1 Solvent residual rate | | Requirement2 $I_a/I_b$ (IR: OH/CO) |
|---|---|---|---|---|---|---|---|
| | | | | | MA (% by mass) | PM (% by mass) | |
| Example12 | B1/100 | — | ◎ | ○ | 2.8 | 2.1 | 0.02 |
| Comparative Example8 | B1/40 | D1/40 D2/20 | ◎ | XX | 10.1 | 7.0 | 0.66 |
| Comparative Example9 | B1/80 | D2/20 | ◎ | Δ | 4.5 | 4.0 | 0.14 |
| Comparative Example10 | B1/60 | D2/40 | ◎ | X | 8.5 | 5.7 | 0.37 |
| Comparative Example11 | B1/80 | D1/20 | ◎ | X | 4.8 | 4.0 | 0.19 |
| Comparative Example12 | B1/50 | D1/50 | ◎ | XX | 9.3 | 8.0 | 0.41 |

TABLE 3

| | Resin (B) Types/part by mass | Alkali soluble Resin (D) Types/part by mass | Pattern shape | Attaching state of residue | Requirement1 Solvent residual rate | | Requirement2 $I_a/I_b$ (IR: OH/CO) |
|---|---|---|---|---|---|---|---|
| | | | | | MA (% by mass) | PM (% by mass) | |
| Example13 | B1/100 | — | ◎ | ○ | 2.8 | 2.0 | 0.02 |
| Comparative Example13 | B1/40 | D1/40 D2/20 | ◎ | XX | 10.2 | 7.5 | 0.66 |
| Comparative Example14 | B1/80 | D2/20 | ◎ | Δ | 4.4 | 4.1 | 0.14 |
| Comparative Example15 | B1/60 | D2/40 | ◎ | X | 8.3 | 6.0 | 0.37 |
| Comparative Example16 | B1/80 | D1/20 | ◎ | X | 4.9 | 4.1 | 0.19 |
| Comparative Example17 | B1/50 | D1/50 | ◎ | XX | 9.4 | 8.5 | 0.41 |

According to Examples 1 to 13, when a pattern serving as a template for formation of a plated article was prepared using a photosensitive resin composition satisfying the aforementioned [Requirement 1], it is shown that also when a plated article was prepared using the obtained pattern as a template, attaching of residues of the template to the plated article is suppressed. On the other hand, according to Comparative Examples 1 to 17, when the photosensitive resin composition does not satisfy the aforementioned [Requirement 1], it is shown that attaching of residues of the template to the plated article is not suppressed.

What is claimed is:

1. A chemically amplified positive-type photosensitive resin composition for forming a pattern serving as a template for a process of producing a plated article on a metal substrate, comprising an acid generator (A) which generates acid upon exposure to an irradiated active ray or radiation, a resin (B) whose solubility in alkali increases under an action of acid, and an organic solvent (S),
wherein the organic solvent (S) includes 70% by mass or more of an organic solvent (S1) having a boiling point of 120 to 180° C. with respect to a total mass of the organic solvent (S), and
satisfies the following requirements:
a solvent residual rate measured by the following steps (1) and (2) is 3.5% by mass or less:

(1) forming a 40-μm coated film by applying the chemically amplified positive-type photosensitive resin composition to the substrate; and
(2) baking the coated film at a temperature that is higher by 10° C. than the boiling point of the organic solvent (S1) for 30 seconds, and calculating the rate of the organic solvent (S1) in a total mass of the coated film after baking by GC (gas chromatography); and $I_a/I_b$ measured by the following steps (1) to (4) is 0.1 or less:

(1) forming a 40-μm coated film by applying the chemically amplified positive-type photosensitive resin composition to a substrate;
(2) baking the coated film firstly at 140° C. for 300 seconds, and further baking at 115° C. for 180 seconds to obtain a baked coated film;
(3) pulverizing a part of the baked coated film, and measuring an IR spectrum together with KBr; and
(4) determining $I_a/I_b$ where $I_a$ is an intensity of a signal derived from an —OH group positioned between 3000 cm$^{-1}$ to 3600 cm$^{-1}$ of the obtained IR spectrum, and $I_b$ is an intensity of a signal derived from a C=O group positioned between 1650 cm$^{-1}$ to 1780 cm$^{-1}$ of the obtained IR spectrum.

2. The chemically amplified positive-type photosensitive resin composition according to claim 1, wherein the process of producing the plated article is a sliver-tin plating process.

3. The chemically amplified positive-type photosensitive resin composition according to claim 1, wherein the resin (B) includes an acrylic resin.

4. A method of manufacturing a substrate with a template, the method comprising:
- laminating a photosensitive resin layer on a substrate having a metal surface, the layer comprising the chemically amplified positive-type photosensitive resin composition according to claim 1;
- exposing the photosensitive resin layer through irradiation with an active ray or radiation; and
- developing the exposed photosensitive resin layer to prepare a template for a plated article.

5. A method of manufacturing a plated article, the method comprising:
- plating the substrate with a template manufactured by the method according to claim 4 to form the plated article in the template; and
- stripping the template from the substrate with a template after forming the plated article.

6. The method of manufacturing a plated article according to claim 5, wherein the plating is silver-tin plating.

7. A method of providing a chemically amplified positive-type photosensitive resin composition, the method comprising providing the chemically amplified positive-type photosensitive resin composition to a process line for performing the method of manufacturing substrate with a template according to claim 4.

8. A method of providing a chemically amplified positive-type photosensitive resin composition, the method comprising providing the chemically amplified positive-type photosensitive resin composition to a process line for performing the method of manufacturing a plated article according to claim 5.

* * * * *